(12) United States Patent
Escher-Poeppel et al.

(10) Patent No.: US 10,734,352 B2
(45) Date of Patent: Aug. 4, 2020

(54) METALLIC INTERCONNECT, A METHOD OF MANUFACTURING A METALLIC INTERCONNECT, A SEMICONDUCTOR ARRANGEMENT AND A METHOD OF MANUFACTURING A SEMICONDUCTOR ARRANGEMENT

(71) Applicant: Infineon Technologies AG, Neubiberg (DE)

(72) Inventors: Irmgard Escher-Poeppel, Duggendorf (DE); Khalil Hosseini, Weihmichl (DE); Johannes Lodermeyer, Kinding (DE); Joachim Mahler, Regensburg (DE); Thorsten Meyer, Regensburg (DE); Georg Meyer-Berg, Munich (DE); Ivan Nikitin, Regensburg (DE); Reinhard Pufall, Munich (DE); Edmund Riedl, Wald (DE); Klaus Schmidt, Nittendorf (DE); Manfred Schneegans, Vaterstetten (DE); Patrick Schwarz, Kallmuenz (DE)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 16/148,316

(22) Filed: Oct. 1, 2018

(65) Prior Publication Data
US 2019/0103378 A1    Apr. 4, 2019

(30) Foreign Application Priority Data
Oct. 2, 2017   (DE) .................. 10 2017 122 865

(51) Int. Cl.
*H01L 23/00*   (2006.01)

(52) U.S. Cl.
CPC .............. *H01L 24/83* (2013.01); *H01L 24/13* (2013.01); *H01L 24/16* (2013.01); *H01L 24/29* (2013.01);
(Continued)

(58) Field of Classification Search
CPC ........... H01L 24/70; H01L 2224/81011; H01L 2224/83011; H01L 2224/83911;
(Continued)

(56) References Cited

U.S. PATENT DOCUMENTS

| | | | |
|---|---|---|---|
| 7,327,037 B2* | 2/2008 | Basavanhally | B81B 7/0006 257/777 |
| 2007/0128845 A1 | 6/2007 | Hsu et al. | |

(Continued)

FOREIGN PATENT DOCUMENTS

| | | |
|---|---|---|
| DE | 2816328 A1 | 10/1978 |
| DE | 102009040632 A1 | 4/2010 |
| EP | 0213774 A1 | 3/1987 |

*Primary Examiner* — Latanya N Crawford
(74) *Attorney, Agent, or Firm* — Murphy, Bilak & Homiller, PLLC

(57) ABSTRACT

A metallic interconnection and a semiconductor arrangement including the same are described, wherein a method of manufacturing the same may include: providing a first structure including a first metallic layer having protruding first microstructures; providing a second structure including a second metallic layer having protruding second microstructures; contacting the first and second microstructures to form a mechanical connection between the structures, the mechanical connection being configured to allow fluid penetration; removing one or more non-metallic compounds on the first metallic layer and the second metallic layer with a reducing agent that penetrates the mechanical connection and reacts with the one or more non-metallic compounds; and heating the first metallic layer and the second metallic layer at a temperature causing interdiffusion of the first metallic layer and the second metallic layer to form the metallic interconnection between the structures.

21 Claims, 27 Drawing Sheets

(52) U.S. Cl.
CPC .............. *H01L 24/32* (2013.01); *H01L 24/33* (2013.01); *H01L 24/73* (2013.01); *H01L 24/81* (2013.01); *H01L 2224/13553* (2013.01); *H01L 2224/13564* (2013.01); *H01L 2224/1607* (2013.01); *H01L 2224/29553* (2013.01); *H01L 2224/3207* (2013.01); *H01L 2224/32225* (2013.01); *H01L 2224/32245* (2013.01); *H01L 2224/33181* (2013.01); *H01L 2224/73204* (2013.01); *H01L 2224/81011* (2013.01); *H01L 2224/8183* (2013.01); *H01L 2224/81345* (2013.01); *H01L 2224/81897* (2013.01); *H01L 2224/81906* (2013.01); *H01L 2224/81911* (2013.01); *H01L 2224/83011* (2013.01); *H01L 2224/8383* (2013.01); *H01L 2224/83345* (2013.01); *H01L 2224/83897* (2013.01); *H01L 2224/83906* (2013.01); *H01L 2224/83911* (2013.01); *H01L 2224/92125* (2013.01); *H01L 2924/1431* (2013.01); *H01L 2924/1434* (2013.01); *H01L 2924/351* (2013.01)

(58) Field of Classification Search
CPC . H01L 2224/83897; H01L 2224/83345; H01L 2224/29553; H01L 2224/13553; H01L 2224/1607; H01L 2224/3207; H01L 2924/351; H01L 2224/81911; H01L 24/13; H01L 2224/81897; H01L 2224/8183; H01L 2224/81345; H01L 2224/0807; H01L 2224/08059; H01L 2224/0801; H01L 24/68; H01L 24/67
See application file for complete search history.

(56) References Cited

U.S. PATENT DOCUMENTS

| | | | | |
|---|---|---|---|---|
| 2009/0272567 | A1* | 11/2009 | Hsia | H01L 24/11 174/260 |
| 2015/0228415 | A1* | 8/2015 | Seok | H01G 9/209 136/256 |
| 2017/0162436 | A1* | 6/2017 | Arvin | H01L 24/81 |
| 2018/0331170 | A1* | 11/2018 | Xu | H05K 1/111 |

* cited by examiner

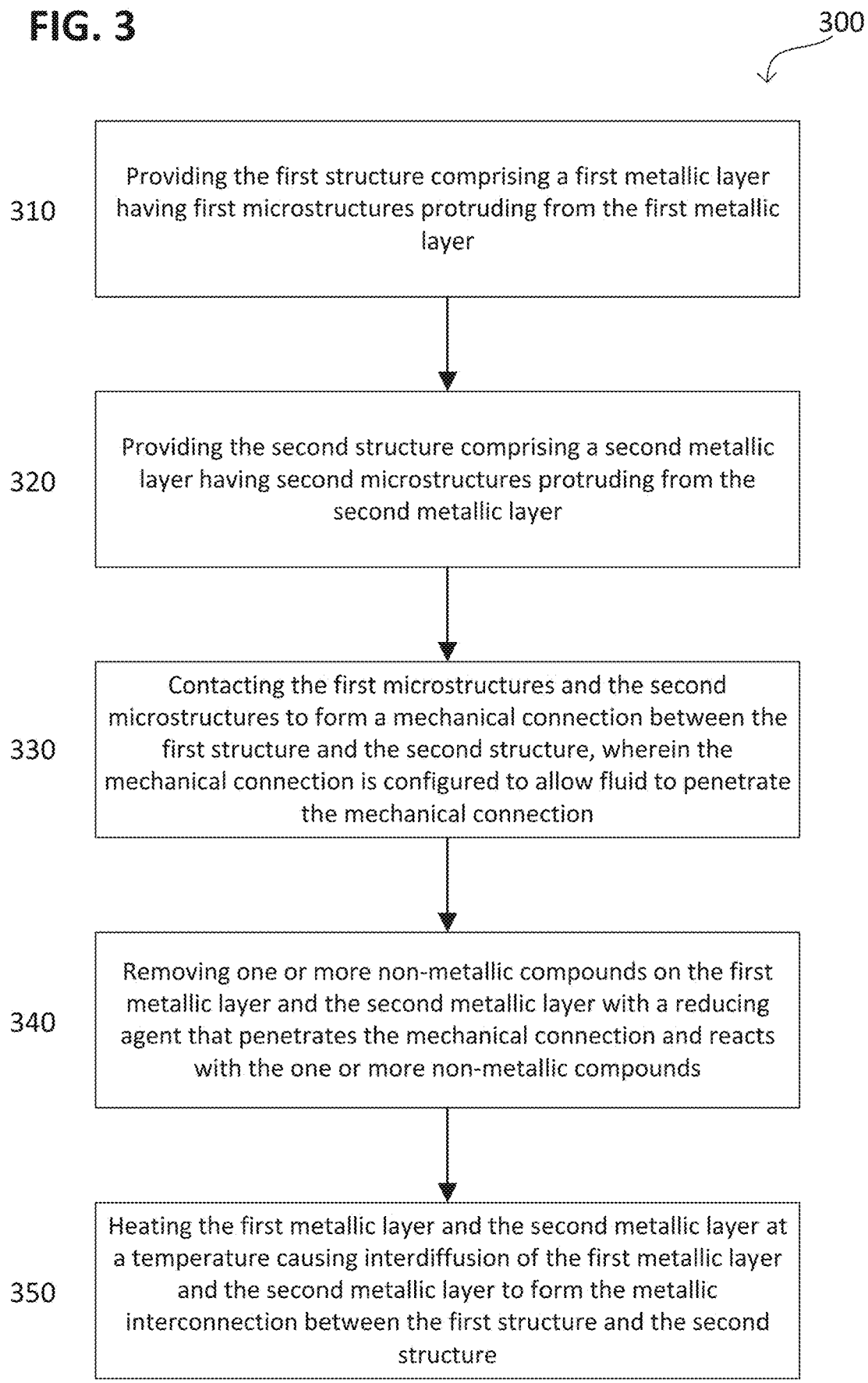

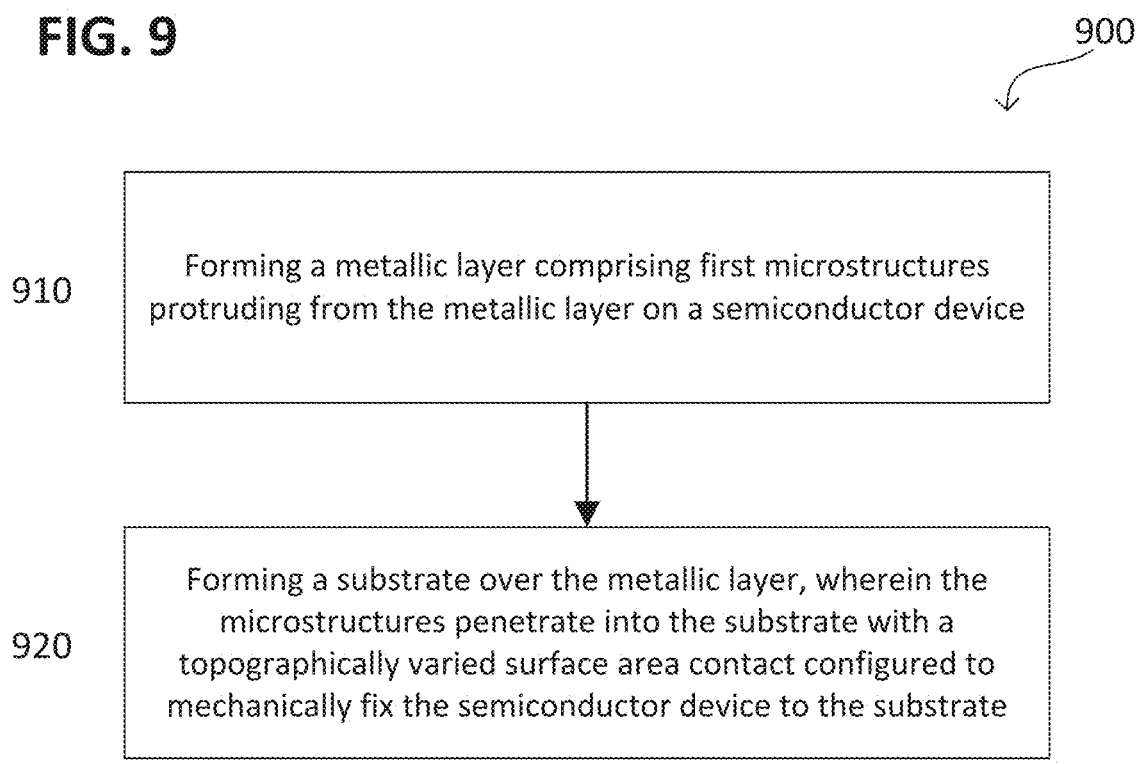

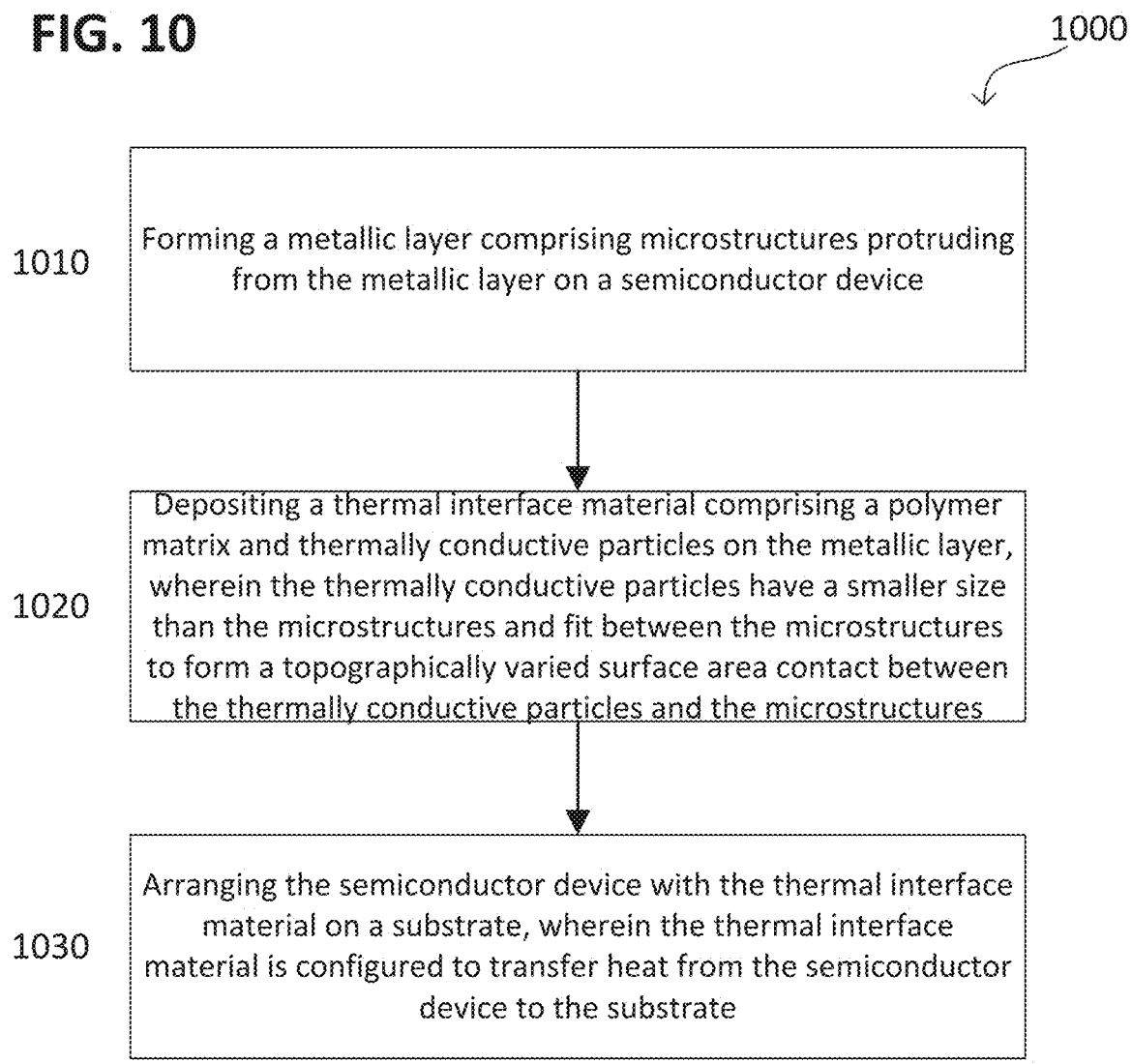

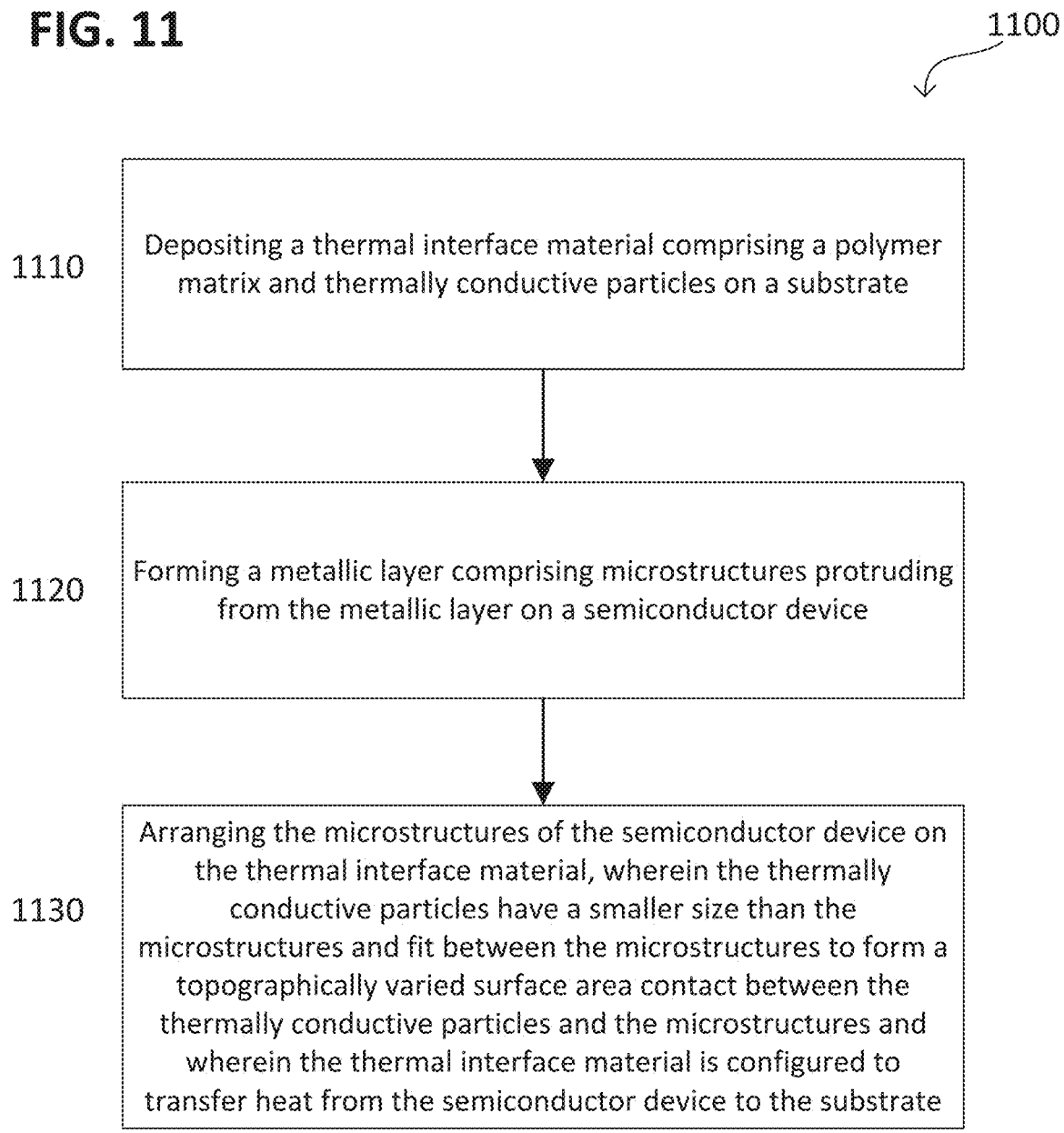

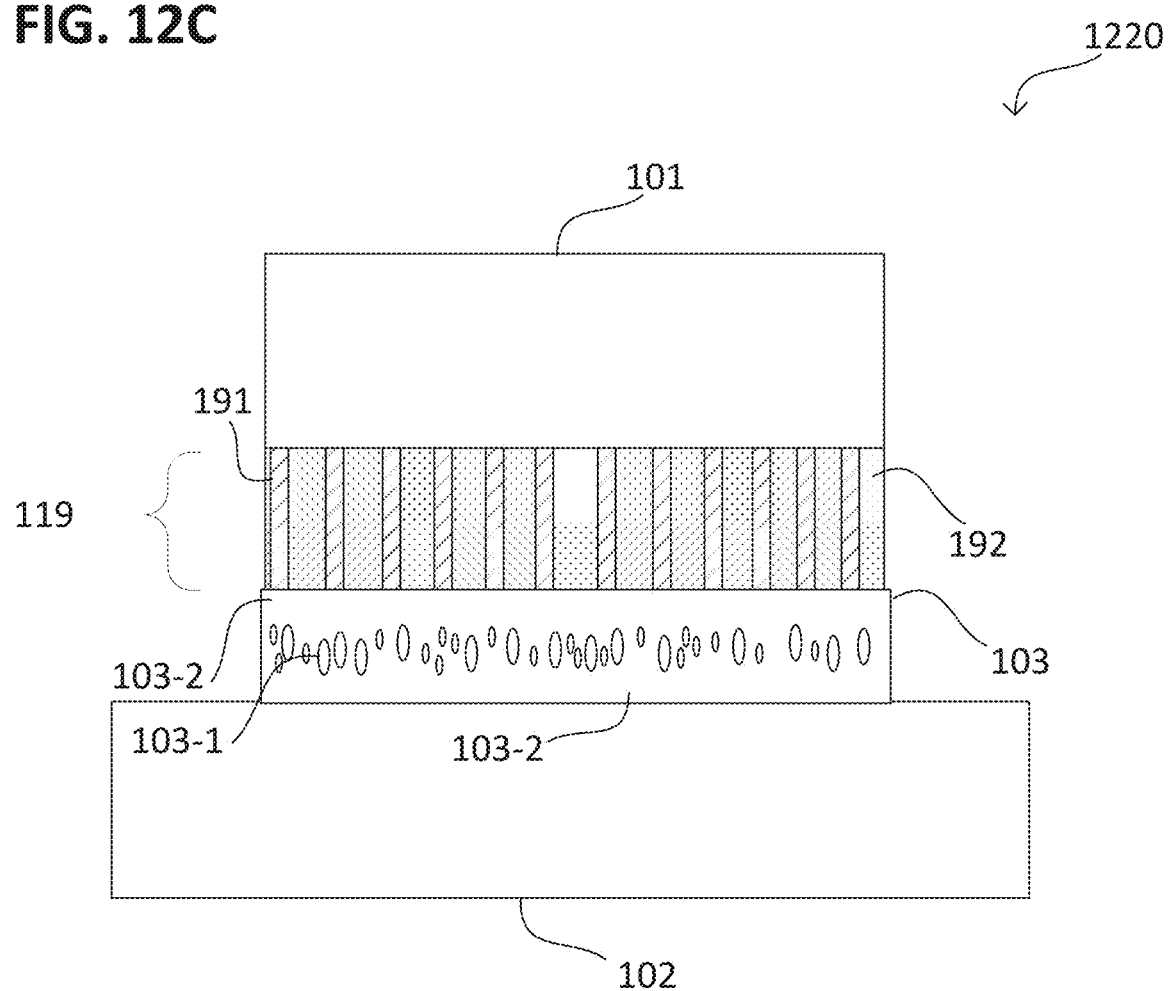

METALLIC INTERCONNECT, A METHOD OF MANUFACTURING A METALLIC INTERCONNECT, A SEMICONDUCTOR ARRANGEMENT AND A METHOD OF MANUFACTURING A SEMICONDUCTOR ARRANGEMENT

TECHNICAL FIELD

Various embodiments relate generally to a metallic interconnect, a method of manufacturing a metallic interconnect, a semiconductor arrangement, and a method of manufacturing a semiconductor arrangement.

BACKGROUND

Lead-free interconnection between structures and lead-free die attachment are growing trends, particularly in the semiconductor industry. Part of this trend is driven by concern over the use of lead, with some governing bodies scheduled to ban the use of lead in the semiconductor industry. Soldered interconnections containing lead are commonly used for highly conductive interconnects.

Thus, a highly conductive lead-free interconnection that may replace a soldered interconnection would be desirable. Some options for achieving a conductive lead-free interconnection have included sintering or diffusion soldering. In both of these cases, there are a number of important boundary process conditions that require consideration.

For example, neither the pressure used for the sintering or diffusion bonding, nor the temperature for the sintering or diffusion bonding may be too high in order to prevent damage to semiconductor structures, as well as being able to be achieved by existing equipment. In addition, prior to the final fixation of a die, it must be placed in position with high precision and remain in that position during subsequent handling steps. These boundary conditions may place requirements that may not be optimal for the processes of sintering or diffusion soldering, or may not be suitable for carrying out the processes with conventional interconnection and die attach equipment. It would be desirable that a final interconnection be achieved at relatively low temperatures and that there is no excess support material in or around an interconnect.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a method of manufacturing a metallic interconnect;

FIG. 9 shows a method of manufacturing a semiconductor arrangement;

FIG. 10 shows a method of manufacturing a semiconductor arrangement;

FIG. 11 shows a method of manufacturing a semiconductor arrangement;

FIGS. 12A-12C show semiconductor arrangements;

DETAILED DESCRIPTION

Figure 1A:
FIGS. 1A and 1B show metallic interconnects between structures.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

As used herein, a "circuit" may be understood as any kind of logic (analog or digital) implementing entity, which may be special purpose circuitry or a processor executing software stored in a memory, firmware, hardware, or any combination thereof. Furthermore, a "circuit" may be a hard-wired logic circuit or a programmable logic circuit such as a programmable processor, for example a microprocessor (for example a Complex Instruction Set Computer (CISC) processor or a Reduced Instruction Set Computer (RISC) processor). A "circuit" may also be a processor executing software, for example any kind of computer program, for example a computer program using a virtual machine code such as, for example, Java. Any other kind of implementation of the respective functions which will be described in more detail below may also be understood as a "circuit". It is understood that any two (or more) of the described circuits may be combined into a single circuit with substantially equivalent functionality, and, conversely, that any single described circuit may be distributed into two (or more) separate circuits with substantially equivalent functionality. In particular with respect to the use of "circuitry" in the Claims included herein, the use of "circuit" may be understood as collectively referring to two or more circuits.

A "processing circuit" (or equivalently, "processing circuitry") as used herein, is understood as referring to any circuit that performs an operation(s) on signal(s), such as, e.g., any circuit that performs processing on an electrical signal or an optical signal. A processing circuit may thus refer to any analog or digital circuitry that alters a characteristic or property of an electrical or optical signal, which may include analog data, digital data, or a combination thereof. A processing circuit may thus refer to an analog circuit (explicitly referred to as "analog processing circuit(ry)"), digital circuit (explicitly referred to as "digital processing circuit(ry)"), logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Accordingly, a processing circuit may refer to a circuit that performs processing on an electrical or optical signal as hardware or as software, such as software executed on hardware (e.g., a processor or microprocessor). As utilized herein, "digital processing circuit(ry)" may refer to a circuit implemented using digital logic that performs processing on a signal, e.g., an electrical or optical signal, which may include logic circuit(s), processor(s), scalar processor(s), vector processor(s), microprocessor(s), controller(s), microcontroller(s), Central Processing Unit(s) (CPU), Graphics Processing Unit(s) (GPU), Digital Signal Processor(s) (DSP), Field Programmable Gate Array(s) (FPGA), integrated circuit(s), Application Specific Integrated Circuit(s) (ASIC), or any combination thereof. Furthermore, it is understood that a single processing circuit may be equivalently split into two separate processing circuits, and conversely that two separate processing circuits may be combined into a single equivalent processing circuit.

The term "forming" may refer to disposing, arranging, structuring, or depositing. A method for forming, e.g., a layer, a material, or a region, etc., may include various deposition methods which, inter alia, may include: chemical vapor deposition, physical vapor deposition (e.g., for dielectric materials), electrodeposition (which may also be referred to as electroplating, e.g., for metals or metal alloys), or spin coating (e.g., for fluid materials). Generally, a vapor deposition may be performed by sputtering, laser ablation, cathodic arc vaporization, or thermal evaporation. A method for forming metals may include metal plating, e.g., electroplating or chemical plating.

The term "forming" may also include a chemical reaction or fabrication of a chemical composition, where, for example, at least a portion of the layer, the material, or the region is formed by a transformation of one set of chemical substances into the chemical composition. "Forming" may, for example, include: changing the positions of electrons by breaking or forming chemical bonds between atoms of the set of chemical substances. The term "forming" may further include oxidation and reduction, complexation, precipitation, acid-base reaction, solid-state reaction, substitution, doping, addition and elimination, diffusion, or a photochemical reaction. "Forming" may, for example, change the chemical and physical properties of the set of chemical substances which chemically compose a portion of the layer, material, or region. Exemplary chemical properties or physical properties may include electrical conductivity, phase composition, or optical properties, etc. "Forming" may, e.g., include the application of a chemical reagent to an initial compound to change the chemical and physical properties of the initial compound.

The term "structuring" may refer to modifying the form of a structure (e.g., modifying the structure to achieve a desired shape or a desired pattern). To structure, e.g., a material, a portion of the material may be removed, e.g., via etching. To remove material from, for example a layer, material, or region, a mask (that provides a pattern) may be used, i.e., the mask provides a pattern for removing material (e.g., etching a structure to remove material of the structure) according to the pattern of the mask. Illustratively, the mask may prevent regions (which may be intended to remain) from being removed (e.g., by etching). Alternatively or additionally, to structure the layer, the material or the region of material may be disposed using a mask (the mask providing a pattern). The mask may provide a pattern for forming (e.g., disposing) material in accordance with the pattern of the mask.

In general, removing material may include a process such as etching of the material. The term "etching" may include various etching procedures, e.g., chemical etching (including, for example, wet etching or dry etching), physical etching, plasma etching, ion etching, etc. In etching a layer, a material, or a region, an etchant may be applied to the layer, the material, or the region. For example, the etchant may react with the layer, the material, or the region, forming a substance (or chemical compound) which may be easily removed, e.g., a volatile substance. Alternatively or additionally, the etchant may, for example, vaporize the layer, the material, or the region.

Additionally or alternatively, removing material may include a process involving chemical and mechanical means, e.g., chemical mechanical polishing (or chemical mechanical planarization). The term "chemical mechanical planarization" may include a combination of chemical and mechanical material removal processes such as abrasion (e.g., application of a polishing pad with a surface that abrades the material) in conjunction with a slurry (e.g., a colloid that may include additional abrasive particles as well as contents that are corrosive to the material).

A mask may be a temporary mask, i.e., it may be removed after etching (e.g., the mask may be formed from a resin or a metal or another material such as a hard mask material such as silicon oxide, silicon nitride, or carbon, etc.) or the mask may be a permanent mask (e.g., a mask-blade), which may be used several times. A temporary mask may be formed, e.g., using a photomask.

A semiconductor device may be an apparatus including circuitry formed in a semiconductor material, as well as any other associated components for the function and operation of the semiconductor device, e.g., the semiconductor device may include a microelectromechanical system including a microelectromechanical component and circuitry in communication with the microelectromechanical component, similarly, a semiconductor device may be a power semiconductor device. For example, a power semiconductor device may be a solid-state switch and/or rectifier implemented in power electronics, such as a diode, rectifier, thyristor, transistor, etc.

According to various embodiments, a microelectromechanical device may be formed as part of, or may include, a semiconductor device. For example, the semiconductor device may include the microelectromechanical component (which may also be referred to as a microelectromechanical system). In other words, the microelectromechanical component may be implemented into (e.g., may be part of) a semiconductor device, e.g., monolithically integrated. The semiconductor device (which may also be referred to as a chip, die, or microchip) may be processed in semiconductor technologies, on a wafer, or in a wafer (or, e.g., a substrate or a carrier). The semiconductor device may include one or more microelectromechanical systems (MEMS), which are formed during semiconductor technology processing or fabrication. The semiconductor carrier may be part of the semiconductor device, e.g., the semiconductor carrier may be part of, or may form, the semiconductor body of the chip. Optionally, the microelectromechanical component may be part of, or may be electrically coupled to, an integrated circuit on the chip.

According to various embodiments, a semiconductor carrier (e.g., of a microelectromechanical device, e.g., the semiconductor carrier of a semiconductor chip) may be singulated from a wafer by removing material from a kerf region of the wafer (also referred to as dicing or cutting the wafer). For example, removing material from the kerf region of the wafer may be processed by scribing and breaking, cleavage, blade dicing, or mechanical sawing (e.g., using a dicing saw). In other words, the semiconductor carrier may be singulated by a wafer dicing process. After the wafer dicing process, the semiconductor carrier (or the finished microelectromechanical device) may be electrically contacted and encapsulated, e.g., by mold materials, into a chip carrier (which may also be referred to as a chip housing) which may then be suitable for use in electronic devices. For example, the semiconductor chip may be bonded to a chip carrier by wires. Furthermore, the semiconductor chip (which may be bonded to a chip carrier) may be mounted (e.g., soldered) onto a printed circuit board.

According to various embodiments, a semiconductor carrier (e.g., of a microelectromechanical device or the semiconductor carrier of a semiconductor chip) may include or may be made of (in other words, formed from) semiconductor materials of various types, including a group IV semiconductor (e.g., silicon or germanium), a compound semiconductor, e.g., a group III-V compound semiconductor (e.g., gallium arsenide), or other types, including group III semiconductors, group V semiconductors, or polymers, for example. In an embodiment, the semiconductor carrier may be doped or undoped. In an alternative embodiment, the semiconductor carrier may be a silicon on insulator (SOI) wafer. As an alternative, any other suitable semiconductor material may be used for the semiconductor carrier, for example, semiconductor compound material such as gallium phosphide (GaP), indium phosphide (InP), or any suitable ternary semiconductor compound material, such as indium gallium arsenide (InGaAs), or quaternary semiconductor compound material, such as aluminum gallium indium phosphide (AlInGaP).

According to various embodiments, a semiconductor carrier (e.g., of a microelectromechanical device or the semiconductor carrier of a semiconductor chip) may be covered with a passivation layer for protecting the semiconductor carrier from environmental influence, e.g., oxidation. The passivation layer may include a metal oxide, an oxide of the semiconductor carrier (which may also be referred to as a substrate or semiconductor body), e.g., silicon oxide, a nitride, e.g., silicon nitride, a polymer, e.g., benzocyclobutene (BCB) or polyimide (PI), a resin, a resist, or a dielectric material.

According to various embodiments, an electrically conductive material may include or may be formed from: a metal, a metal alloy, an intermetallic compound, a silicide (e.g., titanium silicide, molybdenum silicide, tantalum silicide, or tungsten silicide), a conductive polymer, a polycrystalline semiconductor, or a highly doped semiconductor, e.g., polycrystalline silicon (which may also be referred to as polysilicon), or a highly doped silicon. An electrically conductive material may be understood as material with moderate electrical conductivity, e.g., with an electrical conductivity (measured at room temperature and constant electric field direction) greater than about 10 S/m, e.g., greater than about $10^2$ S/m, or with high electrical conductivity, e.g., greater than about $10^4$ S/m, e.g., greater than about $10^6$ S/m.

According to various embodiments, a metal may include or may be formed from one element of the following group of elements: aluminum, copper, nickel, magnesium, chromium, iron, zinc, tin, gold, silver, iridium, platinum, or titanium. Alternatively or additionally, a metal may include or may be formed from a metal alloy including one element or more than one element. For example, a metal alloy may include an intermetallic compound, e.g., an intermetallic compound of gold and aluminum, an intermetallic compound of copper and aluminum, an intermetallic compound of copper and zinc (brass) or an intermetallic compound of copper and tin (bronze).

According to various embodiments, an electrically insulating material, e.g., a dielectric material, may be understood as material with poor electrical conductivity, e.g., with an electrical conductivity (measured at room temperature and constant electric field direction) less than about $10^{-2}$ S/m, e.g., less than about $10^{-5}$ S/m, or, e.g., less than about $10^{-7}$ S/m.

According to various embodiments, an electrically insulating material may include a semiconductor oxide, a metal oxide, a ceramic, a semiconductor nitride, a metal nitride, a semiconductor carbide, a metal carbide, a glass, e.g., fluorosilicate glass (FSG), a dielectric polymer, a silicate, e.g., hafnium silicate or zirconium silicate, a transition metal oxide, e.g., hafnium dioxide or zirconium dioxide, an oxynitride, e.g., silicon oxynitride, or any other type of dielectric material. An insulating material may withstand an electric field without breaking down (in other words without experiencing failure of its insulating properties, e.g., without substantially changing its electrical conductivity).

According to various embodiments, a microelectromechanical component may be configured to at least one of: provide a force to actuate a means for actuating in response to an electrical signal transmitted to the electrically-conductive component and provide an electrical signal in response to an actuation of the means for actuating, e.g., in response to a mechanical wave. The means for actuating (e.g., a diaphragm) may be mounted to a substrate in various ways, for example, a floating mount, a cantilever mount, a bridge mount, e.g., a membrane substantially anchored along one lateral axis, or substantially mounted along a perimeter of the means for actuating. In general, a microelectromechanical component may be configured to transfer mechanical energy into electrical energy and/or electrical energy into mechanical energy. In other words, a microelectromechanical component may function as a transducer that is configured to convert mechanical energy into electrical energy or vice versa. A microelectromechanical component may have a size in the range from about a few micrometers (μm) to about a few millimeters (mm), e.g., in the range from about a 10 μm to about 5 mm, e.g., in the range from about a 100 μm to about 2 mm, e.g., about 1 mm, or, alternatively, smaller than about 1 mm, e.g., smaller than 500 μm, e.g., smaller than 100 μm. A microelectromechanical component according to various embodiments may be processed in semiconductor technology.

A microelectromechanical component according to various embodiments may be used as a sensor (e.g., a microsensor) for sensing a mechanical signal and to generate an electrical signal which represents the mechanical signal. Alternatively, a microelectromechanical component may be used as an actuator for generating a mechanical signal based on the electrical signal. For example, the microelectromechanical component may be used as microphone.

The microelectromechanical component may include a diaphragm. The diaphragm may be configured to actuate in response to a force. The force may be provided externally from the microelectromechanical component, i.e., the force may not originate from the microelectromechanical device. The force may be a mechanical interaction, i.e., a pressure-gradient, e.g., a mechanical wave (including acoustic waves or sound waves) or pressure. Additionally or alternatively, the force may be an electric field interaction, i.e., a Coulomb force or an electrostatic force, or may be a magnetic field interaction, e.g., magnetic force, such as Lorentz force, etc. An electrically-conductive component, e.g., an electrode or a sensor, may provide an electrical signal in response to the actuation of the diaphragm. The electrical signal may represent the force on the diaphragm or the actuation of the diaphragm (e.g., or the electrical signal may be proportional to the force).

Diagram 100 in FIG. 1A shows an example of a metallic interconnection or die attachment, which may be lead-free, and which may be manufactured at room temperature with a very moderate pressure. The final fixation of the metallic interconnection may be performed without the aid of secondary chemistry, e.g., additional materials in excess of those in the final interconnect, such as solvent in a paste, and at moderate temperatures. Since the final interconnection is metallic, the interconnection may have optimal electrical and thermal properties, while avoiding re-melting of the interconnect, e.g., a subsequent reflow process.

Diagram 100 shows a metallic interconnection 103 between a first structure 101 and a second structure 102. Metallic interconnection 103 may be between any two structures that may benefit from a mechanical connection, an electrically conductive connection, and/or a thermally conductive interconnection, such as metallic interconnection 103 between first structure 101 and second structure 102. Metallic interconnection 103 may be formed from, e.g., may consist essentially of, a pure metal. A pure metal may be a metal of a single element, which may include other trace elements that may not affect the properties of the elemental, or pure, metal. The pure metal may be prone to formation of metal-oxides on the surface of the pure metal when exposed to oxygen, such as copper, upon which a copper oxide, e.g., copper (I) oxide or copper (II) oxide, may form.

Metallic interconnection may have a porous region 103-1. An adjacent region 103-2, or one or more adjacent regions 103-2, that is adjacent to porous region 103-1 may have a lower porosity than porous region 103-1, i.e., porous region 103-1 may have a higher porosity than one or more adjacent regions 103-2. The porosity of porous region 130-1 may be greater than 20 percent, while adjacent region 130-2 may have a porosity less than 20 percent. The porosity may also be related to the desired electrical conductivity of metallic interconnect 103. Thus, a porosity may be selected that balances the mechanical and electrical properties of metallic interconnection 103. An exemplary maximum porosity may be one that equates to an electrical conductivity at least greater than that of a solder material.

Porous region 103-1 may be defined by a region of contacted microstructures that may be interconnected, intertwined, and/or interlocked, which may be geometrically robust against delamination. The microstructures may be deformed into any number of shapes and directions leading to a relatively high level of surface area contact between the microstructures. The porosity may be defined as gaps or voids between the microstructures. Thus, a cross-section of porous region 103-1 may appear like the microstructures in FIGS. 5F and/or 5G.

The porosity may be variable and selected during manufacture and balanced with regard to electrical, thermal, and structural performance, e.g., stress reduction. Porous region 103-1 may have a plurality of voids, i.e., spaces free from the pure metal. The voids may be larger than an interstitial space in the crystalline structure of the pure metal, for example, the voids may be larger than the space of a plurality of metal atoms in a crystalline structure. The voids may also be referred to as pores, and may have shapes defined as the negative space between the microstructures, i.e., the voids may be irregularly shaped.

Porous region 103-1 may decouple stress between first structure 101 and second structure 102. In comparison to a solid metal structure, e.g., adjacent region 103-2, porous region 103-1 may be more elastic due to the voided structure of the region. Therefore, less stress originating in one or both of first structure 101 and second structure 102 may be transferred to the other structure. The stress may originate from thermal effects, such as a coefficient of thermal expansion (CTE) mismatch between a material of first structure 101 and second structure 102. The stress may arise during operation or manufacture. For example, first structure 101 may be a semiconductor device that generates heat during operation. The body of first structure 101 may expand due to the heat. Second structure 102 may not be subject to the same heat, or a material of second structure 102 may have a dissimilar CTE to a material of the first structure 101 thus inducing stress. Similarly, the arrangement depicted in FIG. 1A may be exposed to heat during manufacture of the arrangement, thus also inducing stress due to, e.g., CTE mismatch. Manufacture of the arrangement may also leave intrinsic stresses in the structures, that once interconnected, are exerted on the interconnected structure, unless the stress is decoupled, e.g., via porous region 103-1.

Alternatively, metallic interconnection 103 may be formed from a metal alloy, e.g., a binary alloy or a plural-metal alloy, which may contain trace elements. Porous region 103-1 may have a more balanced proportion of the metal alloy, as adjacent regions 103-2 may have a higher proportion of a single metal of the metal alloy. As will be described later in more detail, porous region 103-1 may be a region of interdiffusion between two pure metals, e.g., originating in the adjacent regions 103-2. Therefore, there may be a gradient of one metal starting from a region adjacent to the second structure 102 and decreasing in a direction towards the first structure 101. Likewise, there may be a gradient of another metal starting from a region adjacent to the first structure 101 and decreasing in a direction towards the second structure 102. The metallic interconnection 103 may be without intermetallic phase growth at the surface where the metals initially meet.

The alloy may be composed of bismuth, lead, thallium, gold, platinum, iridium, rhenium, tungsten, antimony, tin, indium, cadmium, silver, palladium, rhodium, selenium, germanium, zinc, copper, nickel, cobalt, iron, manganese, chromium, vanadium, titanium, or any combination thereof. The alloy may be a binary alloy, such as titanium-chromium, titanium-iron, titanium-cobalt, titanium-nickel, titanium-zinc, titanium-cadmium, vanadium-chromium, vanadium-manganese, vanadium-iron, vanadium-zinc, chromium-manganese, chromium-iron, chromium-silver, chromium-antimony, chromium-tungsten, chromium-rhenium, manganese-iron, manganese-cobalt, manganese-nickel, manganese-copper, manganese-zinc, manganese-selenium, manganese-tin, manganese-tungsten, iron-cobalt, iron-nickel, iron-copper, iron-zinc, iron-germanium, iron-silver, iron-cadmium, iron-tin, iron-tungsten, iron-rhenium, iron-lead, cobalt-nickel, cobalt-copper, cobalt-zinc, cobalt-germanium, cobalt-rhodium, cobalt-palladium, cobalt-silver, cobalt-cadmium, cobalt-tin, cobalt-tungsten, cobalt-rhenium, cobalt-gold, cobalt-lead, nickel-copper, nickel-zinc, nickel-germanium, nickel-rhodium, nickel-palladium, nickel-silver, nickel-cadmium, nickel-tin, nickel-tungsten, nickel-rhenium, nickel-platinum, nickel-gold, nickel-nickel-thallium, nickel-lead, copper-zinc (e.g., brass), copper-germanium, copper-selenium, copper-silver, copper-cadmium, copper-indium, copper-tin (e.g., bronze), copper-antimony, copper-tungsten, copper-rhenium, copper-platinum, copper-gold, copper-thallium, copper-lead, copper-bismuth, zinc-germanium, zinc-silver, zinc-cadmium, zinc-indium, zinc-tin, zinc-antimony, zinc-gold, zinc-lead, germanium-silver, selenium-silver, selenium-cadmium, rhodium-palladium, rhodium-silver, rhodium-iridium, rhodium-platinum, palladium-silver, palladium-tin, palladium-platinum, palladium-gold, silver-cadmium, silver-indium, silver-tin, silver-antimony, silver-iridium, silver-platinum, silver-gold, silver-thallium, silver-lead, silver-bismuth, cadmium-indium, cadmium-tin, cadmium-antimony, cadmium-tungsten, cadmium-gold, cadmium-lead, indium-tin, indium-antimony, indium-tungsten, indium-gold, indium-lead, indium-bismuth, tin-antimony, tin-tungsten, tin-gold, tin-lead, tin-bismuth, antimony-tungsten, antimony-gold, antimony-lead, antimony-bismuth, rhenium-palladium, iridium-palladium, lead-gold, thallium-lead, lead-bismuth, etc.

Metallic interconnection 103 may be used for die attach in the semiconductor industry. For example, first structure 101 may be a semiconductor device. As a non-limiting example, a semiconductor device may be an electronic component formed in a semiconductor material, such as a transistor, diode, and integrated circuit, etc. One skilled in the art would recognize other semiconductor devices, which may also be referred to as a (semiconductor) chip or die. Metallic interconnection 103 may substantially cover a surface of the semiconductor device proximate to the substrate, as shown in FIG. 1A, or may only partially cover a surface of the semiconductor device 101.

Second structure 102 may be a substrate or a carrier, such as a lead frame, a printed circuit board (PCB), a heat sink, a laminate, a metal foil, a metal sheet, and/or a metal plate, which may be integral to another device or may be deposited thereon. Semiconductor device 101 may be attached to substrate 102 via metallic interconnection 103, which may mechanically, electrically, and thermally connect the two structures. As metallic interconnection 103 may be a pure metal or metal alloy, which may be lead-free, it may be an optimal interconnect for die attach due to the superior electrical and thermal conductivity in comparison to other interconnects, such as conductive adhesives.

Figure 1B:
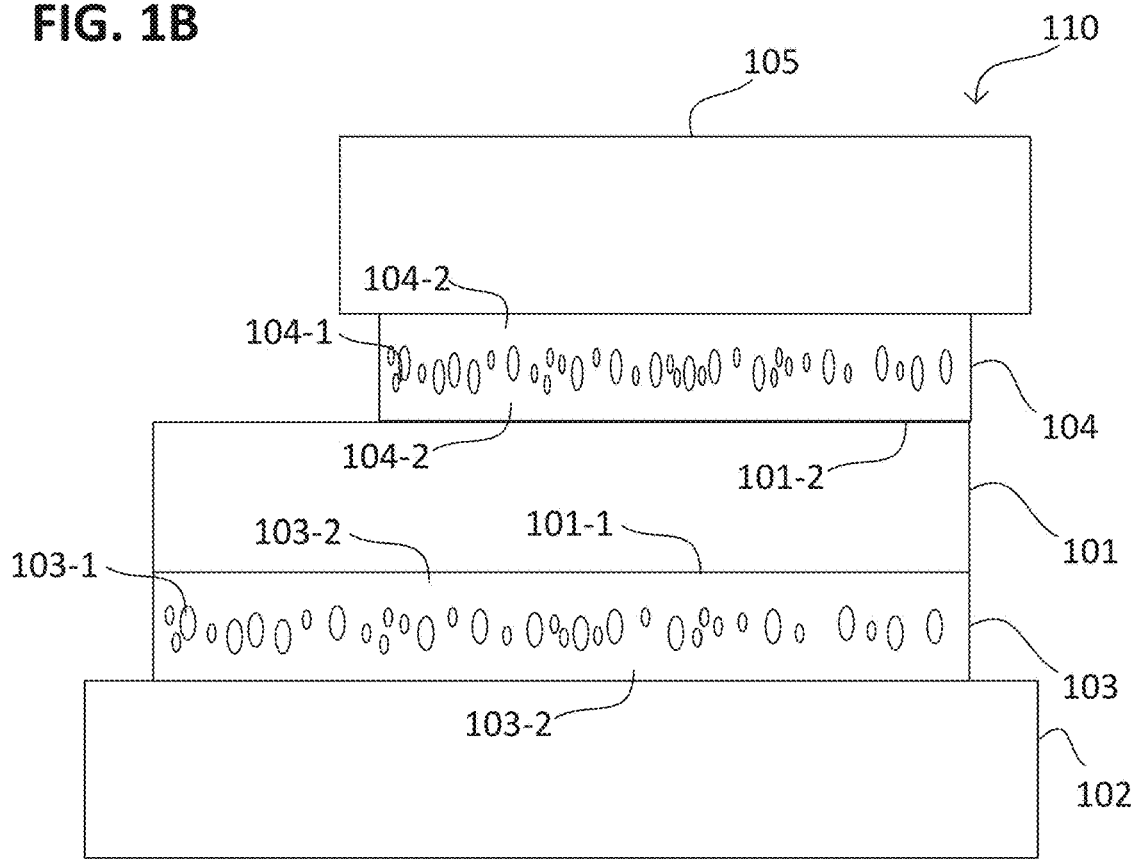

As may be shown in diagram 110 in FIG. 1B, a third structure 105 may also be connected to first structure 101 via a metallic interconnection 104. Metallic interconnection 104 may be the same or substantially the same metallic interconnection 103. Metallic interconnection 104 may be composed of a pure metal or metal alloy, and may have a porous region 104-1 that has a higher porosity than an adjacent region 104-2. Metallic interconnection 104 may substantially cover a surface of the semiconductor device 101 proximate to the third structure 105 or may only partially cover a surface of the semiconductor device 101, as shown in FIG. 1B. Metallic interconnection 104 may be on a side of semiconductor device 101 opposite that of metallic interconnection 103.

First structure 101 may be a semiconductor device 101 and second structure 102 may be a substrate 102. Third structure 105 may be an electrically conductive connector attached to semiconductor device 101. For example, third structure 105 may be a clip or other interconnector connecting semiconductor device 101 to another object, e.g., another substrate and/or semiconductor device (not shown). Similarly, third structure 105 may be a contact pad from which interconnectors may be connected to other objects (not shown). Semiconductor device 101 may have two or more metallic interconnects on a single surface, e.g., each metallic interconnection may not cover an entire surface of the semiconductor device 101, such as the illustration of metallic interconnection 104.

Alternatively, third structure 103 may be another semiconductor device, e.g., a stacked semiconductor device. Such a device may include multiple components formed in a semiconductor material, e.g., a logic chip and a memory, a logic chip and a MEMs component, multiple memories, multiple logic chips, etc. Metallic interconnection 103 may be beneficial as it offers a low pitch interconnect in comparison to other interconnect techniques, such as soldering and ball grid arrays. The lowest possible pitch for such techniques may be limited due to the risk of bridging from solder or flux wetting from neighboring contacts. As metallic interconnection 103 may be formed without secondary or tertiary components, which may be or become liquid during final fixation, the pitch, and also the distance between contacts, e.g., which may be formed by metallic interconnections 103, may be reduced.

Figure 2A:
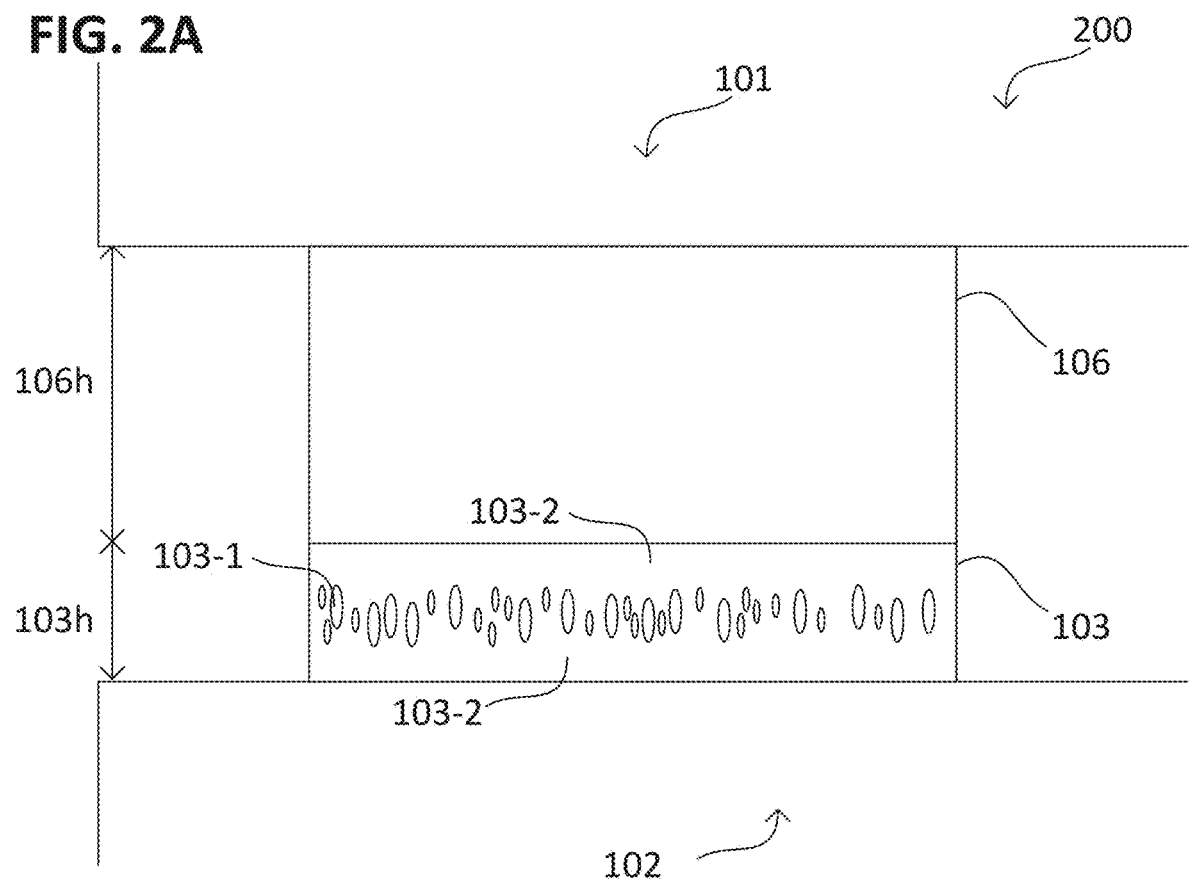
FIGS. 2A-2D show metallic interconnects on distal ends of pillars.

In an aspect of the disclosure, diagram 200 in FIG. 2A shows a pillar 106 protruding from first structure 101, which may have one or more pillars 106. On a distal end of pillar 106 is metallic interconnection 103 connected to second structure 102. Diagram 200 may be an enlarged view, not showing all of first structure 101 nor all of second structure 102. Pillar 106 may substantially define a gap between first structure 101 and second structure 102 (with metallic interconnection also defining part of the gap). The height 106$h$ of pillar 106 may be greater than the height 103$h$ of metallic interconnection 103. A cross-section of pillar 106 may be a geometric shape, such as a polygon or may be round. Alternatively, the cross-section of pillar 106 may be irregular. Along the height of pillar 106, the cross-section may vary.

Pillar 106 may be composed of a pure metal, e.g., the same metal as that of metallic interconnection 103, such as copper. Alternatively, pillar 106 may be composed of a metal alloy, such as the same metal alloy of metallic interconnection 103.

Pillar 106 may be beneficial where a gap between the first structure 101 and the second structure 102 is required, while also providing the benefits of metal interconnect 103. Furthermore, pillar 106 may be used for high-precision contact between first structure 101 and second structure 102, as the surface area of the distal end of pillar 106 would be smaller than a surface area of a surface of first structure 101 proximate to second structure 102. This allows for a pitch below 50 μm, such as 30 μm or even 20 μm, thus allowing for a greater number of contacts, e.g., I/O contacts, for a given area. Pillar 106 may also reduce the surface area where stress between the first structure 101 and second structure 102 may be communicated. In addition, porous region 103-1 of metallic interconnection 103 may further decouple the stress.

In a semiconductor context, first structure 101 may be a semiconductor device, such as a flip-chip. The one or more pillars 106 may correspond to contact pads or connection points on semiconductor device 101.

Figure 2B:
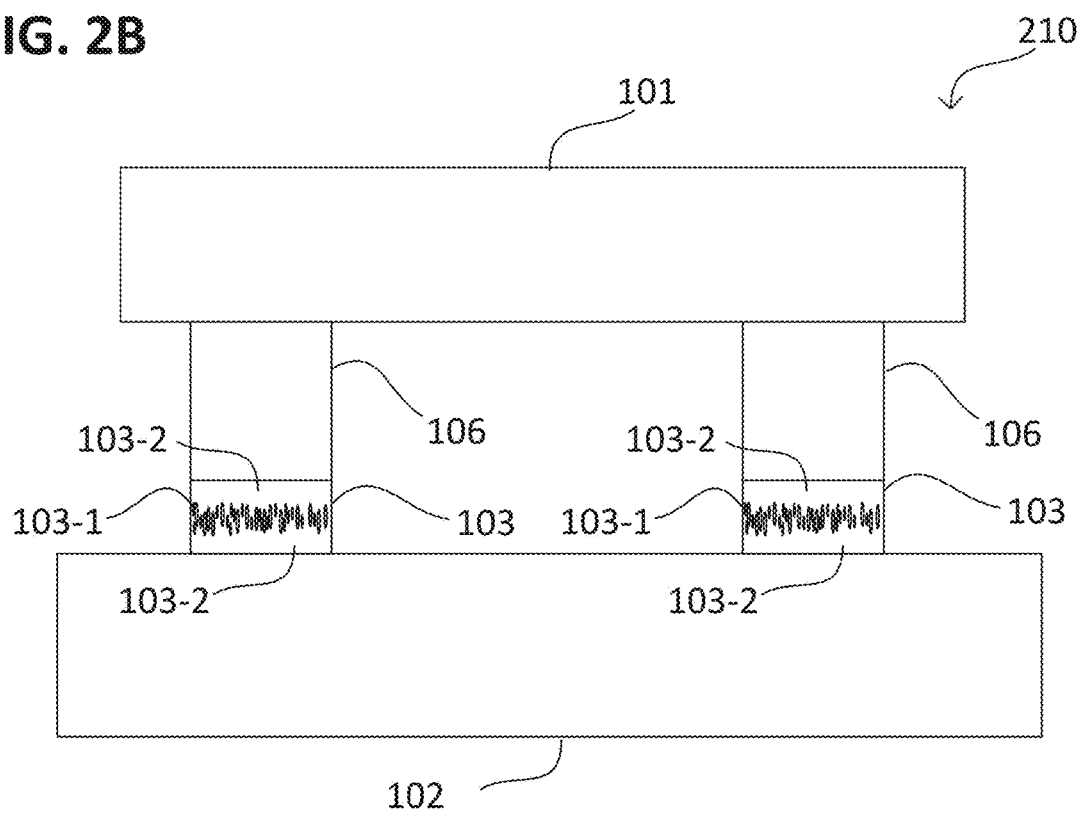

Diagram 210 in FIG. 2B shows a plurality of pillars 106. On the distal end of the plurality of pillars is a metallic interconnection 103 connecting first structure 101 to second structure 102. The plurality of pillars may substantially define a gap between first structure 101 and second structure 102. The plurality of pillars may provide more than one high-precision contact between first structure 101 and second structure 102, and may be located between contacts on first structure 101 and second structure 102 that are to be interconnected. A plurality of pillars 106 may also improve the mechanical connection between first structure 101 and second structure 102.

Figure 2C:
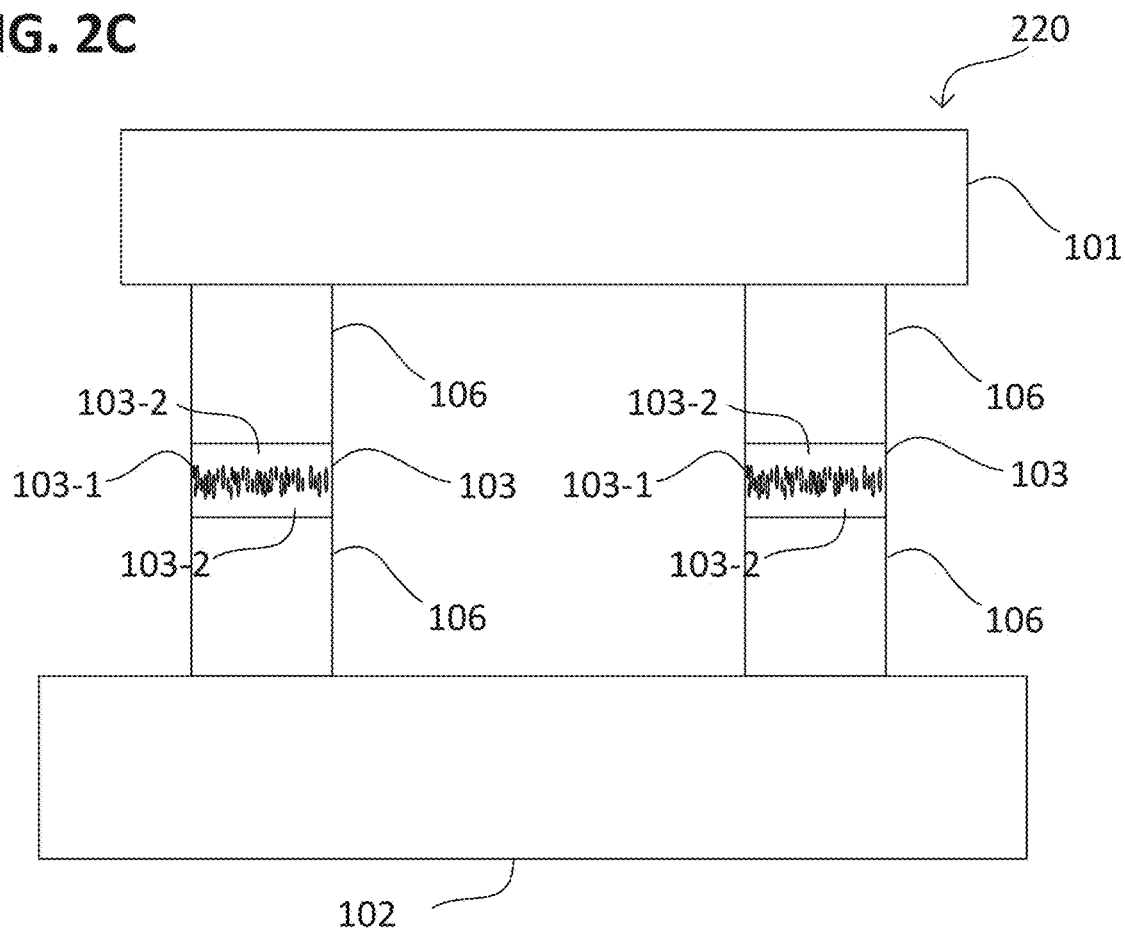

Diagram 220 in FIG. 2C may show a structure similar to diagram 210, except that second structure 102 may also include one or more pillars 106 that protrude from a surface of second structure 102. The one or more pillars 106 extending out from second structure 102 may be connected to one or more pillars 106 extending out from first structure 101 via one or more metallic interconnects at the respective distal ends of the one or more pillars 106. This arrangement may allow for multi-contact high-precision interconnection. In addition, the gap between first structure 101 and second structure 102 may be increased with two pillars 106 end-to-end. Alternatively, the two pillars 106 may be equal to the same height as one pillar 106, e.g., height 106$h$, or may also include the height 103$h$, as shown in FIG. 2A.

Figure 2D:
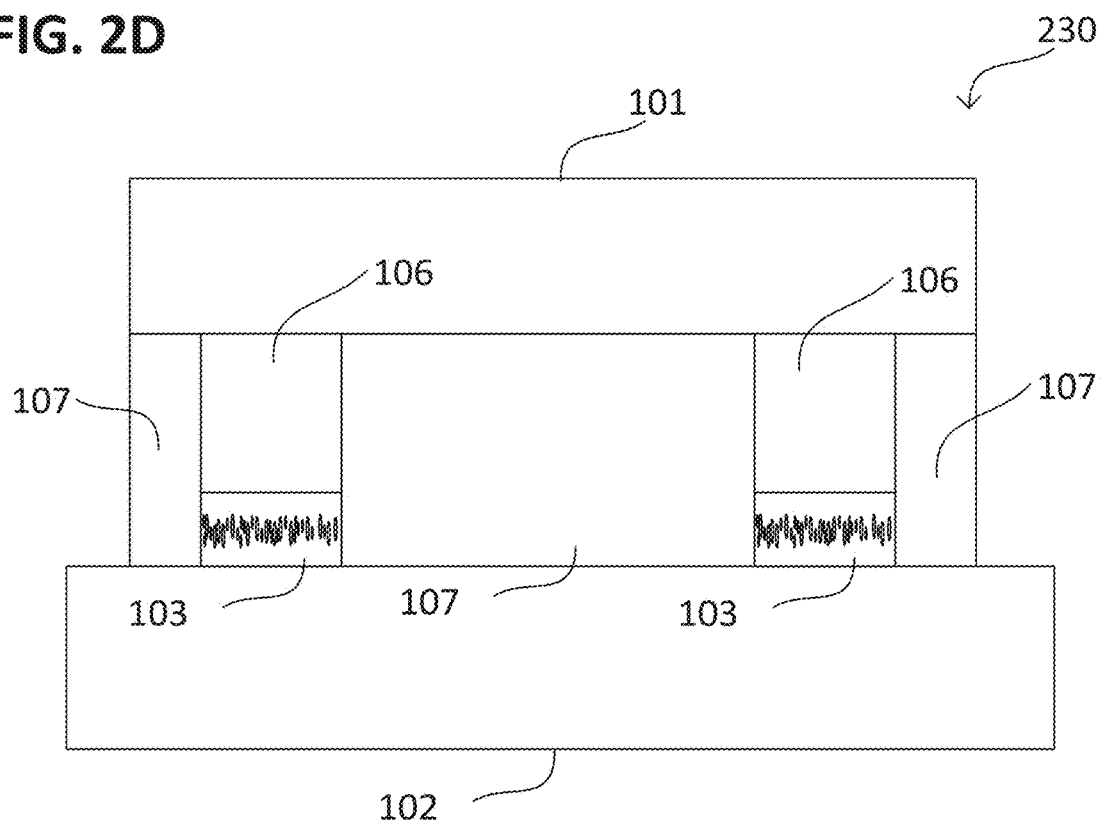

Diagram 230 in FIG. 2D shows the gap between first structure 101 and second structure 102 filled with a material 107. Material 107 may be configured to provide an elastic mechanical interconnection between first structure 101 and second structure 102 to decouple stress between the first structure 101 and the second structure 102, e.g., thermally induced stress. In addition, material 107 may be configured as a heat transfer material with a high thermal conductivity, e.g., greater than 100 W/m·K. Material 107 may include a polymer. Material 107 include an electrical insulator. Material 107 may further include a material, e.g., a filler, with a high thermal conductivity, such as a metal. Material 107 may be an underfill material.

As discussed above, a lead-free metallic interconnection would be advantageous, in particular, for die attach in the semiconductor industry. In addition, further benefits may be realized when manufacturing the metallic interconnect. In comparison to alternative options for lead-free interconnects, metallic interconnection 103 may be optimized.

For example, a sinter process may be used to form a lead-free metallic interconnect. The sintering process may be limited in that a printing process of a metallic paste has a limited accuracy. In addition, a relatively high pressure is required for sintering during the interconnect formation process, which means that only areal contacts, e.g., on a chip back-side, may be formed, as the pressure may locally be too great on a chip, resulting in breakage. Often, silver may be used for sintering metallic interconnects, as the required temperature and pressures to achieve sintering may be lower in comparison with other metals. When fixing a die via sintering with silver, a silver paste commonly may be used, which includes organic adders (solvents, etc.) that fix the die. However, silver readily forms dendrites, which can reduce reliability of a semiconductor device. Copper pastes that are sintered often lead to detrimental levels and types of voiding after a high-temperature anneal, such as clustering of vacancies to form voids.

Another option is to use a solder, however, lead-free solder materials are not available for all applications. Using solder may not require the use of pressure to form the interconnect, but the final fixture is often made with a paste or flux that is less accurate due to flow of the soldering material, while also introducing secondary chemistry to the interconnect. Use of secondary chemistry make require additional cleaning steps to remove the secondary chemistry, such as excess material, from the interconnection site. Using fluid solder materials may lead to solder overflow, for example, during placement of a semiconductor device on a substrate and/or drift. In addition, solder material may have low electrical and thermal performance characteristics with a relatively high bond line thickness, e.g., 60 μm. Solder interconnections may also require relatively high clearance distances between conductors, which may be more than 500 μm, and may lead to inefficient use of space on a substrate. Also, if re-work is required, the soldered connects may re-melt.

A further option may be to use a diffusion solder. Diffusion solder processes, however, also require the application of pressure while forming the interconnect, thereby limiting the interconnect formation to areal contacts to avoid chip breakage. The fixture of an interconnect in a diffusion solder process may require fixing chemistry, for example, the fixture may be made by using a tacking solvent or an interim-tape. Diffusion processes for complete diffusion may require very accurate processing that may be subject to at least partial re-melt during re-work.

An optimal alternative is shown in method 300 of FIG. 3. The method may include, at 310, providing a first structure 101 including a first metallic layer 110 having first microstructures 111 protruding from the first metallic layer 110; at 320, providing a second structure 102 including a second metallic layer 120 having second microstructures 121 protruding from the second metallic layer 120; at 330, contacting the first microstructures 111 and the second microstructures 121 to form a mechanical connection 115 between the first structure 101 and the second structure 102, wherein the mechanical connection 115 is configured to allow fluid to penetrate the mechanical connection 115; at 340, removing one or more non-metallic compounds on the first metallic layer 110 and the second metallic layer 120 with a reducing agent that penetrates the mechanical connection 115 and reacts with the one or more non-metallic compounds; and, at 350, heating the first metallic layer 110 and the second metallic layer 120 at a temperature causing interdiffusion of the first metallic layer 110 and the second metallic layer 120 to form the metallic interconnection 103 between the first structure 101 and the second structure 102.

Thus, in method 300, a first structure 101 may be placed in a location that will be its final fixed position on second structure 102 due to the mechanical connection 115 formed by the contacted first microstructures 111 and second microstructures 121, may be brought into contact with one another to maximize the contacted surface area, for example, the contact may cause deformation of the microstructures in which they may become intertwined or interlocked. Thus, in comparison to reducing the surface roughness of two metallic layer so that they are as planar as possible to increase the contact points between the two metallic layers, the increase in contact points may be made with the contacted microstructures. In addition, the microstructures may deform to adapt to the surface into which they are brought into contact thus increasing the number of points of contact between the microstructures and the contacted surface, e.g., increasing the points of contact between the first microstructures 111 and second microstructures 121.

The mechanical connection 115 with contacted first microstructures 111 and second microstructures 121 also allows fluid, which may be a gas or liquid, to penetrate the mechanical connection 115. A reducing agent may be introduced that penetrates the mechanical connection and removes the one or more non-metallic compounds that may be on the surfaces thereof. The one or more non-metallic compounds may be barriers, e.g., diffusion barriers, to the interdiffusion of metal of the first metallic layer 110 and/or the second metallic layer 120 (each including respective microstructures). As these barriers may be removed by the reducing agent, interdiffusion of the metals may be performed at a temperature lower than that with the barriers intact to form metallic interconnection 103, e.g., at a temperature at which annealing of the metal or metal alloy of metallic interconnection 103 would occur.

A metal of first metallic layer 110 and a metal of the second metallic layer 120 may be the same. For example, the metal may be copper. The metal may form oxides on surfaces exposed to oxygen. The metal of first metallic layer 110 and the metal of the second metallic layer 120 may be a metal alloy, or may be two different metals that form an alloy.

The first microstructures 111 and the second microstructures 121 may have a greater length than width. The first microstructures 111 and the second microstructures 121 may be nanowires or microwires formed from a metal, such as copper, with an electroplating process using a mask. The mask may include tubular structures and may be formed on a metal surface. The nanowires or microwires may be formed on the metal surface by electroplating, thus achieving the wire-like structure due to the tubular cavities in the mask.

The microwires may be solid, i.e., not hollow like a tube. The microstructures 111, 121 may have a height between 5 μm to 60 μm and a width, e.g., a diameter, between 100 nm to 2 μm. As used herein, a microstructure may be a structure having dimensions as described above, however, structures on a nanoscale may also be formed or be part of microstructures 111, 121. The nanostructures may, e.g., have a wire-like or dendritic form, and may, e.g., have a length less than 200 nm. Alternatively, nanostructures may be used instead of microstructures 111, 121, for the various aspects of the disclosure. The microstructures 111, 121 may be formed on one or more surfaces of first structure 101 and the second structure 102, and may be on only one surface of two surfaces that are to be joined with a metallic interconnection 103.

When the first microstructures 111 and the second microstructures 121 are pushed together, they may form a mechanical connection 115 similar to a hook and loop fastener due to the plurality of individual protruding structures forming an interference fit that holds the first structure 101 and second structure 102 in position relative to one another through friction. Furthermore, a variable porosity of the initial mechanical interconnect 115 may be achieved depending on the pressure used to form the initial mechanical interconnection between the first structure 101 and second structure 102. For example, a greater pressure would have a lower porosity than a smaller pressure, which may have a higher porosity in comparison. Accordingly, by selection of the pressure, the final porosity of metallic interconnection 103 may be determined for optimization between electrical performance, thermal performance, and stress reduction.

The chemical reduction of one or more non-metallic compounds, e.g., oxides, may be performed by a reducing agent that may be introduced to the first metallic layer 110, first microstructures 111, second metallic layer 120, and the second microstructures 121, e.g., in a vacuum oven, which may have an internal atmospheric pressure lower than an external atmospheric pressure. Removing the one or more non-metallic compounds may be performed substantially free of an oxidizing agent of a metal of the first metallic layer 110 and a metal of the second metallic layer 120. The reducing agent may be an agent that will bare a metal, e.g., reduces a metal-oxide of the metal. The reducing agent may include hydrogen. The reducing agent may include a ketone, an alcohol, or mixtures thereof. The reducing agent may include a carbon chain having e.g., from one carbon to twenty carbons, e.g., from one carbon to ten carbons, e.g., from one carbon to five carbons. It may be a mixture of gaseous hydrogen and gaseous nitrogen, e.g., forming gas including $H_2$ and $N_2$. The portion of gaseous hydrogen may be between 5 percent and 10 percent. The reducing agent may include formic acid. For example, the reducing agent may be or include formic acid, forming gas, ethanol, propanol, butanol, methanol, pentanol, hexanol, septanol, ectanol, or mixtures thereof. At the temperature causing inter-diffusion of the first metallic layer 110 and/or the second metallic layer 120, the reducing agent may decompose to include radical hydrogen. The reducing agent may be a plasma.

The reducing agent may include formic acid ($CH_2O_2$), which may be in gaseous form, and forming gas ($H_2$ and $N_2$). During reduction with these reducing agents the equilibrium pressure of water pressure (gaseous) formed during the reaction may be six orders of magnitude greater for reduction with formic acid when compared to forming gas (with a portion of 5 percent $H_2$) according to thermodynamic data. Accordingly, the usage of a gas mixture of forming gas (with a portion of e.g., 0.1-10 percent $H_2$, e.g., 5-10 percent $H_2$) with traces or a greater amount of formic acid, e.g., 100 ppm to 100,000 ppm, may greatly increase the speed of reduction at a temperature around 200° C. Accordingly, the metal or metal alloy of first metallic layer 110, second metallic layer 120, first microstructures 111, and second microstructures 121 may be processed in a process gas that may be inert, such as nitrogen or argon. Exemplary reducing agents may be forming gas with a portion of 5-10 percent $H_2$ in nitrogen; forming gas with a portion of 0.1-10 percent $H_2$ in nitrogen; a mixture of forming gas with formic acid vapor, e.g., 100 ppm to 100,000 ppm; a mixture of nitrogen or argon with formic acid vapor, e.g., 100 ppm to 100,000 ppm; and/or a mixture of any one of the preceding options additionally with ethanol or acetone as reducing agents. Additionally or alternatively, the reducing agent may be The reducing agent may clean the surfaces of the first metallic layer 110, first microstructures 111, second metallic layer 120, and the second microstructures 121 by removing metal-oxides or other non-metal elements or compounds on the surfaces. Therefore, a higher temperature is not required to decompose the metal-oxides or other non-metal elements or compounds on the surfaces, and the annealing may be performed at a lower temperature. The temperature may be below 350° C., e.g., between 260° C. and 150° C. The microstructures may also reduce the temperature required for annealing, e.g., in relation to a structure width, or particle size, of the microstructures, e.g., silver particles with a particle size of 2-3 nm may spontaneously anneal together at a temperature around 150° C., while larger particle sizes require a greater temperature. The particle size may be selected that a spontaneous anneal does not occur at room temperature, for example, for silver, the particle size should be greater than 1 nm to avoid the microstructures from annealing together at room temperature, e.g., around 20° C. In addition, or alternatively, a reducing plasma may be used to clean the surfaces of the first metallic layer 110, first microstructures 111, second metallic layer 120, and the second microstructures 121 by removing metal-oxides or other non-metal elements or compounds on the surfaces, so that temperatures around 100° C. may clean the surfaces and anneal the metal of the first metallic layer 110, first microstructures 111, second metallic layer 120, and the second microstructures 121 to form the metallic interconnection 103.

The reducing agent reacts with the metal-oxides or other non-metal elements or compounds on the surfaces, thereby removing them and other potential diffusion barriers, for example as byproducts. The pure metal or metal alloy is then left behind. The metallic interconnection 103 may be formed through material interdiffusion of the pure metal or metal alloy, i.e., the metal atoms of the first metallic layer 110, first microstructures 111, second metallic layer 120, and the second microstructures 121 may interdiffuse at the temperature applied thereto, e.g. an annealing temperature of a metal of the first metallic layer and/or the second metallic layer, e.g., due to a high binding energy of distinct atomic metal-metal bonds. The heating may be performed while removing the one or more non-metallic compounds. The heating may be performed in a vacuum oven. The heating may occur free from applied mechanical load to the first metallic layer 110 and the second metallic layer 120. The byproducts may be in the form of $H_2O$, which may be gaseous, and $CO_2$, which may also be gaseous. The byproducts may be moved away from the first metallic layer 110 and the second metallic layer 120, e.g., removed from the vacuum oven, such as via an exhaust.

In addition, the first metallic layer 110 and/or the second metallic layer 120 may have one or more organic materials on their surfaces. For example, the one or more organic materials may be an organic material that acts as a diffusion barrier thus preventing interdiffusion of the metals of the first metallic layer 110 and the second metallic layer 120. The one or more organic materials may be carbon and/or carbon-based compounds and/or a corrosion inhibitor for the metal of the first metallic layer 110 and/or the second metallic layer 120. For example, for copper, benzotriazole (BTA) may be used to form a passive layer over the surface of the first metallic layer 110 and/or the second metallic layer 120.

During the heating of the first metallic layer 110 and the second metallic layer 120 at a temperature causing interdiffusion of the metals of the first metallic layer 110 and second metallic layer 120 to form the metallic interconnection 103, the one or more organic materials may also be heated and decompose. The decomposed one or more organic materials may then be moved away from the first metallic layer 110 and the second metallic layer 120, e.g., removed from the vacuum oven, such as via an exhaust. For example, if the one or more organic materials is BTA and the heating is performed simultaneously or before or after the removal of the one or more non-metallic compounds with the reducing agent, the lack of an oxidizing agent may mean the BTA is removed via a pyrolytic reaction, i.e., the thermochemical decomposition of the material in the absence of, e.g., oxygen. Ultrasonic pulses may also be used in addition to heating to initiate break-up of the one or more organic materials through the mechanical impact of the ultrasonic waves. The ultrasonic pulses may break apart the layer of the one or more organic materials into smaller parts, which may increase the rate of decomposition of the one or more organic materials.

A metal alloy may have a higher interdiffusion rate when, for example, a first metal layer 110 and a second metal layer 120 has protruding structures, e.g., first microstructures 111 and/or second microstructures 121, dendritic protrusions, wire-like protrusions or a porous structure. The metals forming the alloy must, however, also react with one another and form a firm bond under the melting temperatures of the respective metals by forming intermetallic phases and forming a strong solution with minimal solubility required. Rather than a material interdiffusion by an alloy or some alloys in comparison to a pure metal interdiffusion for metallic interconnection 103, a lower sintering temperature of the metals may be realized through high thermodynamic momentum with the advantages that a lower reaction temperature may be used, which leads to minimal thermally induced stress on, e.g., first structure 101 and second structure 102, which may be due to CTE mismatch. In particular, nanostructures, e.g., having a length less than 200 nm, may achieve a lower annealing temperature than microstructures.

Method 300 may have the benefit of being performed using conventional die attach equipment without application of high pressure or high temperature. In addition, initial fixation, e.g., via a mechanical connection, may be performed without any additional secondary chemistry, as the contacted microstructures provide sufficient mechanical stability. Another benefit may be that formation of the metallic interconnection 103 may be made via a reducing anneal as a batch-process in a vacuum over, or by a reducing, isotropic plasma, which may be done on standard equipment. Thus, more than one metallic interconnection 103 may be formed at the same time on a single arrangement and/or a plurality of arrangements. For example, metallic interconnection 103 may be formed on a chip back-side and a chip front-side. The use of pastes may also lead to volume shrinkage of the interconnection, which is not the case with interdiffusion of the first metallic layer 110 and the second metal layer 120. Pillars 106, e.g., micro-pillars, may be used for ultra-high accuracy, and which may not require an additional wetting agent leading to minimal pitches, e.g., a few microns, and a lowest possible clearance distance. In addition, forming metallic interconnection 103 may be optimal for stacking, e.g., as metallic interconnection 103 to one or more of a lead frame, chip, clip, laminate, and/or other semiconductor structures that require interconnection, without loss of precision, as well as without other problems such as re-melting solder, high pressure, and/or risk of cracks.

The metallic interconnection 103 may have a higher porosity than the first metallic layer 110 and the second metallic layer 120, which may be configured to decouple stress between the first structure 101 and the second structure 102. As discussed above, metallic interconnection 103 may have "vertical" pores, e.g., voids 103-1, that form at a chip-metal interface. The "vertical" pores may have an increased reliability in relation to "round" pores, which may lead to delamination as they increase. The "vertical" pores may also make the metallic interconnection 103 more elastic, as well as permeable for gas, such as the reducing agent, and/or for an underfiller (e.g., a coating). Mechanical connection 115 may have a first porosity and the metallic interconnection 103 may have a second porosity less than the first porosity, as the interdiffusion may close, collapse, and/or decrease the size of some voids.

The microstructures may also be beneficial on lead frames or chips in areas that are not part of a metallic interconnection 103, as they may provide an optimally roughened surface for the adhesion of a mold compound. Accordingly, an adhesion promoter may not be required between a mold compound and a lead frame or semiconductor device.

The dimensions of the microstructures 111, 121 may also be adapted to have different heights and thicknesses, e.g., a diameter, and may also be adapted to adapt a specific topology with which the microstructures 111, 121 may be mated. As such, planarity in a nanometer range may not be needed for bonding on large surface areas. In addition, heat transfer to a thermal interface material (TIM) may be maximized.

Method 300 may further include forming the first metallic layer 110 on the first structure 101 and forming the second metallic layer 120 on the second structure 102. In addition, method 300 may also include forming first microstructures 111 on the first metallic layer 110 and forming the second microstructures 121 on the second metallic layer 120.

Furthermore, method 300 may include filling between the first microstructures 111 a non-metallic material 192 to a height less than a full length of the first microstructures 111 forming a composite layer 119 of the non-metallic material 192 with the first microstructures 111 extending through the non-metallic layer 192 so that a portion of the first microstructures 111 protrude from the non-metallic material 192. The portion of the first microstructures 111 protruding from the non-metallic layer 192 may be between 5-60 μm.

Additionally or alternatively, method 300 may further include filling between the second microstructures 121 a non-metallic material 192 to a height less than a full length of the second microstructures 121 forming a composite layer 119 of the non-metallic material 192 with the second microstructures 121 extending through the non-metallic layer 192 so that a portion of the second microstructures 121 protrude from the non-metallic material 192. The portion of the second microstructures 121 protruding from the non-metallic layer 192 may be between 5-60 μm.

The composite layer 119 of the non-metallic material 192 and the first microstructures 111 or the second microstructures 121 may be configured to decouple stress between the first structure 101 and the second structure 102. Non-metallic material 192 may be inert to the reducing agent.

First structure 101 may be a semiconductor device and second structure 102 may be a substrate. Alternatively, second structure 102 may include a microelectromechanical system (MEMS) and first structure 101 may be a cap that seals in the MEMS into a sealed structure. A MEMS may be a transducer in semiconductor technology that converts input of one energy type into another type of energy, where one of the types of energy may be electric energy, e.g., an electrical signal.

Figure 4:
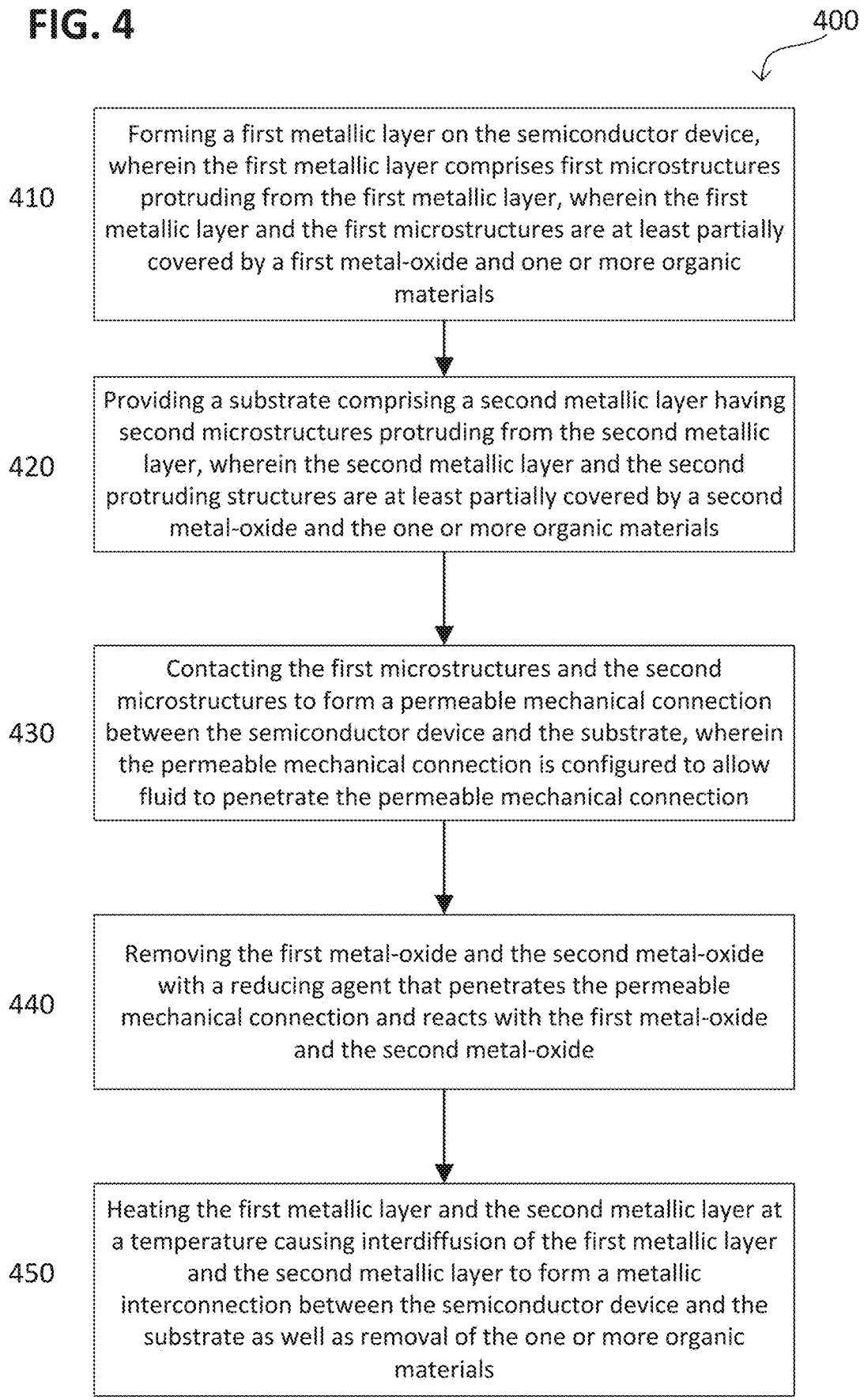
FIG. 4 shows a method of manufacturing a metallic interconnect.

Method 300 may be advantageous in a semiconductor context. Method 400 in FIG. 4 may show application of method 300 in a semiconductor context in which first structure 101 is a semiconductor device 101 and second structure 102 is a substrate 102. Method 400 may include: in 410, forming a first metallic layer 110 on the semiconductor device 101, wherein the first metallic layer 110 includes first microstructures 111 protruding from the first metallic layer 110, wherein the first metallic layer 110 and the first microstructures 111 are at least partially covered by a first metal-oxide; in 420, providing a substrate 102 including a second metallic layer 120 having second microstructures 121 protruding from the second metallic layer 120, wherein the second metallic layer 120 and the second protruding structures 121 are at least partially covered by a second metal-oxide; in 430, contacting the first microstructures 111 and the second microstructures 121 to form a mechanical connection 115 between the semiconductor device 101 and the substrate 102, wherein the mechanical connection is configured to allow fluid to penetrate the mechanical connection 115; in 440, removing the first metal-oxide and the second metal-oxide with a reducing agent that penetrates the mechanical connection 115 and reacts with the first metal-oxide and the second metal-oxide; and, in 450, heating the first metallic layer 110 and the second metallic layer 120 at a temperature causing interdiffusion of the first metallic layer 110 and the second metallic layer 120 to form a metallic interconnection 115 between the semiconductor device 101 and the substrate 102.

Figure 5A:
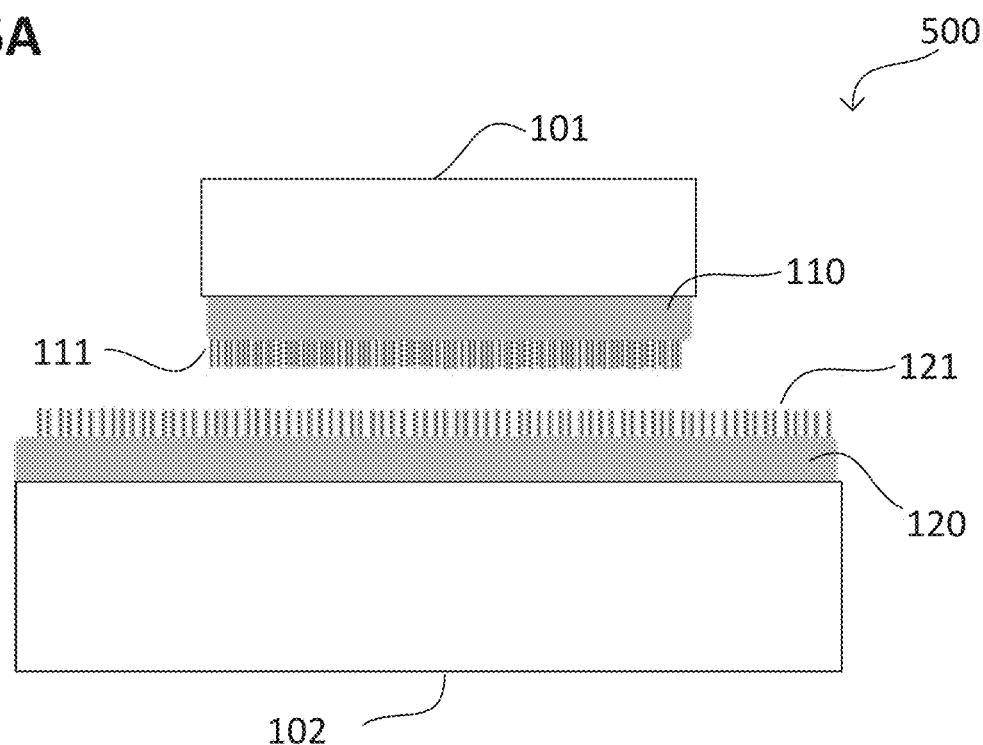
FIGS. 5A-5G show manufacturing a metallic interconnect.

Diagram 500 in FIG. 5A shows part of method 300, 400. First structure 101, which may be a semiconductor device 101, is shown with first metallic layer 110 on a surface of first structure 101 having first microstructures 111 protruding from first metallic layer 110. However, first metallic layer 110 and first microstructures 111 may be on more than one surface of first structure 101 and may cover every surface of first structure 101. In addition, second structure 102 is shown, which may be a substrate 102. Second structure 102 includes second metallic layer 120 with second microstructures 121. Although diagram 500 shows second structure 102 with second metallic layer 120 and second microstructures 121 on one surface of second structure 102, second metallic layer 120 and second microstructures 121 may cover more than one surface or all surfaces of second structure 102. When contacting first microstructures 111 and second microstructures 121, first structure 101 may be aligned with second structure 102, by, for example, aligning marks, before placement and contacting.

Figure 5B:
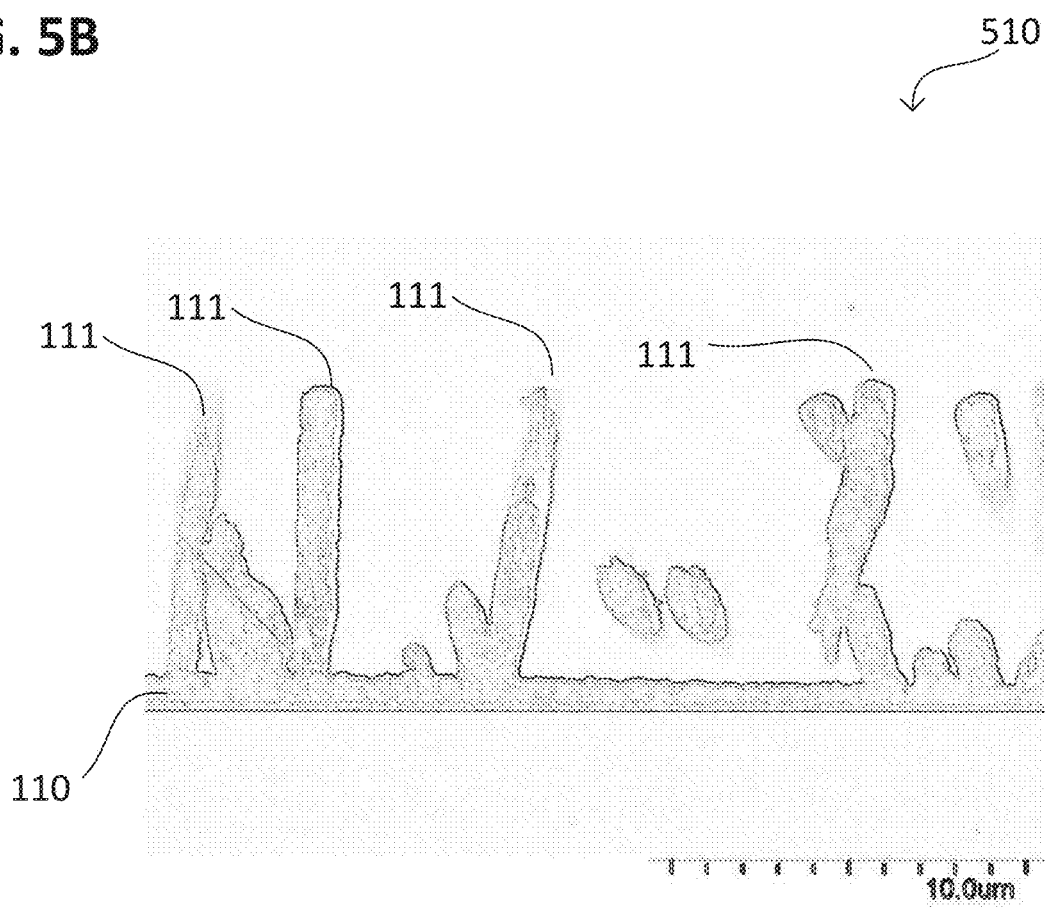

Diagram 510 in FIG. 5B shows an exemplary close-up view of first microstructures 111 protruding from first metallic layer 110. Second microstructures 121 protruding from second metallic layer 120 may be substantially the same or similar. As may be seen, individual microstructures may differ, having, e.g., differing in every dimension, however, the microstructures may all have a length between 5-60 μm and a width of between 100 nm and 2 μm. The microstructures may generally be arranged in a perpendicular orientation to first metallic layer 110, however, not all microstructures may be arranged in this orientation. Some microstructures may clump together, while other microstructures may stand alone. The microstructures may be microwires with a generally cylindrical shape. The microstructures may be formed by an electroplating process using resists.

Figure 5C:
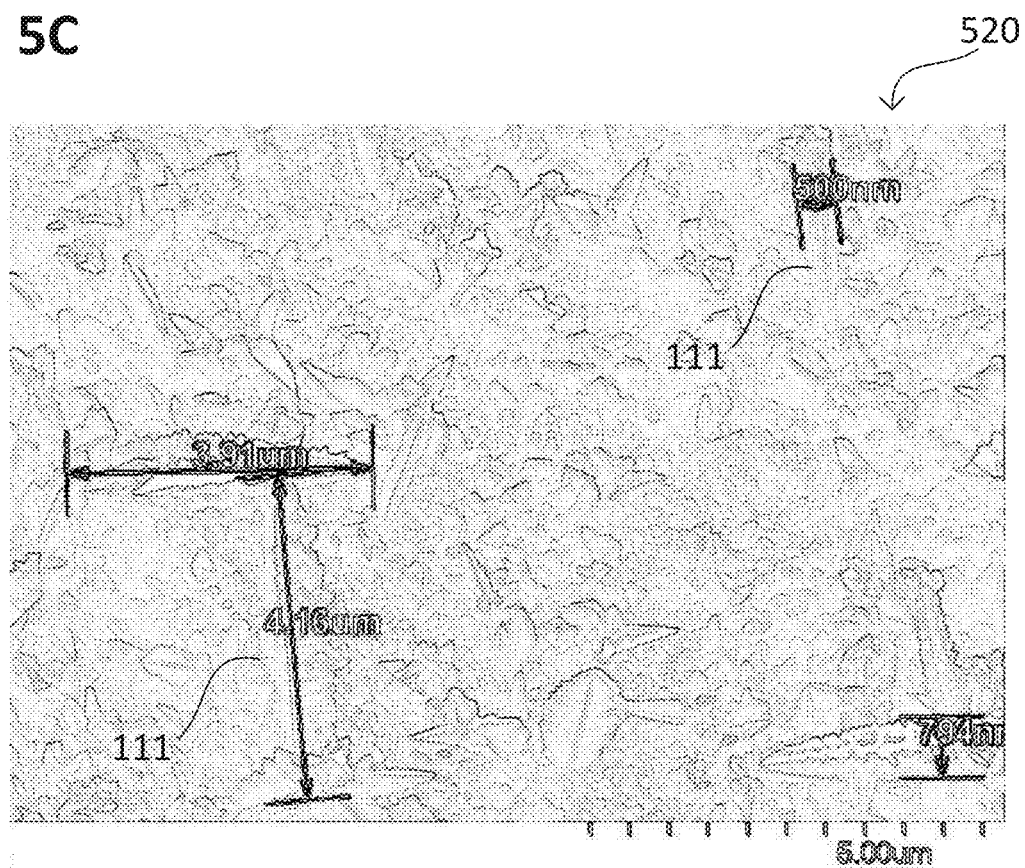
Figure 5D:
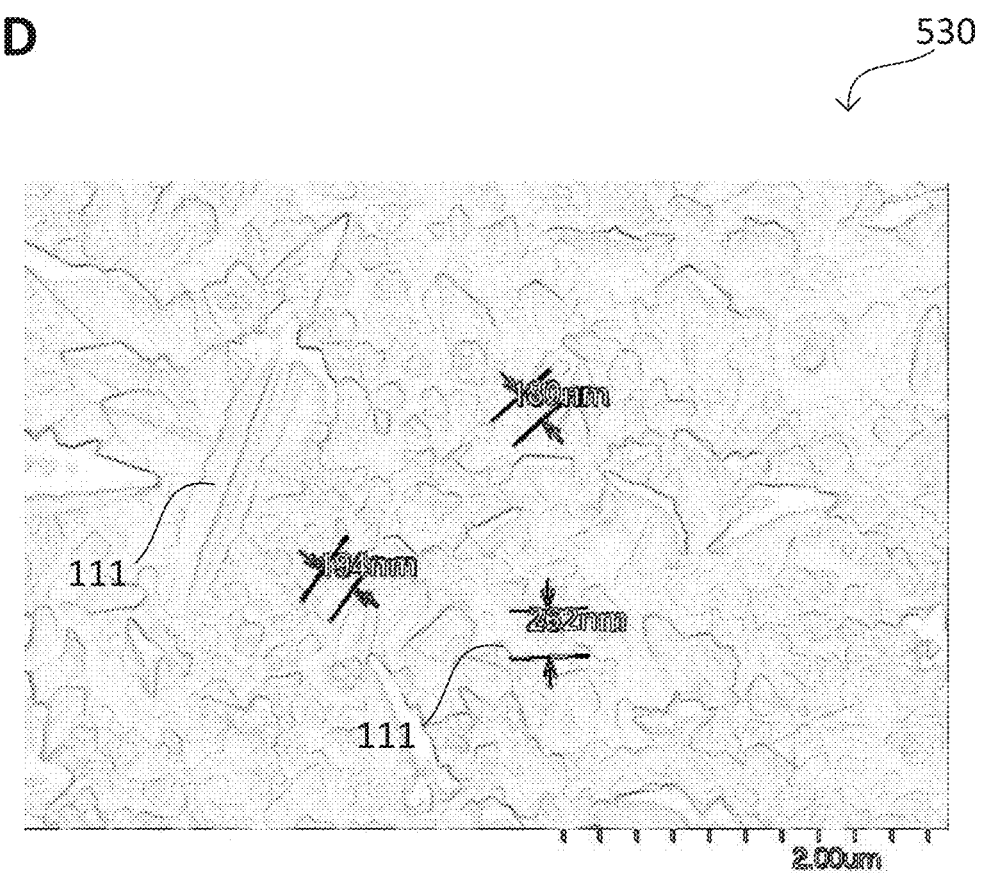

Diagram 520 in FIG. 5C and diagram 530 in FIG. 5D show alternative structures and dimensions of microstructures and/or nanostructures 111. These metal or metal alloy microstructures and/or nanostructures may have a reduced annealing, or even melting, temperature, which allows for a relatively low processing temperature, which may be beneficial in, e.g., semiconductor manufacture. With a lower processing temperature to form metallic interconnection 103, a system with two structures having a high CTE mismatch it may possible to minimize stress and relative displacement to each other, such as in the bimetal effect, as well as reducing permanent warpage that may reduce the height of the final device. The solid microstructures and/or nanostructures may also avoid formation of voids in comparison to fluid-to-solid transitions. The microstructures and/or nanostructures may be formed by galvanic deposition; etching of a metal substrate; vapor deposition techniques, e.g., physical vapor deposition, chemical vapor deposition, etc.; and/or thermal or chemical destruction of metalorganic bonds in liquid or gaseous phase. An electrochemical deposition may be used to grow dendritic structures, for example, with a direct current and a pulse plating deposition, which may use a series of pulses of equal amplitude, duration, and polarity for deposition. Electroless plating of metals or metal alloys may also be used with a reducing agent, e.g., electroless NiP with $NaHPO_3$ for copper, which may be a non-galvanic plating process without the use of an external power source. Thermal decomposition of organometals and inorganic salts, e.g., silver carboxylate as a liquid film may also be used to form the microstructures or a porous layer of nano-scale particles. Vapor deposition may be used, for example, by combusting organometals with decomposition of inorganic salts in reaction with metal cations.

Adsorption of an organic layer during or after deposition may prevent an interdiffusion of the microstructures with one another. Oxidation layers or other passivations of the surface may be avoided, for example, by silver electrolytes with benzotriazole and/or benzotriazole-derivatives as an additive or using an organic solvent as an electrolyte in which the solvent molecules may act as a protective layer, e.g., amines, diamines, triazole-derivatives, isocyanide, etc. These layers may be removed by heating them until the layer decomposes, e.g., via a pyrolytic reaction in which the organic material of the layer may decompose when heated to or above a particular temperature in the absence of oxygen, however, surfaces not sensitive to interdiffusion and larger structures may not require an intermediary diffusion barrier or protective layer.

Figure 5E:
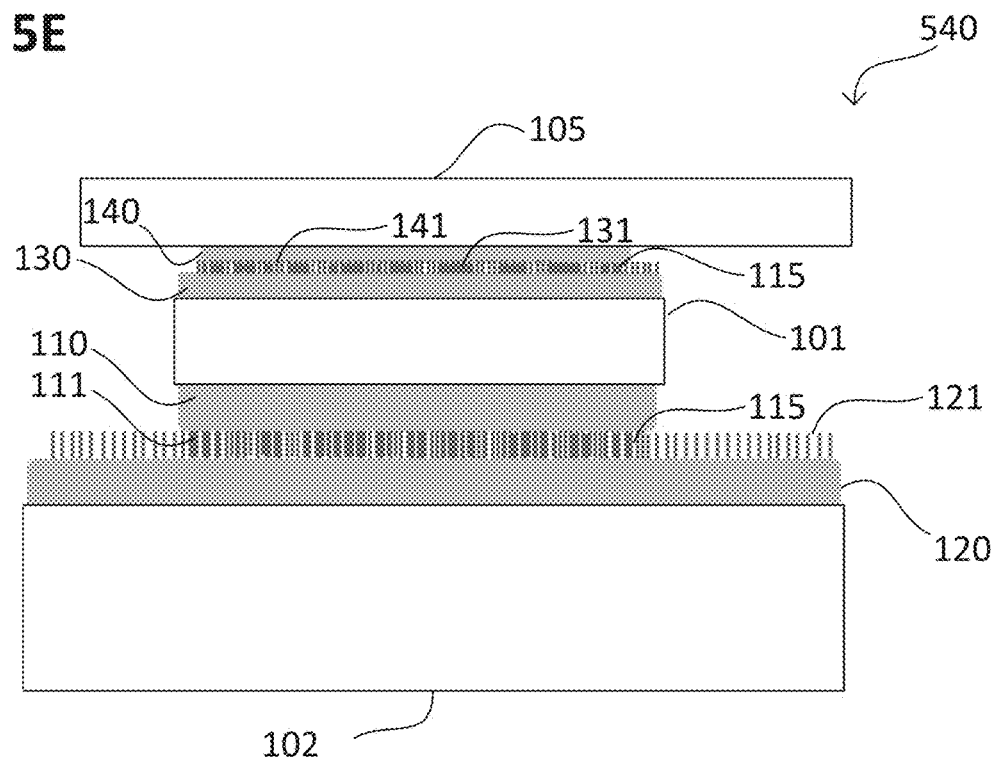

Diagram 540 in FIG. 5E shows first structure 101 in a mechanical connection 115 with second structure 102 and also in a mechanical connection 115 with third structure 105. Mechanical connection 115 between first structure 101 and second structure 102 may be formed by contacting first microstructures 111 and second microstructures 121, while the mechanical connection 115 between first structure 101 and third structure 105 may be formed by contacting third microstructures 131 protruding from a third metallic layer 130 and fourth microstructures 141 protruding from a fourth metallic layer 140. Third metallic layer 130 and fourth metallic layer 140 may be similar to first metallic layer 110 and second metallic layer 120. A metal of third metallic layer 130 and a metal of the fourth metallic layer 140 may be the same. For example, the metal may be copper. The metal may form oxides on surfaces exposed to oxygen. The metal of third metallic layer 130 and the metal of the fourth metallic layer 140 may be a metal alloy, or may be two different metals that form an alloy.

The third microstructures 131 and the fourth microstructures 141 may have a greater length than width. The third microstructures 131 and the fourth microstructures 141 may be microwires formed from a metal, such as copper, with an electroplating process using a resist. The microwires may be solid, i.e., not hollow, such as a tube. The microstructures 131, 141 may have a height between 5 µm to 60 µm and a width, e.g., a diameter, between 100 nm to 2 µm. The microstructures 131, 141 may be formed on one or more surfaces of first structure 101 and the third structure 105, and may be on only one surface of two surfaces that are to be joined with a metallic interconnection 104.

When the third microstructures 131 and the fourth microstructures 141 are pushed together, they may form a mechanical connection 115 similar to a hook and loop fastener due to the plurality of individual protruding structures forming an interference fit that holds the first structure 101 and third structure 105 in position relative to one another through friction. Furthermore, a variable porosity of the initial mechanical interconnect 115 may be achieved depending on the pressure used to form the initial mechanical interconnection between the first structure 101 and third structure 105. For example, a greater pressure would have a lower porosity than a smaller pressure, which may have a higher porosity in comparison. Accordingly, by selection of the pressure, the final porosity of metallic interconnection 104 may be determined for optimization between electrical performance, thermal performance, and stress reduction.

Figure 5F:
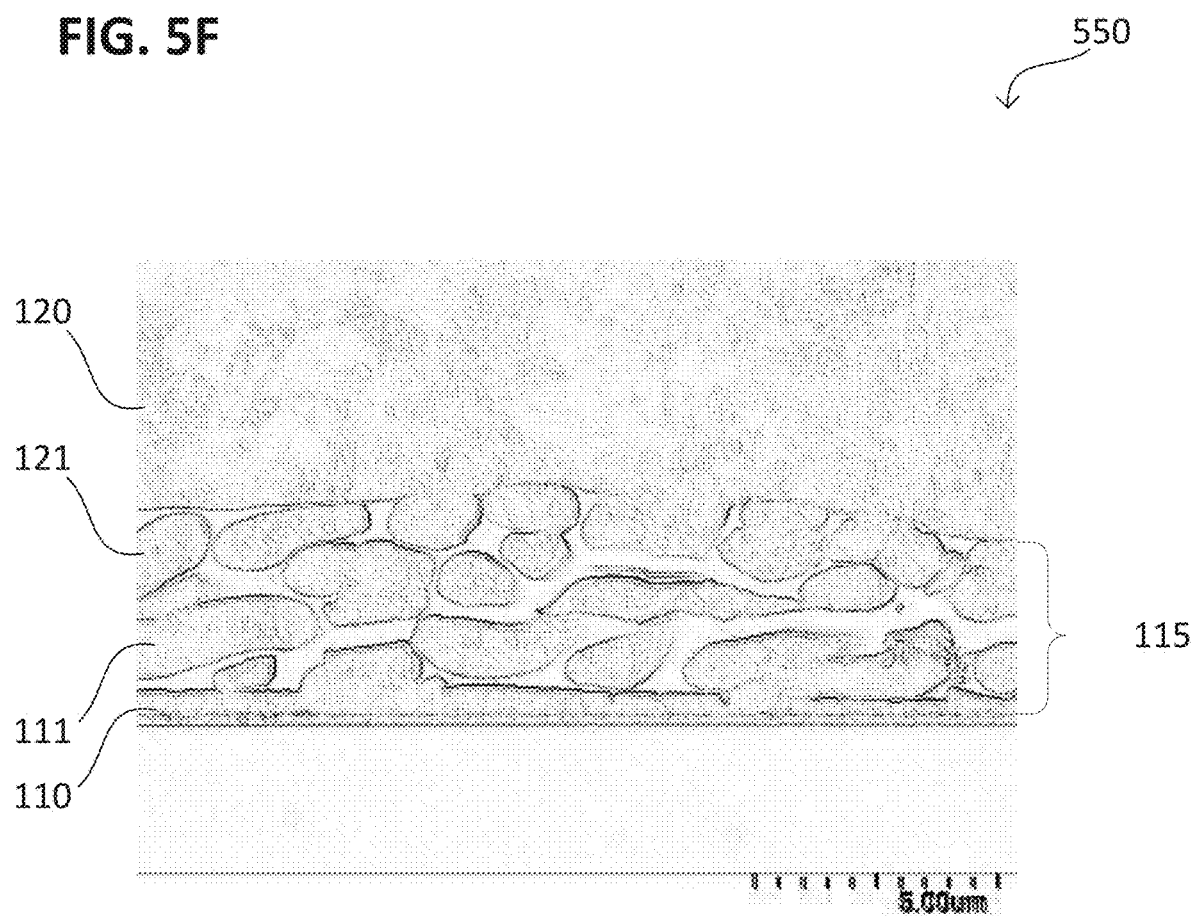

Diagram 550 in FIG. 5F shows a mechanical interconnection 115 in detail. Here, mechanical connection 115 is exemplary formed by contacted first microstructures 111 and second microstructures 121. The contacted microstructures may form a mechanical connection 115 through friction between the structures, such as in an interference fit, that holds first structure 101 and second structure 102 in place. As may be seen, mechanical connection 115 may be configured to allow fluid to penetrate the mechanical connection 115. The fluid may be the reducing agent which may be able penetrate mechanical connection 115 to remove non-metallic elements or compounds, such as metal-oxides, on the surfaces of first metallic layer 110, first microstructures 111, second metallic layer 120, second microstructures 121, third metallic layer 130, third microstructures 131, fourth metallic layer 140, and fourth microstructures 141.

Figure 5G:
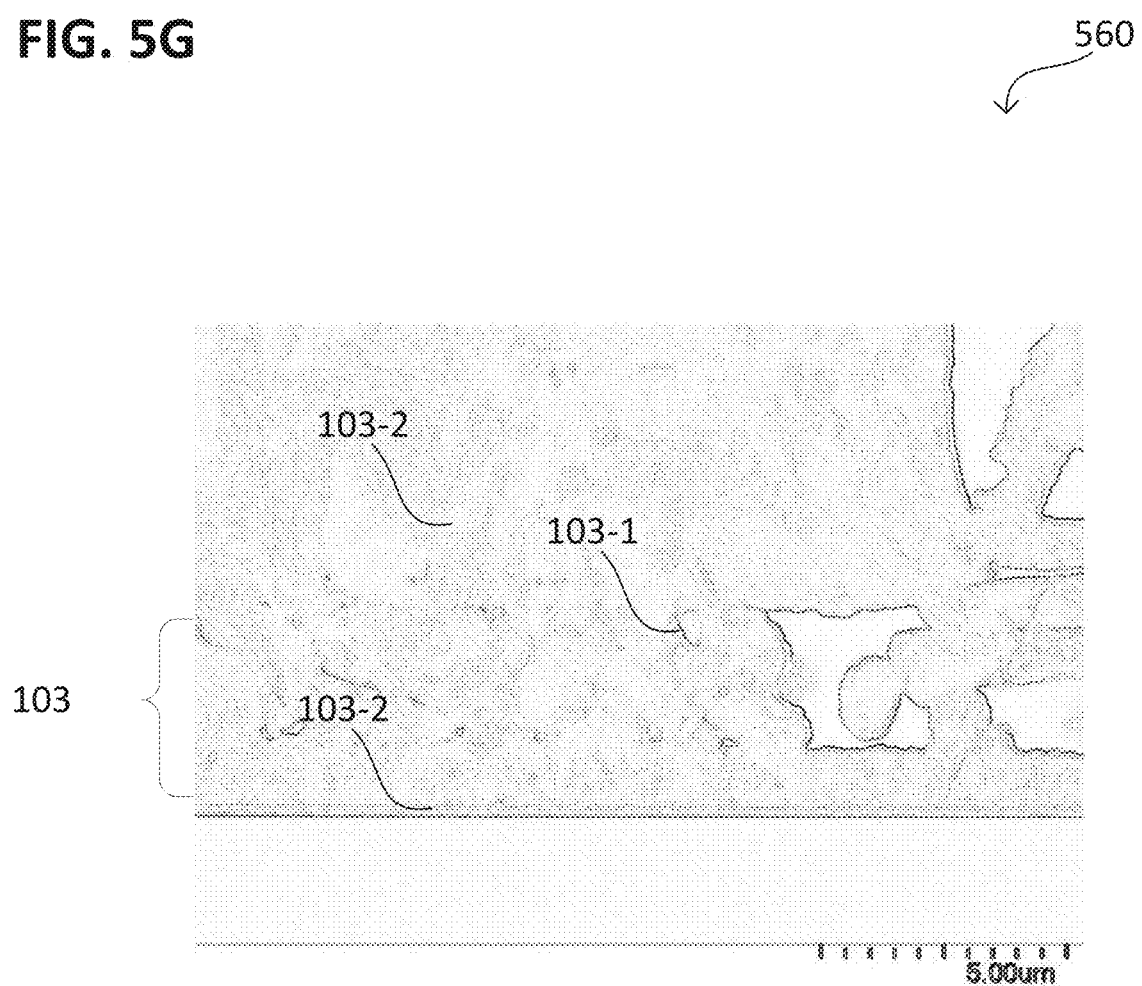

Diagram 560 in FIG. 5G shows diagram 550 after being heated at a temperature causing interdiffusion. Here it may be seen that first metallic layer 110 and second metallic layer 120 have interdiffused, e.g., annealed, to form metallic interconnection 103 with a porous region 103-1 and an adjacent region 103-2 of the metallic interconnection 103 having a lower porosity than porous region 103-1. Adjacent regions 103-2 may substantially be formed from first metallic layer 110 and second metallic layer 120, while porous region 103-1 may substantially be formed from the first microstructures 111 and second microstructures 121.

As shown in FIG. 5F and FIG. 5G, first microstructures 111 and second microstructures 121, may be brought into contact with one another causing a deformation of the microstructures in which they may become intertwined or interlocked. In addition, the microstructures may deform to adapt to the surface into which they are brought into contact thus increasing the number of points of contact between the microstructures and the contacted surface, e.g., increasing the points of contact between the first microstructures 111 and second microstructures 121.

Figure 6:
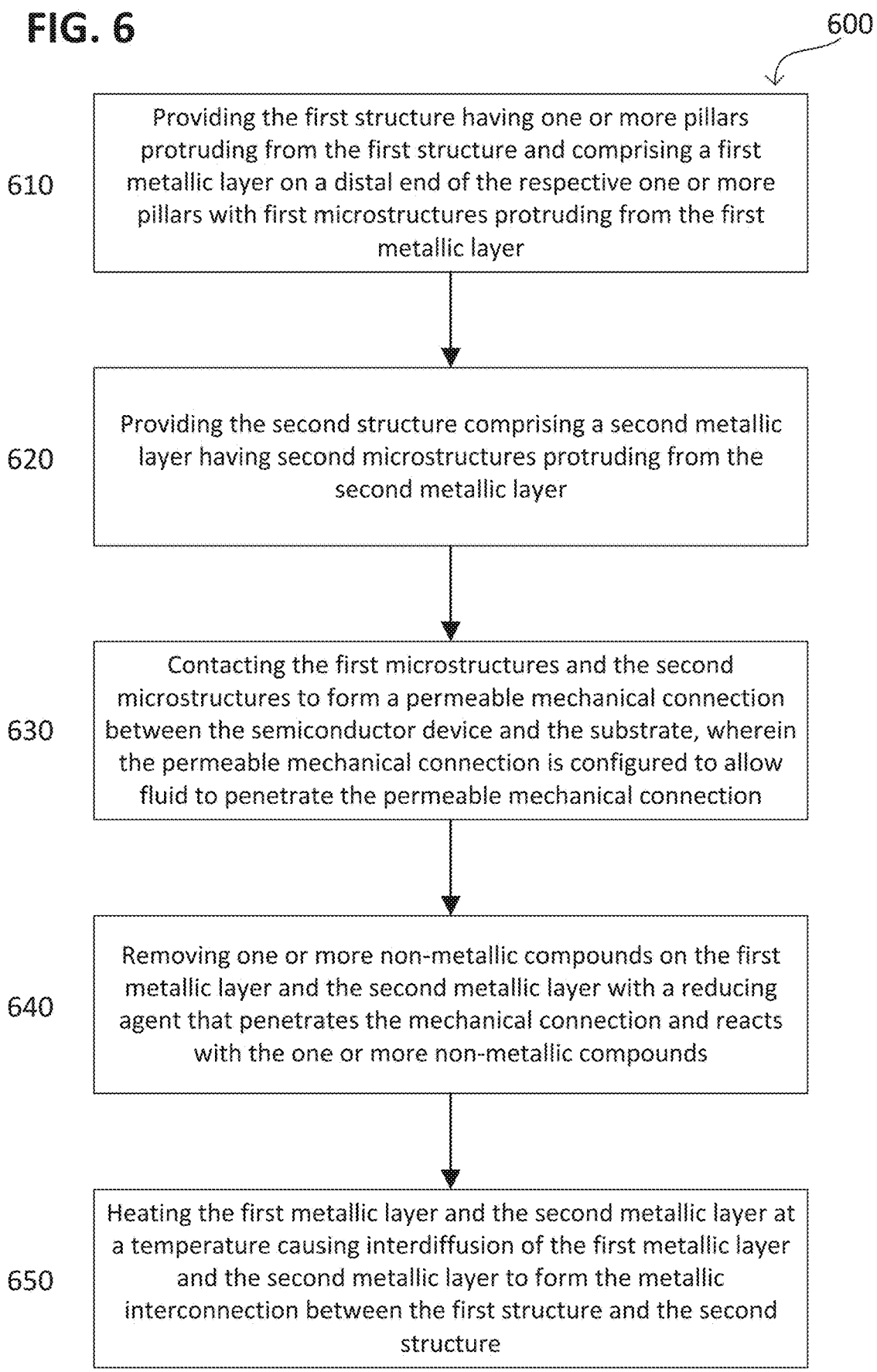
FIG. 6 shows a method of manufacturing a metallic interconnection on distal ends of pillars.

Method 600 in FIG. 6 may include: in 610, providing the first structure 101 having one or more pillars 106 protruding from the first structure 101 and including a first metallic layer 110 on a distal end of the respective one or more pillars 106 with first microstructures 111 protruding from the first metallic layer 110; in 620, providing the second structure 102 including a second metallic layer 120 having second microstructures 121 protruding from the second metallic layer 120; in 630, contacting the first microstructures 111 and the second microstructures 121 to form a mechanical connection 115 between the first structure 101 and the second structure 102 with the one or more pillars 106 defining a gap between the first structure 101 and the second structure 102, wherein the mechanical connection 115 is configured to allow fluid to permeate the mechanical connection 115; in 640, removing one or more non-metallic compounds on the first metallic layer 110 and the second metallic layer 120 with a reducing agent that penetrates the mechanical connection 115 and reacts with the one or more non-metallic compounds; and, in 650, heating the first metallic layer 110 and the second metallic layer 120 at a temperature causing interdiffusion of the first metallic layer 110 and the second metallic layer 120 to form the metallic interconnection 103 between the first structure 101 and the second structure 102.

Method 600 may further include filling the gap between the first structure 101 and the second structure 102 with a material 107. Material 107 may be configured to provide an elastic mechanical interconnection between first structure 101 and second structure 102 to decouple stress between the first structure 101 and the second structure 102, e.g., thermally induced stress. In addition, material 107 may be configured as a heat transfer material with a high thermal conductivity, e.g., greater than 100 W/m·K. Material 107 may include a polymer. Material 107 include an electrical insulator. Material 107 may further include a material, e.g., a filler, with a high thermal conductivity, such as a metal. Material 107 may be an underfill material.

Figure 7A:
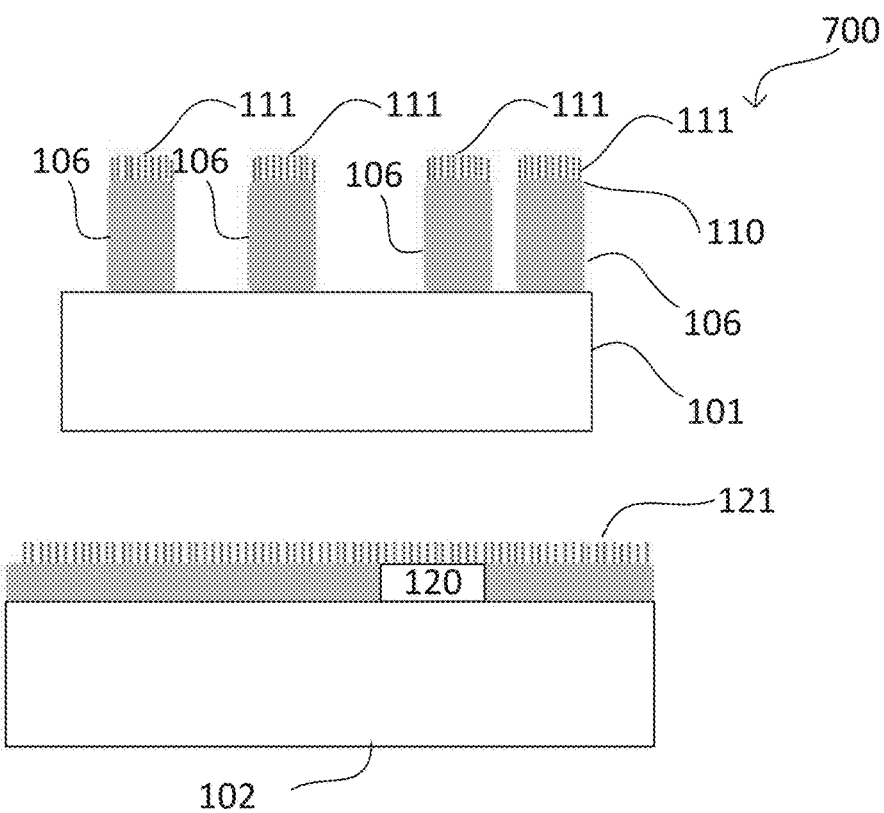
FIGS. 7A-7D show manufacturing a metallic interconnection on distal ends of pillars.

Diagram 700 in FIG. 7A shows first structure 101 having one or more pillars 106 protruding from the first structure 101 and including a first metallic layer 110 on a distal end of the respective one or more pillars 106 with first microstructures 111 protruding from the first metallic layer 110. Also shown is second structure 120 including a second metallic layer 120 having second microstructures 121 protruding from the second metallic layer 120. First metallic layer 110, first microstructures 111, second metallic layer 120, second microstructures 121, and the one or more pillars 106 may be made of the same metal, e.g., copper. The metal may be a pure metal, which may include one or more trace elements. Alternatively, the metal of the one or more pillars 106 may be a different metal from that of first metallic layer 110, first microstructures 111, second metallic layer 120, and second microstructures 121. The pillars may align with contact points configured for electrical connection on second structure 102.

Figure 7B:
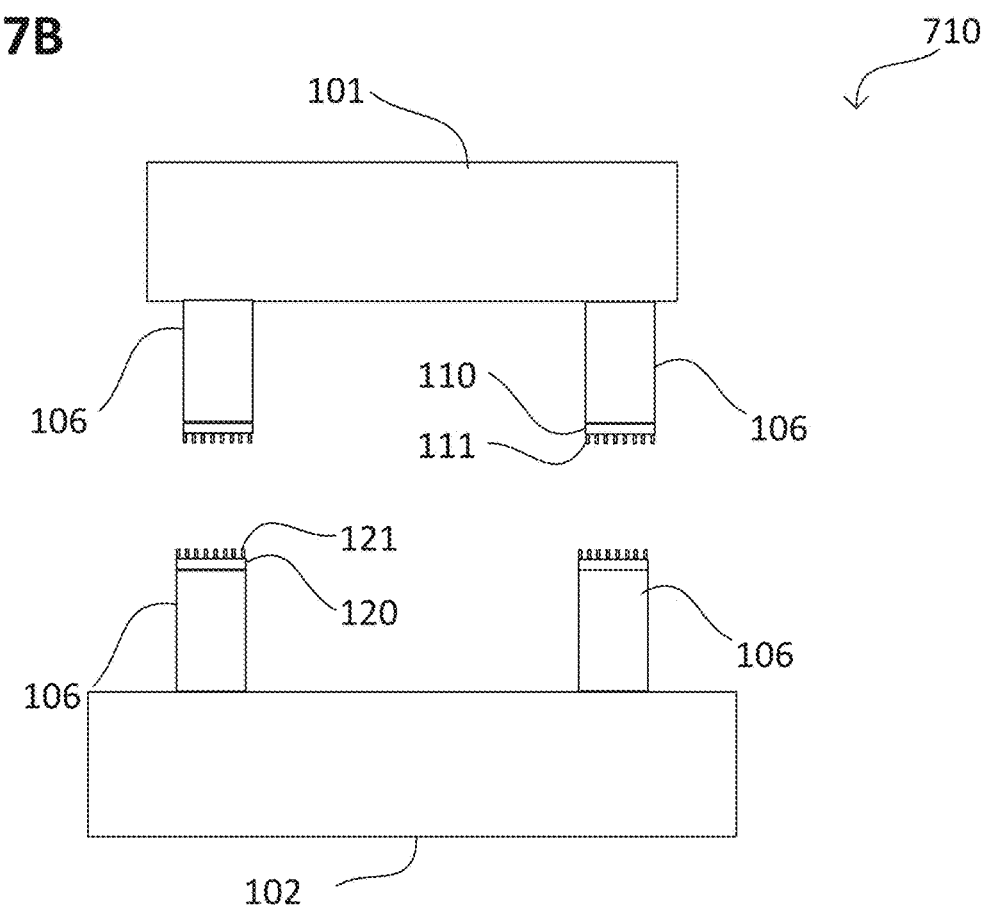

Diagram 710 in FIG. 7B shows second structure 102 also with one or more pillars 106 including, on a distal end of the one or more pillars, a second metallic layer 120 with second microstructures 121 protruding from the second metallic layer 120. The one or more pillars on first structure 101 and second structure 102 may be configured to align so the first microstructures 111 and second microstructures 121 may interlock on respective pillars 106.

Figure 7C:
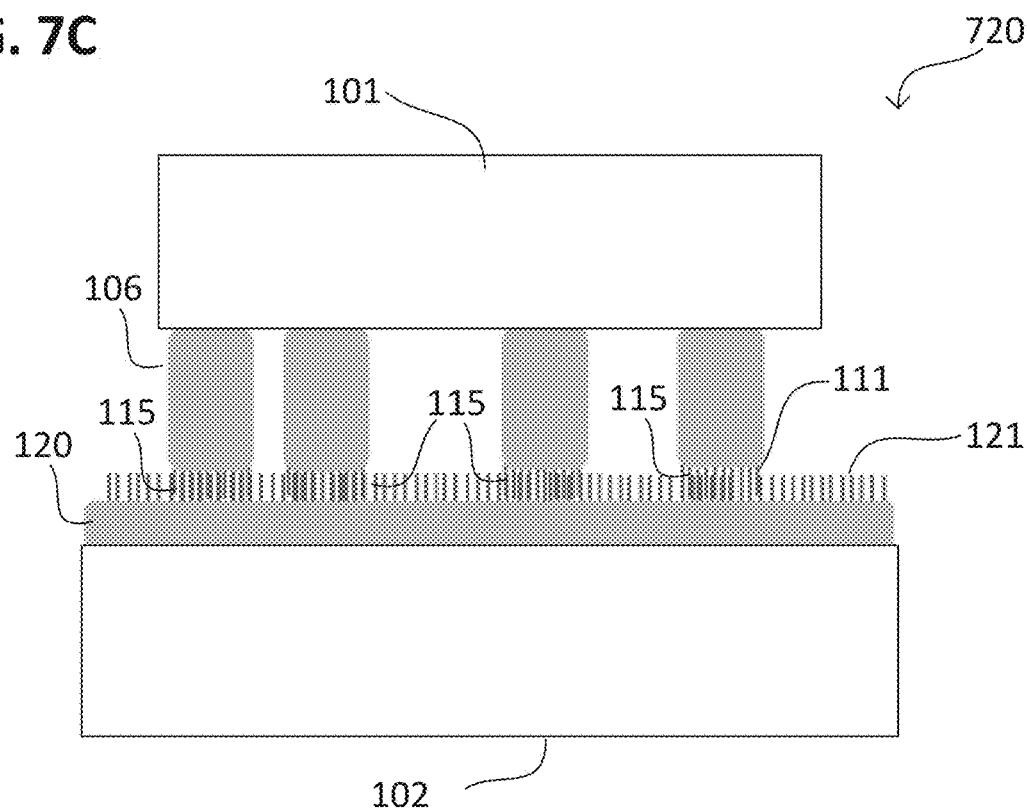

Diagram 720 in FIG. 7C shows first microstructures 111 and second microstructures 121 contacted to form a mechanical interconnection 115. First structure 101 may be held in place on second structure 102 due to mechanical interconnection 115. As shown in diagram 720, the second metallic layer 120 and the second microstructure 121 may cover a whole surface of second structure 102, however, they may also be arranged in specific areas of second structure 102 that may correspond and align with the one or more pillars on first structure 101, so that second structure 102 may have one or more contact areas, each having a second metallic layer 120 with second microstructures 121 protruding from the second metallic layer 120.

Figure 7D:
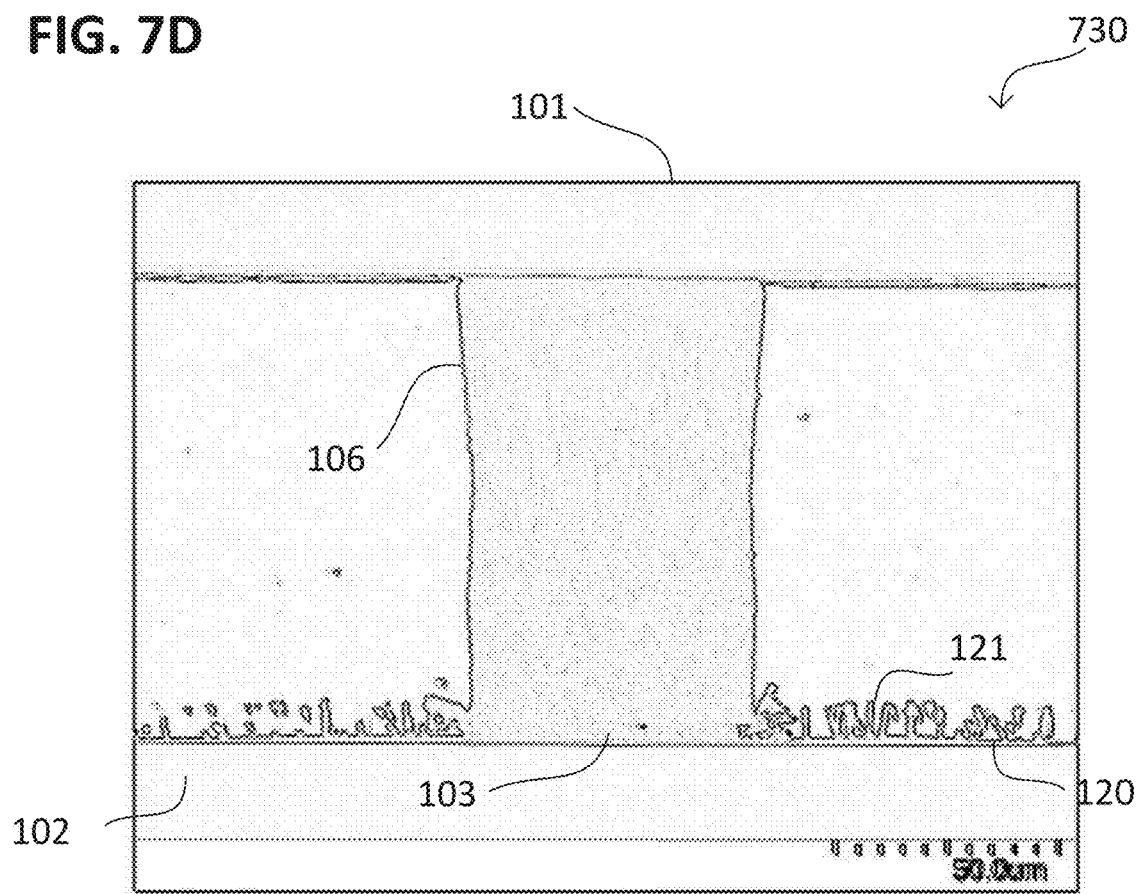

Diagram 730 in FIG. 7D shows in detail a pillar 106 with a metallic interconnection 103 on a distal end of the pillar 106 that mechanically and electrically connects first structure 101 to second structure 102. Pillar 106 may define a gap between first structure 101 and second structure 102, e.g., a pitch between stacked semiconductor devices and/or components. The porosity of the porous region 103-1 may have a lower porosity than in other applications, e.g., the porosity of porous region 103-1 may be less than 10 percent, e.g., or even less than 5 percent, as any stress between first structure 101 and second structure 102 may be shared over the one or pillars, i.e., the stress that may be transmitted over a single pillar is less than that of a larger surface area contact, so that the porosity of the metallic interconnection 103 on the one or more pillars may be less than that of a metallic interconnection 103 over a larger surface area.

Figure 8A:
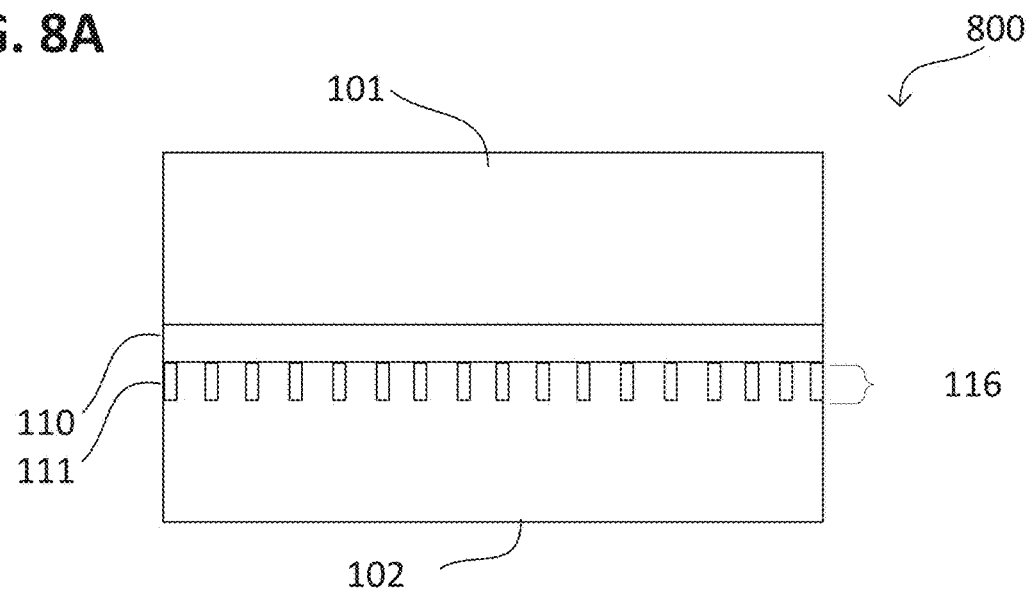
FIGS. 8A and 8B show semiconductor arrangements.

Diagram 800 in FIG. 8A shows a mechanical interconnection 116. First structure 101, which may be a semiconductor device 101, may include a first metallic layer 110 with first microstructures 110 protruding from the first metallic layer 110. Second structure 102, which may be a substrate 102, may be formed over the first metallic layer 110 so that a mechanical connection 116 is formed in which the first microstructures 111 penetrate into the second structure 102 with a topographically varied surface area that may be configured to mechanically fix the first structure 101 to the second structure 102. The first microstructures 111 may form the topographically varied surface on the first metallic layer 110, which, due to the contacted structure of the two materials may provide a strong mechanical connection that is less prone to come apart, e.g., delamination.

Figure 8B:
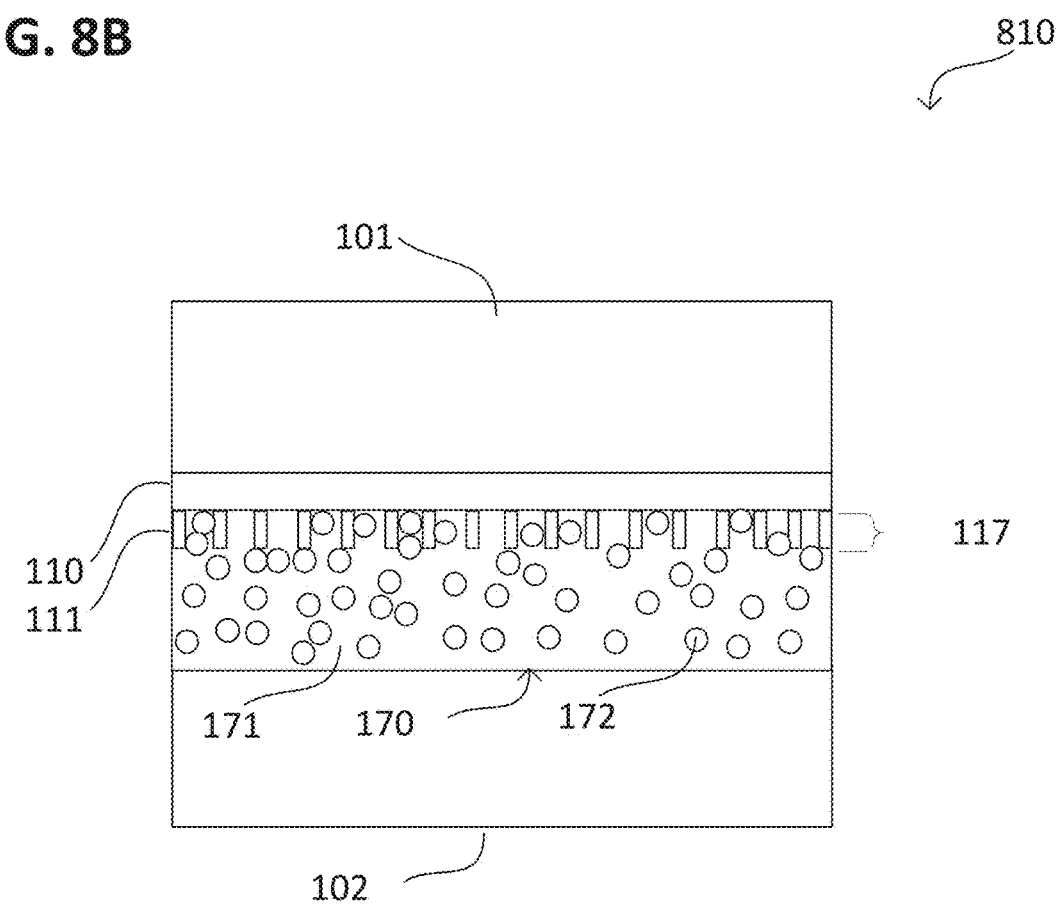

In a similar fashion, diagram 810 in FIG. 8B shows a first structure 101, which may be a semiconductor device 101, including a first metallic layer 110 having first microstructures 111 protruding from the first metallic layer 110. Between the second structure 102, which may be a substrate 102, may be a thermal interface material 170 that may be configured to transfer heat from the first structure 101 to the second structure 102. First microstructures 111 may reduce thermal contact resistance by increasing physical contact with thermal interface material 170. For example, first microstructures 111 may be able to adapt to a surface having a relatively high surface-roughness as the first microstructures 111 may be compressible so that they deform and adapt to the varied surface of the thermal interface material 170, or any other surface to which the first microstructures 111 may be applied.

Thermal interface material 170 may include a polymer matrix 171 and thermally conductive particles 172. For example, polymer matrix 171 may be formed from an inert and thermally stable polymer material, e.g., silicone. Thermally conductive particles 172 may include at least one of the following: a metal, a metallic compound, and/or a thermally conductive ceramic material, for example, boron nitride (BN) and aluminum nitride (AlN).

The thermally conductive particles 172 may have a smaller size than the first microstructures 111 to fit between the first microstructures 111 and form a topographically varied surface area contact 117 between the thermally conductive particles 171 and the first microstructures 111. The height, width, and spacing distance of the first microstructures 111 may be selected so that the thermally conductive particles 172 may fit between them, e.g., to optimize heat transfer. This may also lead to an enlarged surface area in contrast to a surface without first microstructures 111 so that an increased heat-flow may occur over the enlarged surface area. Similar to this aspect of the disclosure, second structure 102 in diagram 800 may be a heat sink or a heat spreader, and the increased surface area may be able to more effectively transfer heat to the second structure 102.

Method 900 in FIG. 9 may include: in 910, forming a first metallic layer 110 including first microstructures 111 protruding from the first metallic layer 110 on a semiconductor device 101; and, in 920, forming a substrate 102 over the first metallic layer 110, wherein the first microstructures 111 penetrate into the substrate 102 with a topographically varied surface area contact 116 configured to mechanically fix the semiconductor device 101 to the substrate 102.

Method 1000 in FIG. 10 may include: in 1010, forming a first metallic layer 110 including first microstructures 111 protruding from the first metallic layer 110 on a semiconductor device 101; in 1020, depositing a thermal interface material 170 including a polymer matrix 171 and thermally conductive particles 172 on the first metallic layer 110, wherein the thermally conductive particles 172 have a smaller size than the first microstructures 111 and fit between the first microstructures 111 to form a topographically varied surface area contact 117 between the thermally conductive particles 172 and the first microstructures 111; and, in 1030, arranging the semiconductor device 101 with the thermal interface material 170 on a substrate 172, wherein the thermal interface material 172 is configured to transfer heat from the semiconductor device 101 to the substrate 102.

Method 1100 in FIG. 11 may include: in 1110, depositing a thermal interface material 170 including a polymer matrix 171 and thermally conductive particles 172 on a substrate 102; in 1120, forming a first metallic layer 110 including first microstructures 111 protruding from the first metallic layer 110 on a semiconductor device 101; and, in 1130, arranging the first microstructures 111 of the semiconductor device 101 on the thermal interface material 170, wherein the thermally conductive particles 172 have a smaller size than the first microstructures 111 and fit between the first microstructures 111 to form a topographically varied surface area contact 117 between the thermally conductive particles 172 and the first microstructures 111 and wherein the thermal interface material 172 is configured to transfer heat from the semiconductor device 101 to the substrate 102.

Figure 12A:
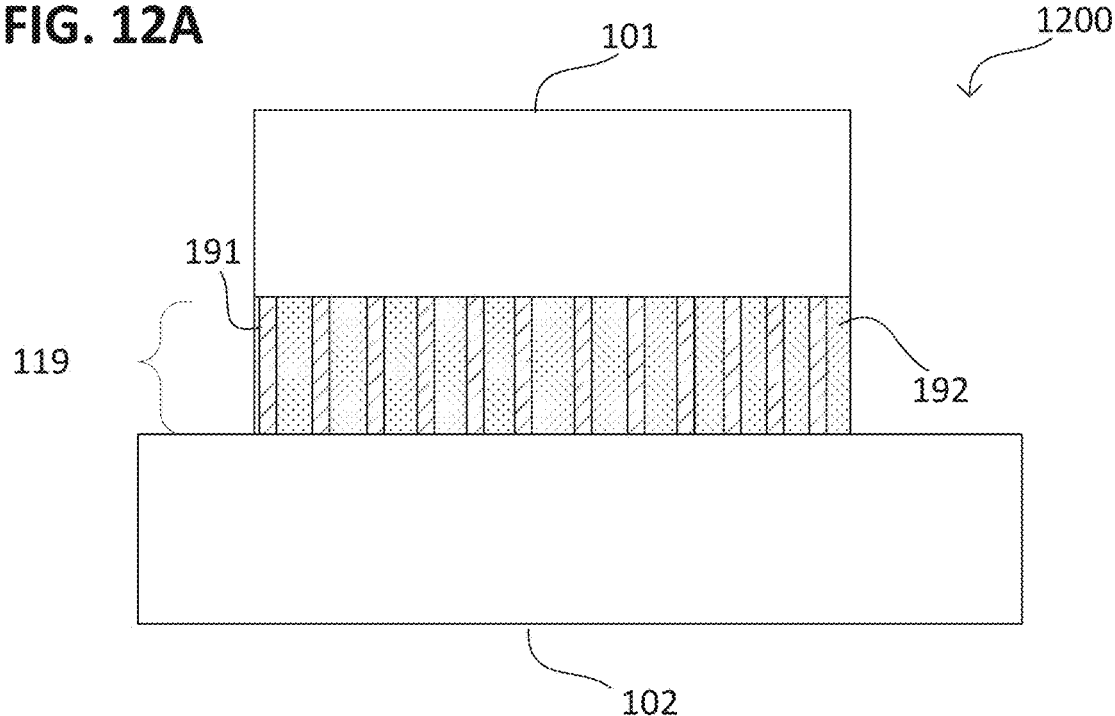

In another aspect of the disclosure, diagram 1200 in FIG. 12A shows a semiconductor arrangement. Second structure 102 may be a substrate and first structure 101 may be a semiconductor device. Between first structure 101 and second structure 102 may be a composite layer 119 including non-metallic material 192, which may be a porous polymer material 192 having voids throughout with metallic structures 191 penetrating through the porous polymer material 192. The metallic structures 192 may form an electrically conductive connection between the second structure 102 and the first structure 101 and may be configured to decouple stress between the first structure 101 and the second structure 102.

A connection formed between lead frames, e.g., a substrate, and silicon, e.g., the material of a semiconductor device, may be formed under high temperatures, e.g., temperatures greater than 200° C. CTE mismatch of these partners may lead to a relatively high stress-level between the partners after cooling. Such stress may change electrical properties of the semiconductor as well as mechanical failure, especially during stress tests.

The composite layer 119, e.g., a hybrid polymer-metal layer, on a semiconductor device, e.g., a chip back-side, may be beneficial as an elastic connection layer that also has thermal and electrical conductivity. Thus, composite layer 119 may function as: a buffer-layer between a substrate, e.g., a chip carrier, and a semiconductor device, e.g., chips, which may be from a singulated wafer; and a die-attach layer for the substrate, e.g., in the form of a foil on a chip carrier, to which the porous polymer material 192 may be melted onto forming a form-fitting connection, potentially along with additional metallization layers.

The voids of the porous polymer material 192 may substantially be filled by the metallic structures 191 through a galvanic process, and may also be formed by stamping porous polymer material 192 onto metallic structures 191. Porous polymer material 192 may be a polymer-foam. Porous polymer material 192 may have a glass transition point and/or a melting point above 260° C. Porous polymer material 192 may be selected from a group consisting of polyimide, poly-ether-ketone, polyamide-imide, polyethersulfone, polysulfone, polystyrene, liquid-crystal polymer, and any combination thereof. The porous polymer material 192 (and thus composite layer 119) may have a thickness between 1 μm and 100 μm, between 1 μm and 50 μm, or between 10 μm and 15 μm. In addition, pre-fabricated polymer structures from thermoset materials, such as epoxy-resin, acrylic resin, etc., may be used. Epoxy-resins may be beneficial as it may be electrolessly galvanizable.

A conductive adhesive material may connect composite layer 119 to second structure 102. The conductive adhesive material may complete an electrically conductive connection with the composite layer 119 between the first structure 101 and the second structure 102.

Figure 12B:
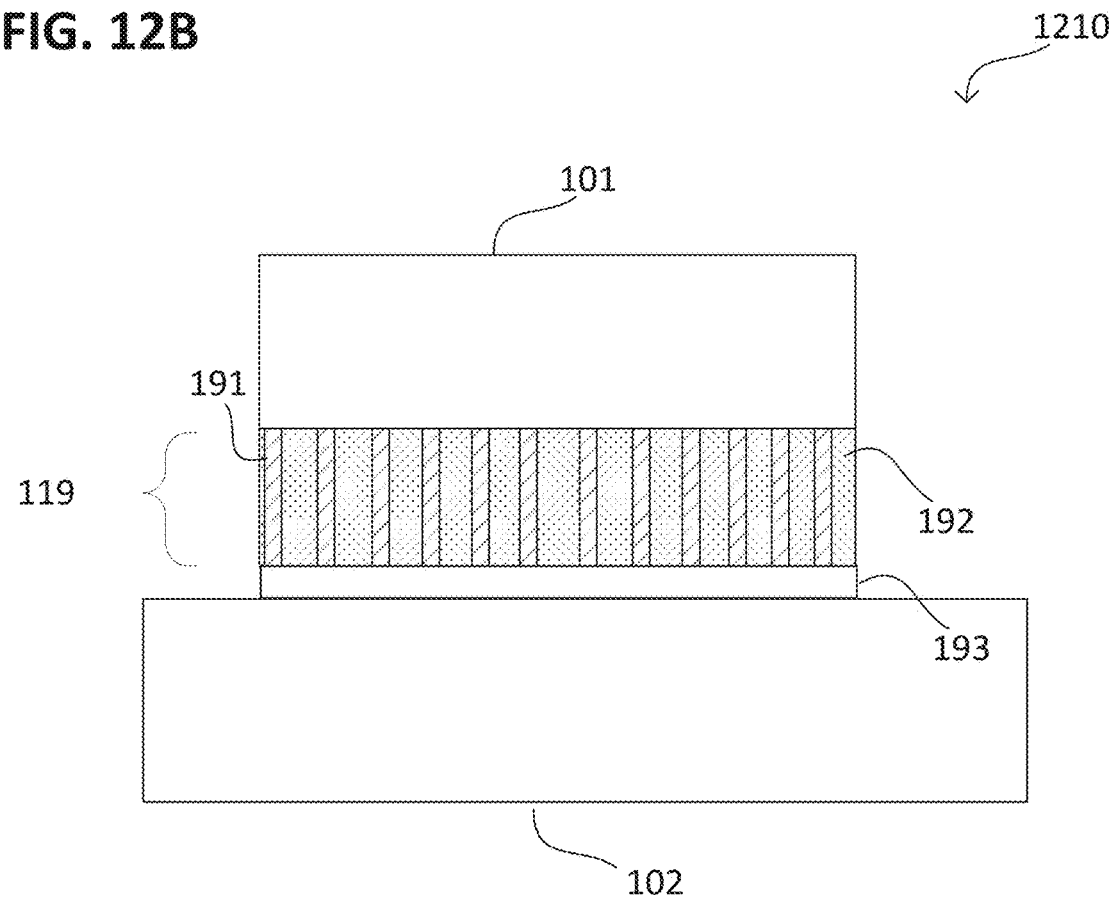

As may be shown in diagram 1210 in FIG. 12B, on the distal ends of metallic structures 191 may be a metallic layer 193 that is between composite layer 119 and second structure 102. A metal of metallic structures 191 may be the same metal as that of metallic layer 193. A solder material may connect metallic layer 193 to second structure 102.

Diagram 1220 in FIG. 12C shows a semiconductor arrangement. Metallic structures 191 may be first microstructures 111, a portion of which may form metallic interconnection 103. In addition to porous region 103-1, composite layer 119 may be configured to decouple stress between first structure 101 and second structure 102. Accordingly, in this aspect, the porosity of porous layer 103-1 may be selected to be less than if composite layer 119 were not part of the arrangement.

Figure 13:
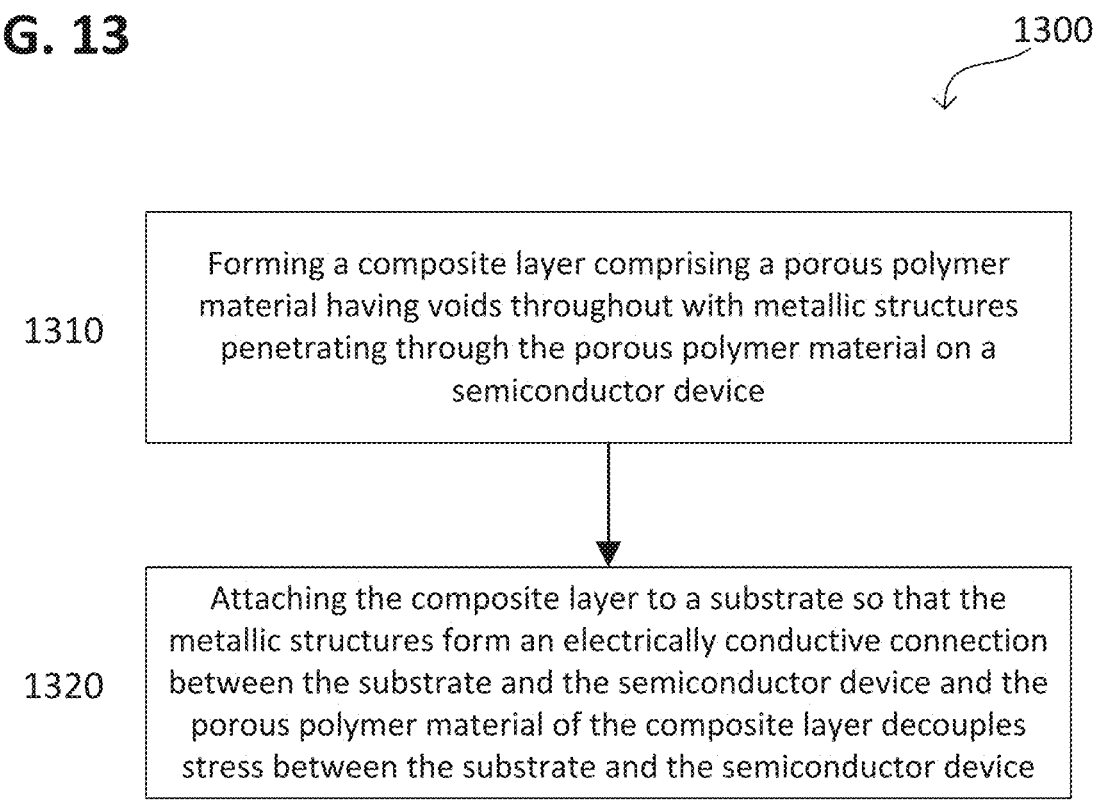
FIG. 13 shows a method of manufacturing a semiconductor arrangement.

Method 1300 in FIG. 13 may include: in 1310, forming a composite layer 119 including a porous polymer material 192 having voids throughout with metallic structures 191 penetrating through the porous polymer material 192 on a semiconductor device 101; and attaching the composite layer 119 to a substrate 102 so that the metallic structures 191 form an electrically conductive connection between the substrate 102 and the semiconductor device 101 and the porous polymer material 192 of the composite layer 119 decouples stress between the substrate 102 and the semiconductor device 101.

Porous polymer material 192 including voids may be formed on the semiconductor device 101. The voids of the porous polymer material 192 may be filled with the metallic structures 191 that penetrate through the porous polymer material 192 to form the composite layer 119. If porous polymer material 192 is a directly galvanizable material, a seed layer may first be formed electrolessly thereon, which, through electro-galvanization, the desired layer thickness may be deposited onto. By filling the voids only partially, composite layer 119 may have a higher elasticity than if the voids were completely filled.

Alternatively, metallic structures 191, which may be needle-shaped, may be formed on semiconductor device 101. Porous polymer material 192 having voids may be deposited between the metallic structures 191 to form composite layer 119, e.g., as a nano-needle-sponge.

First structure 101 may be singulated into individual first structures 101-1, 101-2, and 101-3, after forming composite layer 119. In addition, method 1300 may include forming a metallic layer 193 over composite layer 119. Metallic layer 193 may be solderable, e.g., silver-tin, copper-tin, and/or gold-tin, while metallic structures 191 may be formed from a different material that is less solderable, e.g., a metal, such as copper. Metallic layer 193 may be soldered to substrate 102 to connect semiconductor device 101 to substrate 102. Additionally or alternatively, composite layer 119 may be adhered with a conductive adhesive material to substrate 102 to attach semiconductor device 101.

Figure 14A:
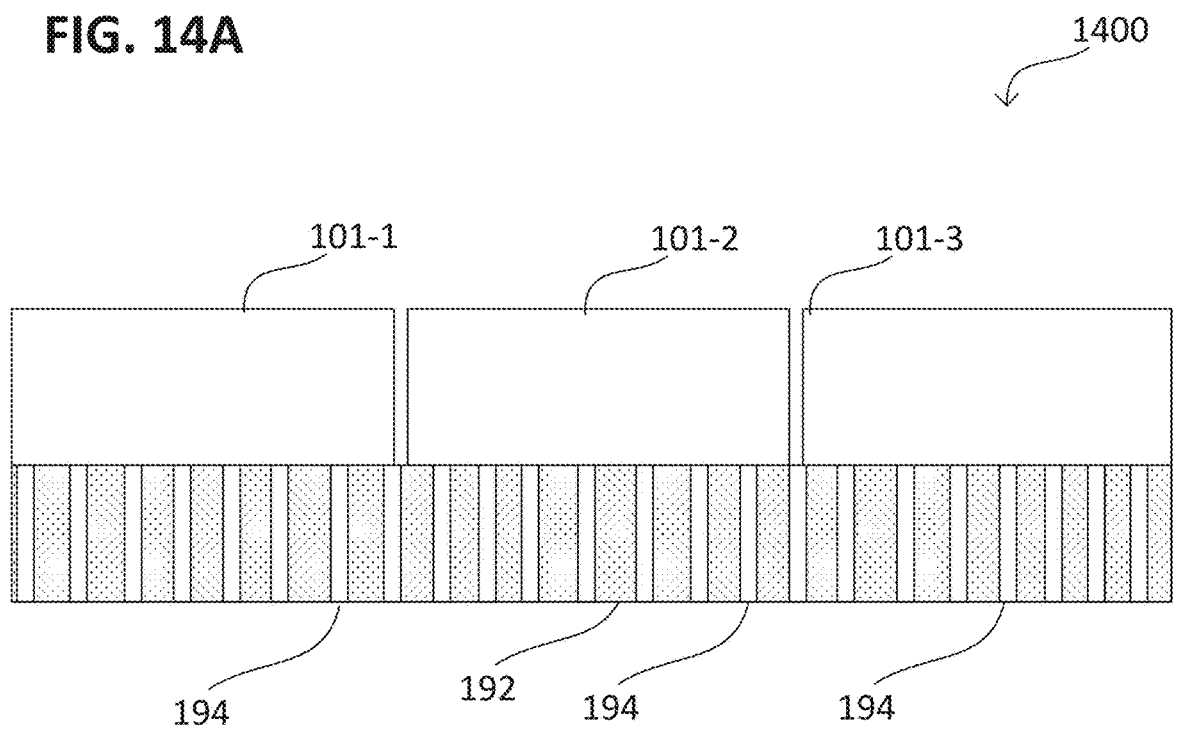
FIGS. 14A-14G show manufacturing a semiconductor arrangement.
Figure 14B:
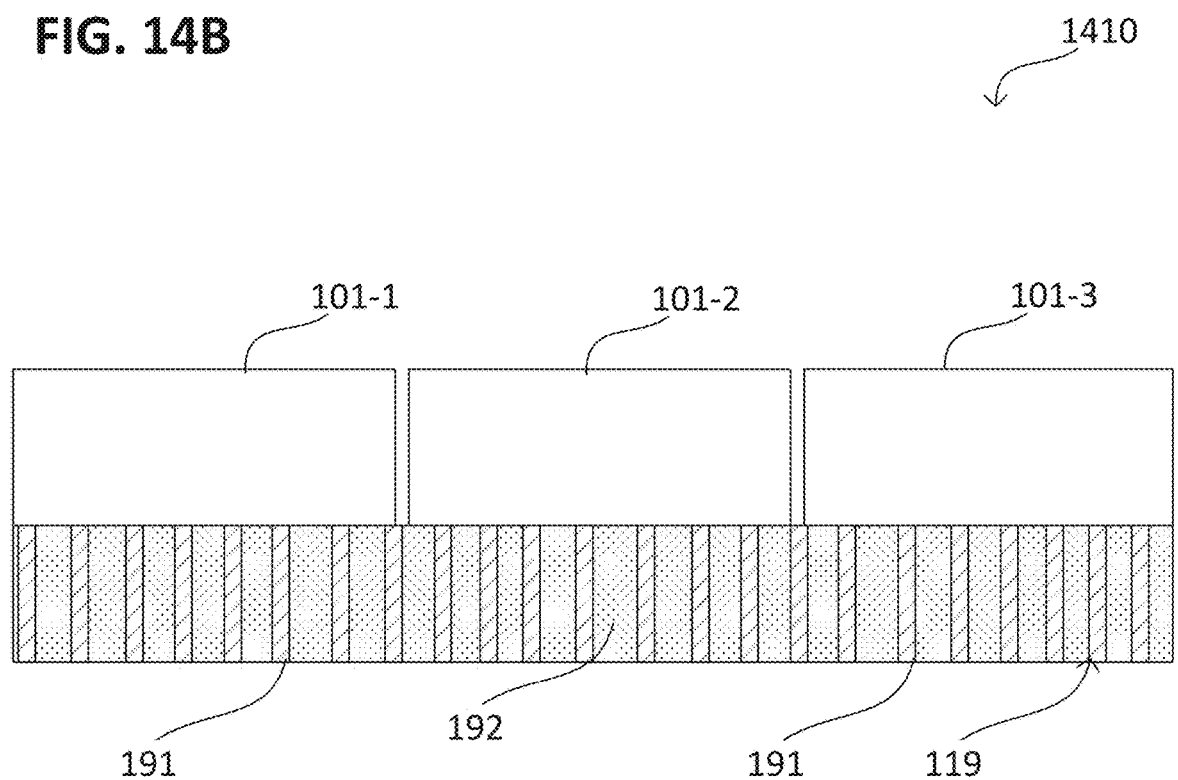

Diagram 1400 in FIG. 14A shows forming composite layer 119. Porous polymer material 192 having voids, which may be indicated as voids 194, may be formed on a first structure 101, which may be one or more semiconductor devices 101-1, 102-2, and 102-3 (although three semiconductor devices are shown here, the number of semiconductor devices is not limited thereto), which may be one or more semiconductor devices 101. One or more voids 194 may be interconnected so that an uninterrupted pathway may be formed from one side of porous polymer material 192 to an opposite side of porous polymer material 192. As may be shown in diagram 1410 in FIG. 14B, this pathway may be filled with a metal by a deposition process to form metal structures 191 that penetrate through the porous polymer material 192, thus forming composite layer 119.

Figure 14C:
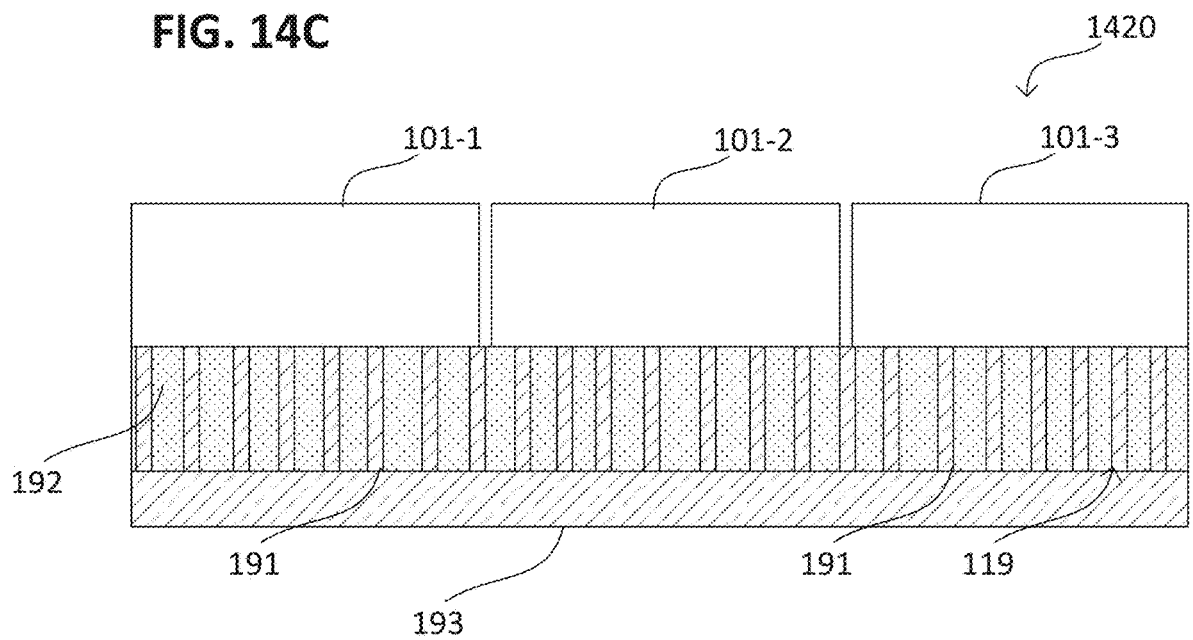
Figure 14D:
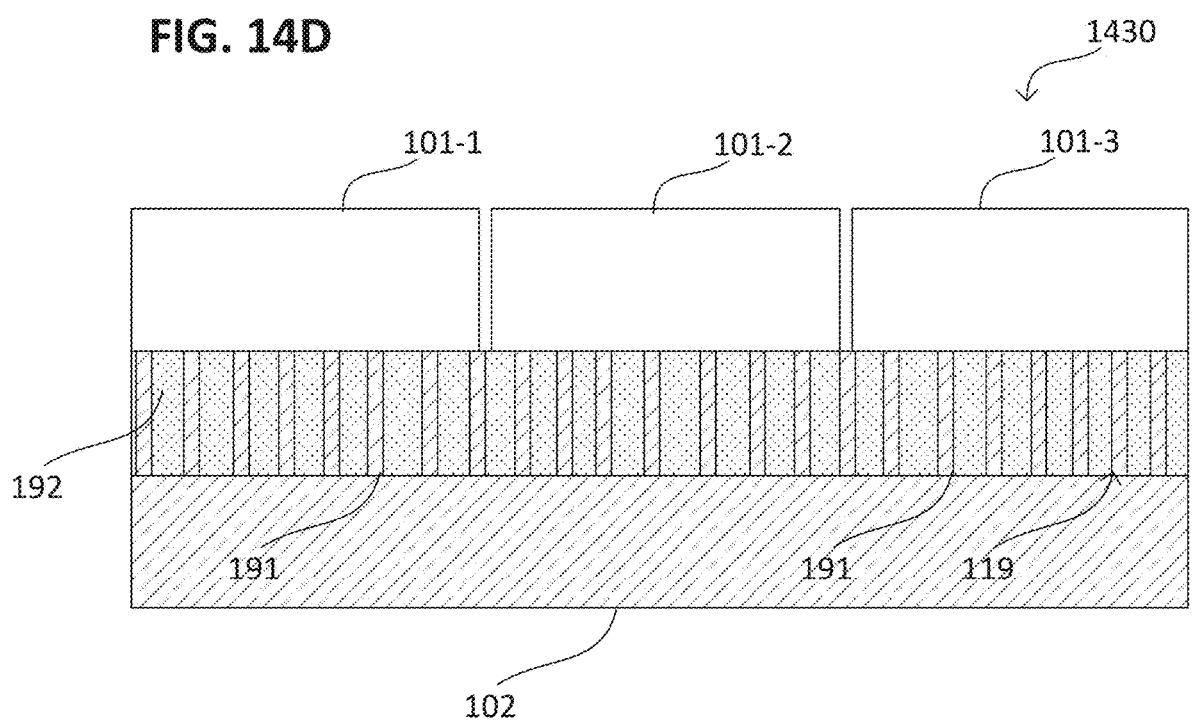

In addition, to form metallic layer 193 on composite layer 119 e.g. as shown in diagram 1420 of FIG. 14C, the deposition process of filling voids 194 to form metallic structures 191 may be continued to form the metallic layer 193 or a separate deposition process may be used. Furthermore, substrate 102 may be directly formed on composite layer 119 by continuing the same process as filling voids 194 to form substrate 102 e.g. as shown in diagram 1430 of FIG. 14D, which may be thicker than metallic layer 193, or a separate deposition process may be used to form substrate 102 on composite layer 119 in addition to forming metallic structures 191. This may avoid having to adhere a separate substrate 102 to first structure 101.

Figure 14E:
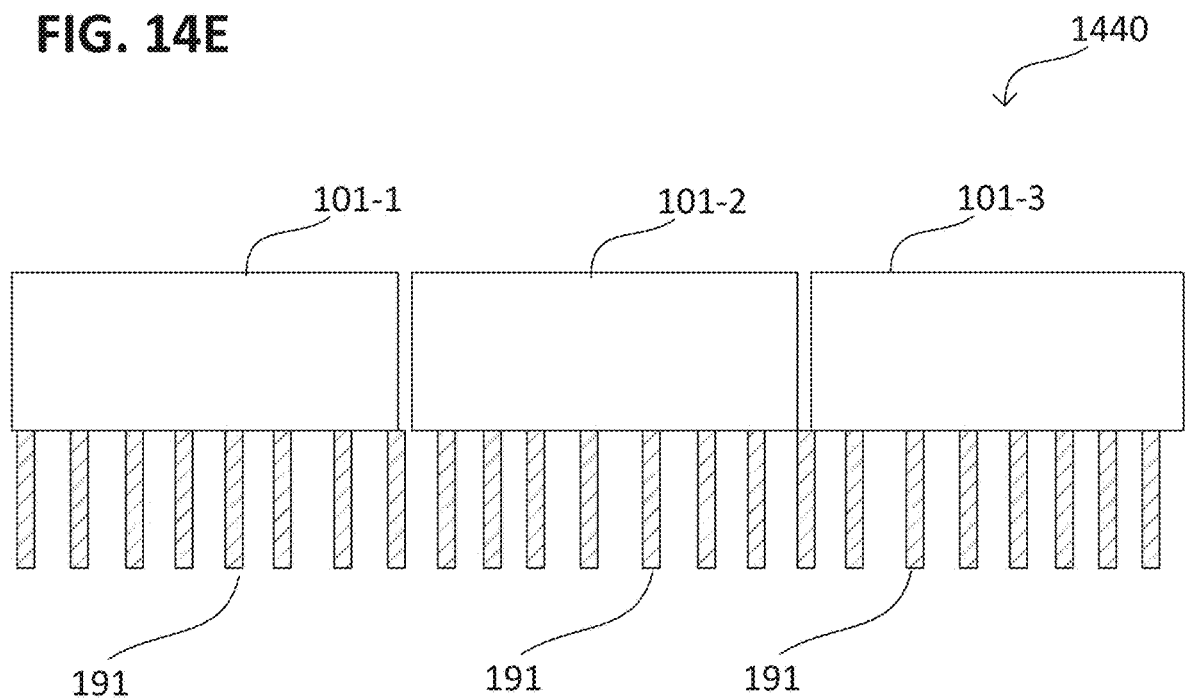
Figure 14F:
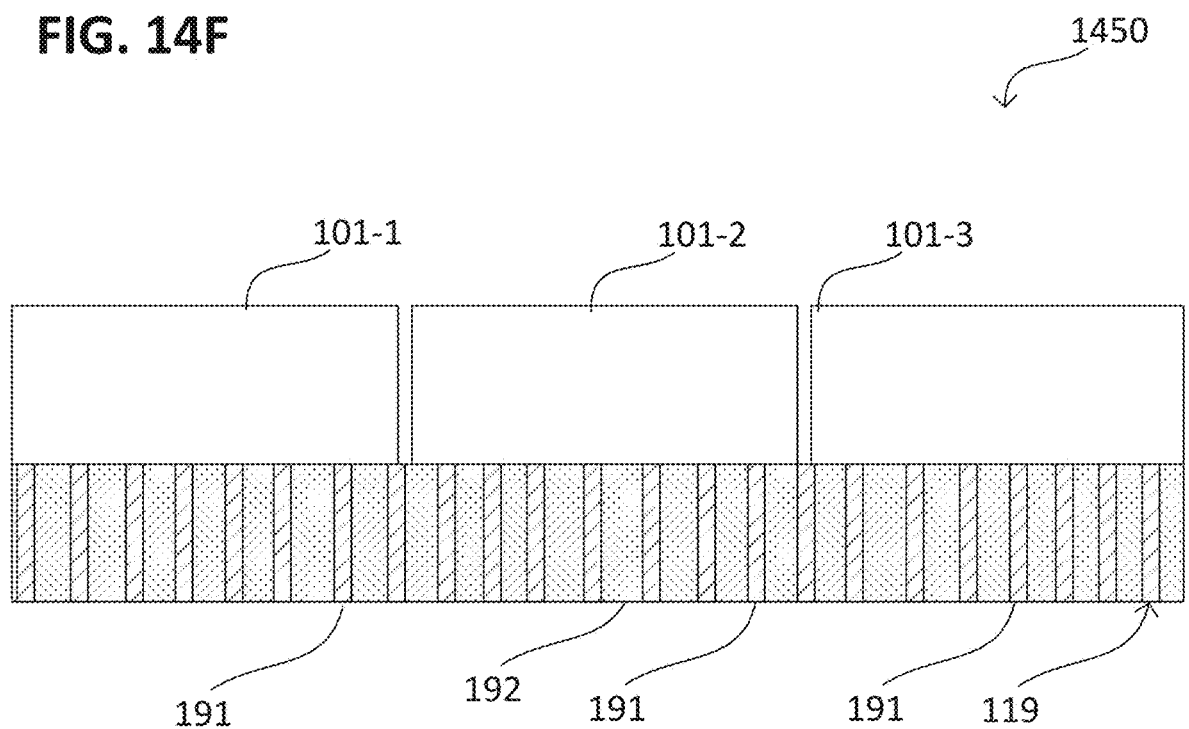

In alternative to the above, diagram 1440 in FIG. 14E shows first forming metallic structures 191, which may be first microstructures 111, and accordingly, may be formed as described above, on first structure 101. A porous polymer material may be filled between the metallic structures 191 to form composite layer 119, as may be shown in diagram 1450 in FIG. 14F. The height of the porous polymer material 192 may be substantially equal to a full length of metallic structures 191 to the extent that metallic structures 191 penetrate through porous polymer material 192, i.e., through two opposing sides of porous polymer material 192.

Figure 14G:
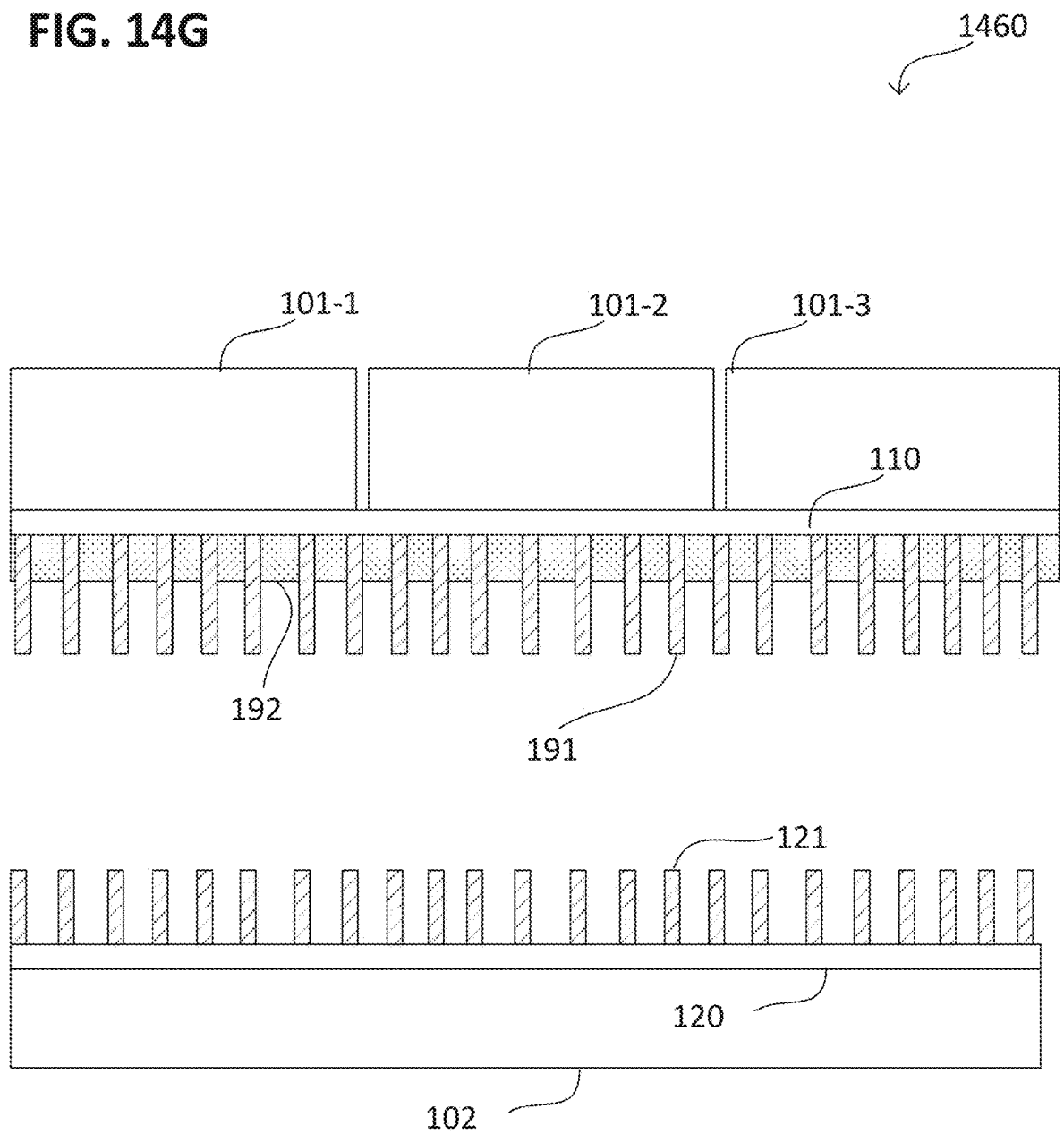

Alternatively, a first metallic layer 110 may be formed on one or more first structures 101, as well as metallic structures 191, which may be first microstructures 111 as may be shown in diagram 1460 in FIG. 14G. Porous polymer material 192 may not fill between the metallic structures 191 to a height less than a full length of the metallic structures 191 forming a composite layer 119 of the porous polymer material 192 with the metallic structures 191 extending through the porous polymer material 192 so that a portion of the metallic structures 191 protrude from the porous polymer material 192. The portion of the metallic structures 191 protruding from the porous polymer material 192 may be between 5-60 µm. The composite layer 119 of the porous polymer material 192 and the metallic structures 191 may be configured to decouple stress between the first structure 101 and the second structure 102. The portion of the metallic structures 191 protruding from composite layer 191 may interlock with second microstructures 121 on second metallic layer 120 of second structure 102, as described above to from a metallic interconnection 103.

Figure 15A:
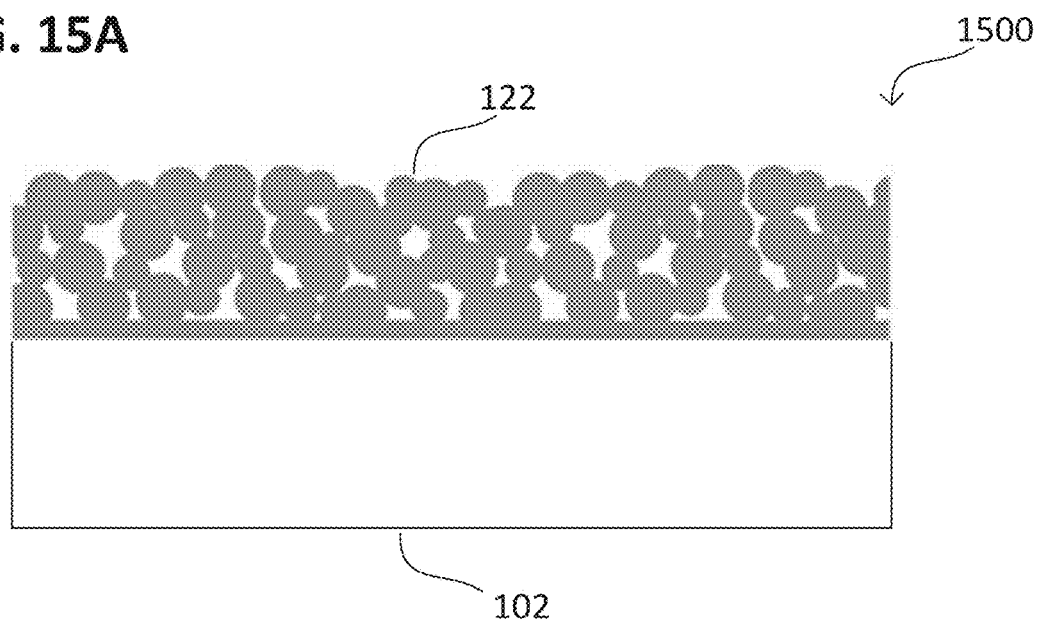
FIGS. 15A-15C show semiconductor arrangements.

Diagram 1500 in FIG. 15A shows second structure 102 with second porous metallic layer 122. Second porous metallic layer 122 may be formed on second structure 102. For example, second porous metallic layer 122 may be a paste that is printed on second structure 102. The paste may then be dried to remove any solvents from the paste leaving behind a porous pure metal or metal alloy structure. The dried paste may then be annealed. Second porous metallic layer 122 may have larger pores than porous region 103-1, i.e., the pores formed during the formation of second porous metallic layer 122 may be larger than the spaces between the contacted first microstructures 111 and the second microstructures 121.

Figure 15B:
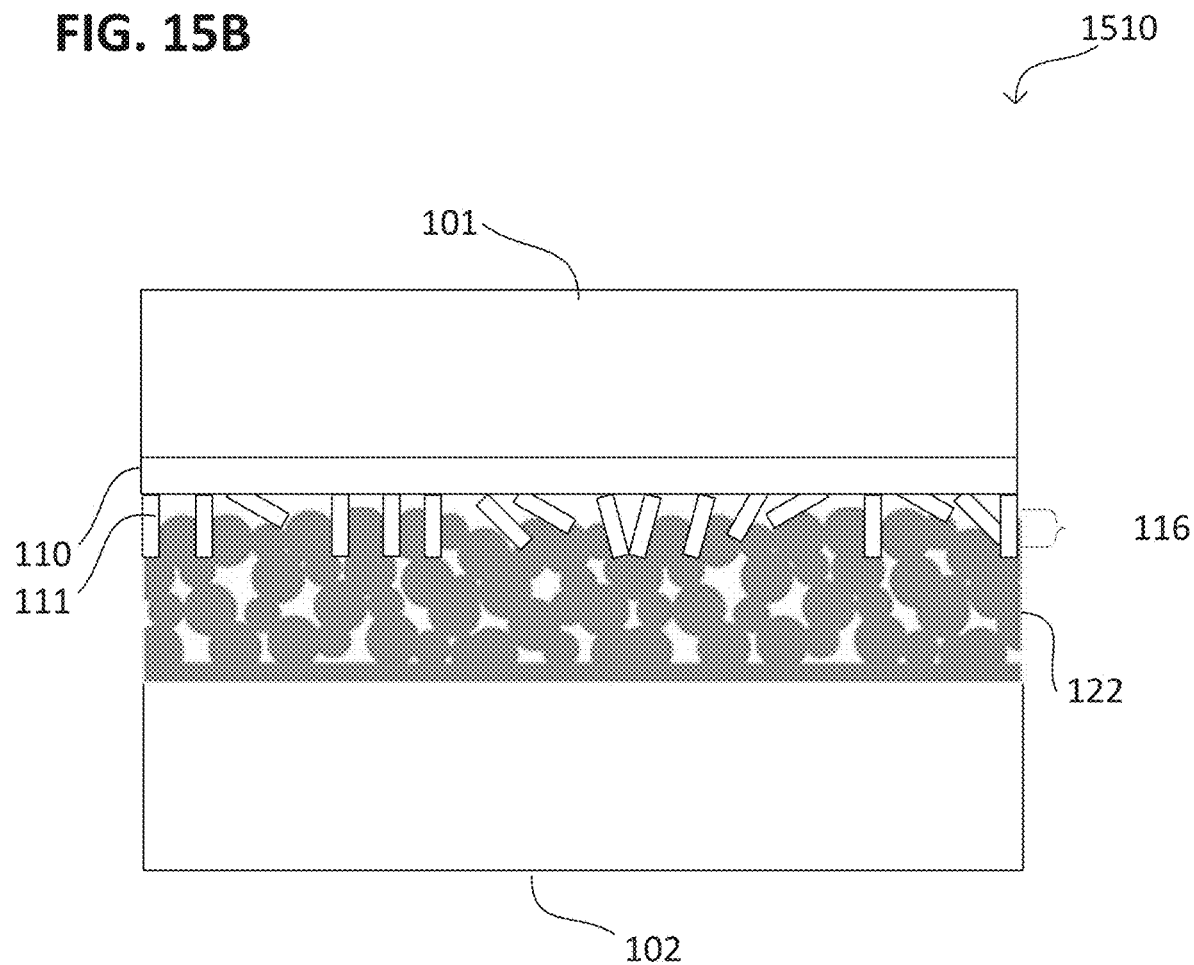

For example, as shown in diagram 1510 of FIG. 15B, when first microstructures 111 are brought into contact with second porous metallic layer 122, the pores of second porous metallic layer 122 may be large enough for one or more wires of first microstructure 111 to pass into the pore and form a mechanical connection, e.g., a pore may be measured to have a diameter or chord with a length of 20 µm to 50 µm.

Similar to the methods described above, first metallic layer 110 and second porous metallic layer 122 may have one or more non-metallic compounds removed by a reducing agent that penetrates the mechanical connection and reacts with the one or more non-metallic compounds. The first metallic layer 110 and the second porous metallic layer 122 may be heated at a temperature causing interdiffusion of the first metallic layer 110 and the second metallic layer 120 to form a metallic interconnection 130 between the first structure 101 and the second structure 102.

Figure 15C:
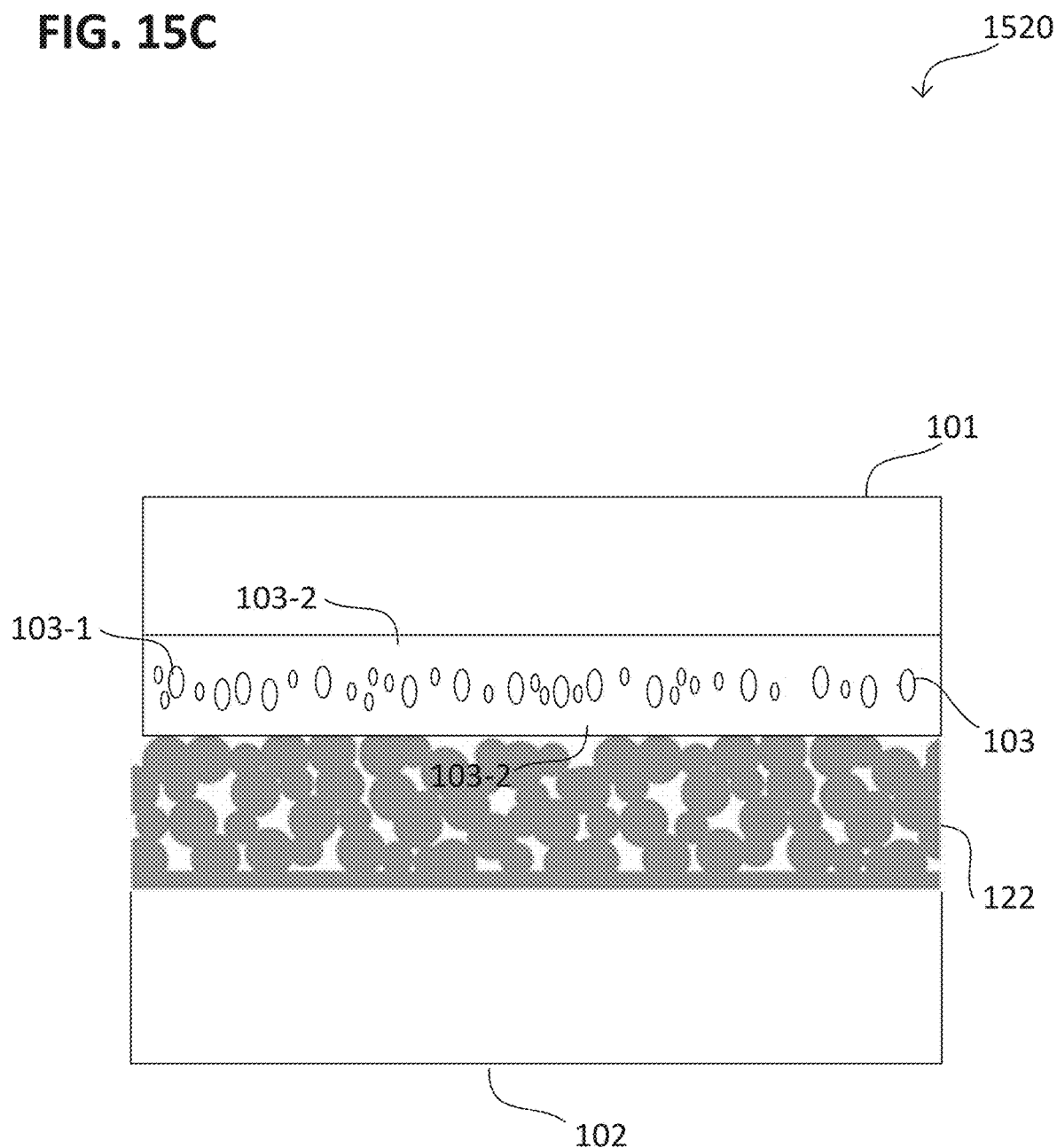

The metallic interconnection 130 including the second porous metallic layer 122 may thus also have an adjacent region 130-2 having a lower porosity than that of the porous region 130-1, while second porous metallic layer 122 may have yet a higher porosity, as shown in diagram 1520 of FIG. 15C. Furthermore, porous region 130-1 may be defined by gaps or voids between deformed microstructures, while the pores of second porous metallic layer 122 may be defined by pores left behind from the drying of a paste, e.g., globular or having rounded features, but not necessarily spherical voids.

In an aspect of the disclosure, first structure 102 may be a power semiconductor device or any other semiconductor device that may generate heat that may negatively affect the performance and operation of the semiconductor device. Second structure 102 may be a heat sink configured to dissipate the heat generated by the semiconductor device. Heat dissipation in power semiconductor devices is important for the safe operation and reliability of the devices, particularly in safety sensitive applications, such as in the automobile and power industries, as well as applications for industries where maintenance may be expensive, such as wind power applications. In such instances, a metallic interconnect 103 is also beneficial as the thermal conductivity of a pure metal or metal alloy interconnect is much greater than a soldered connection or an attachment using a thermal interface material. For example, solder may general have a thermal conductivity around 65 W/m·K, while a copper metallic interconnect 103 may have a thermal conductivity around 365 W/m·K. Beyond the mechanical advantages of the metallic interconnection 103, discussed above, metallic interconnection 103 may have beneficial heat transfer properties over conventional interconnection techniques.

Figure 16A:
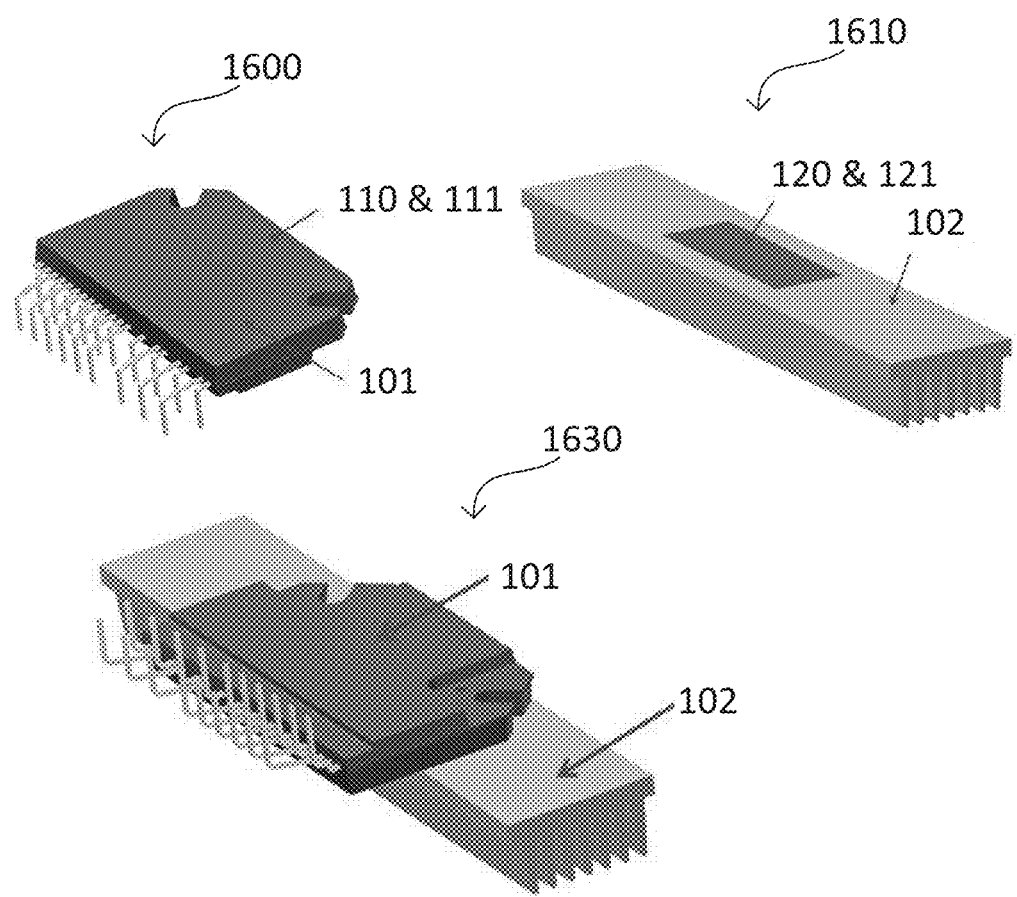
FIGS. 16A and 16B show power semiconductor arrangements.

As shown in diagram 1600 of FIG. 16A, first structure 101 may be a power semiconductor device, e.g., as here, in a packaged module. A first metallic layer 110 having first microstructures 111 protruding from the first metallic layer 110 may be deposited on a part or all of first structure 101, which may be a power semiconductor device. First metallic layer 110 may also be integral to the module of the power semiconductor device with the first microstructures 111 formed onto the first metallic layer 110.

Similarly, as shown in diagram 1610, second metallic layer 120 having second microstructures 121 protruding from the second metallic layer 120 may be deposited on a part or all of second structure 102, which may be a heat sink. Second metallic layer 120 may also be integral to the heat sink with the second microstructures 121 formed onto the second metallic layer 110, e.g., here, second metallic layer 120 may be considered a surface of the heat sink.

As shown in diagram 1630, and as discussed above for example in methods 300 and/or 400, first structure 101 may be arranged on second structure 102 (or vice versa) and contacted to form an initial, permeable mechanical connection. The contacted first microstructures 111 and second microstructures 121 may be exposed to a reducing agent that penetrates the mechanical connection to remove one or more non-metallic compounds. The first metallic layer 101 and the second metallic layer 102 may then be heated at a temperature causing interdiffusion of the first metallic layer 110 and the second metallic layer 120 to form the metallic interconnection 103 between the first structure 101 and the second structure 102. In addition, one or more organic materials on the first metallic layer 110 and/or the second metallic layer 120 may be removed, e.g., by decomposition, at the temperature. Therefore, the arrangement shown in diagram 1630 of a power semiconductor device attached to a heat sink with metallic interconnection 103 may have beneficial thermal transfer properties in comparison to other interconnection techniques.

Figure 16B:
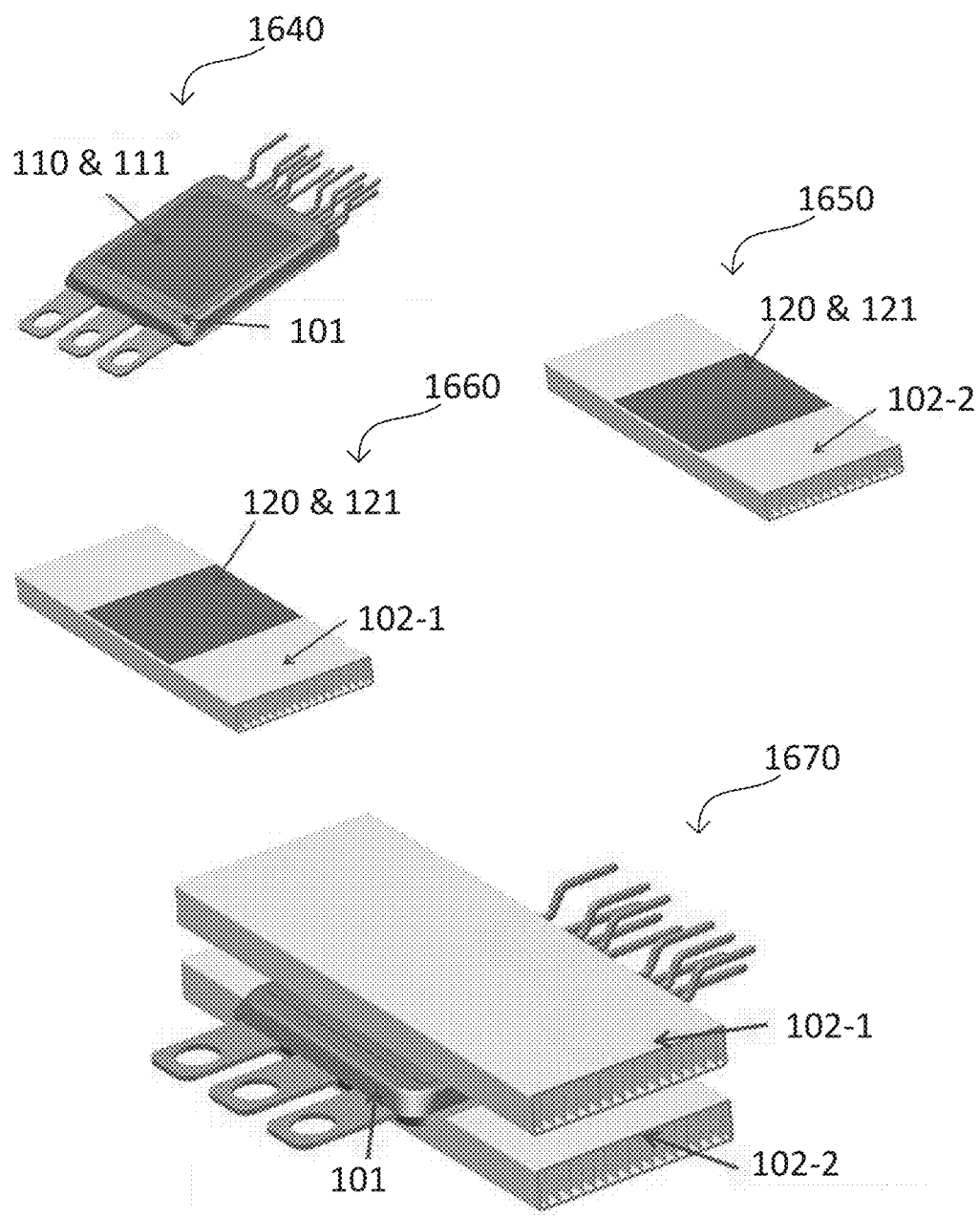

In another aspect of the disclosure, FIG. 16B may also show first structure 101 as a power semiconductor device and second structure 102 as a heat sink, these arrangements may be substantially similar or the same to the arrangements shown in FIG. 16A. Diagram 1640 shows the first structure 101, e.g., a power semiconductor device 101, including a first metallic layer 110 having first microstructures 111 protruding from the first metallic layer 110. The first metallic layer 110 and the first microstructures 111 may partially or completely cover the power semiconductor device, e.g., the entire module. In diagrams 1650 and 1660 are two heat sinks, second structure 102-1 and second structure 102-2, each of which may include a second metallic layer 120 having second microstructures 121 protruding from the second metallic layer 120. The second metallic layer 120 and second microstructures 121 may partially or completely cover second structures 102-1 and 102-2. The arrangement shown in diagram 1670 differs from those of FIG. 16A in that the power module may have one or more heat sinks attached to the power semiconductor device via one or more metallic interconnections 103. For example, here, the power semiconductor device has heat sinks, e.g., second structures 102-1 and 102-2 on opposing sides of the first structure 101.

Example aspects of the above disclosure may be listed below.

Example 1 may be a method of forming a metallic interconnection between a first structure and a second structure, the method including: providing the first structure including a first metallic layer having first microstructures protruding from the first metallic layer; providing the second structure including a second metallic layer having second microstructures protruding from the second metallic layer; contacting the first microstructures and the second microstructures to form a mechanical connection between the first structure and the second structure, wherein the mechanical connection is configured to allow fluid to penetrate the mechanical connection; removing one or more non-metallic compounds on the first metallic layer and the second metallic layer with a reducing agent that penetrates the mechanical connection and reacts with the one or more non-metallic compounds; and heating the first metallic layer and the second metallic layer at a temperature causing interdiffusion of the first metallic layer and the second metallic layer to form the metallic interconnection between the first structure and the second structure.

Example 2 may include the method according to Example 1, wherein the one or more non-metallic compounds are barriers to interdiffusion of the first metallic layer and/or the second metallic layer.

Example 3 may include the method according to any one of Examples 1 and 2, wherein the first microstructures have a greater length than width.

Example 4 may include the method according to any one of Examples 1-3, wherein the first microstructures are microwires.

Example 5 may include the method according to any one of Examples 1-4, wherein the second microstructures have a greater length than width.

Example 6 may include the method according to any one of Examples 1-5, wherein the second microstructures are microwires.

Example 7 may include the method according to any one of Examples 1-6, wherein the length of respective microstructures is between 5-60 μm and the width of respective microstructures is between 100 nm and 2 μm.

Example 8 may include the method according to any one of Examples 1-7, wherein the reducing agent includes hydrogen.

Example 9 may include the method according to any one of Examples 1-8, wherein the reducing agent includes a mixture of gaseous hydrogen and gaseous nitrogen.

Example 10 may include the method according to Example 9, wherein a portion of the gaseous hydrogen is 0.1-10 percent.

Example 11 may include the method according to any one of Examples 1-10, wherein the reducing agent includes formic acid.

Example 12 may include the method according to any one of Examples 1-8, wherein the reducing agent is a plasma.

Example 13 may include the method according to any one of Examples 1-12, wherein the reducing agent decomposes at the temperature to include radical hydrogen.

Example 14 may include the method according to any one of Examples 1-13, wherein the heating occurs free from applied mechanical load on the first metallic layer and the second metallic layer.

Example 15 may include the method according to any one of Examples 1-14, wherein the metallic interconnection has a higher porosity than the first metallic layer and the second metallic layer.

Example 16 may include the method according to Example 15, wherein the higher porosity is configured to decouple stress between the first structure and the second structure.

Example 17 may include the method according to any one of Examples 1-16, wherein the mechanical connection has a first porosity and the metallic interconnection has a second porosity less than the first porosity.

Example 18 may include the method according to any one of Examples 1-17, wherein a metal of the first metallic layer and a metal of the second metallic layer are the same.

Example 19 may include the method according to Example 18, wherein the metal of the first metallic layer and the metal of the second metallic layer is copper.

Example 20 may include the method according to any one of Examples 18 and 19, wherein the metallic interconnection consists essentially of a substantially pure metal.

Example 21 may include the method according to any one of Examples 1-17, wherein the metallic interconnection consists essentially of a metal alloy between the first metallic layer and the second metallic layer, where in the metal alloy consists essentially of a metal of the first metallic layer and a metal of the second metallic layer.

Example 22 may include the method according to any one of Examples 1-21, wherein the temperature is an annealing temperature of a metal of the first metallic layer and/or a metal of the second metallic layer.

Example 23 may include the method according to any one of Examples 1-22, wherein the temperature is below 350° C.

Example 24 may include the method according to any one of Examples 1-23, wherein the temperature is between 180° C. and 250° C.

Example 25 may include the method according to any one of Examples 1-23, wherein the temperature is 100° C.

Example 26 may include the method according to any one of Examples 1-25, wherein removing the one or more non-metallic compounds is performed substantially free of an oxidizing agent of a metal of the first metallic layer and a metal of the second metallic layer.

Example 27 may include the method according to any one of Examples 1-26, wherein the heating is performed while removing the one or more non-metallic compounds.

Example 28 may include the method according to any one of Examples 1-27, wherein the first structure is a semiconductor device.

Example 29 may include the method according to any one of Examples 1-28, wherein the second structure is a substrate.

Example 30 may include the method according to any one of Examples 1-27, wherein the second structure is a microelectromechanical mechanical arrangement.

Example 31 may include the method according to any one of Examples 1-27 and 30, wherein the first structure is a cap that seals in the microelectromechanical arrangement.

Example 32 may include the method according to any one of Examples 1-31, further including: forming the first metallic layer on the first structure.

Example 33 may include the method according to any one of Examples 1-32, forming the first microstructures on the first metallic layer.

Example 34 may include the method according to any one of Examples 1-33, further including: forming the second metallic layer on the second structure.

Example 35 may include the method according to any one of Examples 1-34, forming the second microstructures on the second metallic layer.

Example 36 may include the method according to any one of Examples 1-35, further including: removing byproducts of the reaction between the reducing agent and the one or more non-metallic compounds.

Example 37 may include the method according to Example 36, wherein the byproducts include water and carbon dioxide.

Example 38 may include the method according to any one of Examples 1-37, further including: filling between the first microstructures a non-metallic material to a height less than a full length of the first microstructures forming a composite layer of the non-metallic material with the first microstructures extending through the non-metallic layer so that a portion of the first microstructures protrude from the non-metallic material.

Example 39 may include the method according to any one of Examples 1-37, further including: filling between the second microstructures a non-metallic material to a height less than a full length of the second microstructures forming a composite layer of the non-metallic material with the second microstructures extending through the non-metallic layer so that a portion of the second microstructures protrude from the non-metallic material.

Example 40 may include the method according to any one of Examples 38 and 39, wherein the composite layer of the non-metallic material and the first microstructures or the second microstructures is configured to decouple stress between the first structure and the second structure.

Example 41 may include the method according to any one of Examples 38-40, wherein the non-metallic material is inert to the reducing agent.

Example 42 may be a method of manufacturing a semiconductor arrangement, the method including: forming a first metallic layer on the semiconductor device, wherein the first metallic layer includes first microstructures protruding from the first metallic layer, wherein the first metallic layer and the first microstructures are at least partially covered by a first metal-oxide; providing a substrate including a second metallic layer having second microstructures protruding from the second metallic layer, wherein the second metallic layer and the second protruding structures are at least partially covered by a second metal-oxide; contacting the first microstructures and the second microstructures to form a mechanical connection between the semiconductor device and the substrate, wherein the mechanical connection is configured to allow fluid to penetrate the mechanical connection; removing the first metal-oxide and the second metal-oxide with a reducing agent that penetrates the mechanical connection and reacts with the first metal-oxide and the second metal-oxide; and heating the first metallic layer and the second metallic layer at a temperature causing interdiffusion of the first metallic layer and the second metallic layer to form a metallic interconnection between the semiconductor device and the substrate.

Example 43 may include the method according to Example 42, wherein the first microstructures have a greater length than width.

Example 44 may include the method according to any one of Examples 42 and 43, wherein the first microstructures are microwires.

Example 45 may include the method according to any one of Examples 42-44, wherein the second microstructures have a greater length than width.

Example 46 may include the method according to any one of Examples 42-45, wherein the second microstructures are microwires.

Example 47 may include the method according to any one of Examples 42-46, wherein the length of respective microstructures is between 5-60 µm and the width of respective microstructures is between 100 nm and 2 µm.

Example 48 may include the method according to any one of Examples 42-47, wherein the reducing agent includes hydrogen.

Example 49 may include the method according to any one of Examples 42-48, wherein the reducing agent includes a mixture of gaseous hydrogen and gaseous nitrogen.

Example 50 may include the method according to Example 49, wherein a portion of the gaseous hydrogen is 5-10 percent.

Example 51 may include the method according to any one of Examples 42-50, wherein the reducing agent includes formic acid.

Example 2 may include the method according to any one of Examples 42-48, wherein the reducing agent is a plasma.

Example 53 may include the method according to any one of Examples 42-2, wherein the reducing agent decomposes at the temperature to include radical hydrogen.

Example 54 may include the method according to any one of Examples 42-53, wherein the heating occurs free from applied mechanical load on the first metallic layer and the second metallic layer.

Example 55 may include the method according to any one of Examples 42-54, wherein the metallic interconnection has a higher porosity than the first metallic layer and the second metallic layer.

Example 56 may include the method according to Example 55, wherein the higher porosity is configured to decouple stress between the first structure and the second structure.

Example 57 may include the method according to any one of Examples 42-56, wherein the mechanical connection has a first porosity and the metallic interconnection has a second porosity less than the first porosity.

Example 58 may include the method according to any one of Examples 42-57, wherein a metal of the first metallic layer and a metal of the second metallic layer are the same.

Example 59 may include the method according to Example 58, wherein the metal of the first metallic layer and the metal of the second metallic layer is copper.

Example 60 may include the method according to any one of Examples 58 and 59, wherein the metallic interconnection consists essentially of a pure metal.

Example 61 may include the method according to any one of Examples 42-57, wherein the metallic interconnection consists essentially of a metal alloy between the first metallic layer and the second metallic layer, where in the metal alloy consists essentially of a metal of the first metallic layer and a metal of the second metallic layer.

Example 62 may include the method according to any one of Examples 42-61, wherein the temperature is an annealing temperature of a metal of the first metallic layer and/or a metal of the second metallic layer.

Example 63 may include the method according to any one of Examples 42-62, wherein the temperature is below 350° C.

Example 64 may include the method according to any one of Examples 42-63, wherein the temperature is between 180° C. and 250° C.

Example 65 may include the method according to any one of Examples 42-63, wherein the temperature is 100° C.

Example 66 may include the method according to any one of Examples 42-65, wherein removing the one or more non-metallic compounds is performed substantially free of an oxidizing agent of a metal of the first metallic layer and a metal of the second metallic layer.

Example 67 may include the method according to any one of Examples 42-66, wherein the heating is performed while removing the one or more non-metallic compounds.

Example 68 may include the method according to any one of Examples 42-67, wherein the first structure is a semiconductor device.

Example 69 may include the method according to any one of Examples 42-68, wherein the second structure is a substrate.

Example 70 may include the method according to any one of Examples 42-69, further including: forming the first metallic layer on the semiconductor device.

Example 71 may include the method according to any one of Examples 42-70, forming the first microstructures on the first metallic layer.

Example 72 may include the method according to any one of Examples 42-71, further including: forming the second metallic layer on the substrate.

Example 73 may include the method according to any one of Examples 42-42, forming the second microstructures on the second metallic layer.

Example 74 may include the method according to any one of Examples 42-73, further including: removing byproducts of the reaction between the reducing agent and the one or more non-metallic compounds.

Example 75 may include the method according to Example 74, wherein the byproducts include water and carbon dioxide.

Example 76 may include the method according to any one of Examples 42-75, further including: filling between the first microstructures a non-metallic material to a height less than a full length of the first microstructures forming a composite layer of the non-metallic material with the first microstructures extending through the non-metallic layer so that a portion of the first microstructures protrude from the non-metallic material.

Example 77 may include the method according to any one of Examples 42-75, filling between the second microstructures a non-metallic material to a height less than a full length of the second microstructures forming a composite layer of the non-metallic material with the second microstructures extending through the non-metallic layer so that a portion of the second microstructures protrude from the non-metallic material.

Example 78 may include the method according to any one of Examples 76 and 77, wherein the composite layer of the non-metallic material and the first microstructures or the second microstructures is configured to decouple stress between the first structure and the second structure.

Example 79 may include the method according to any one of Examples 76-78, wherein the non-metallic material is inert to the reducing agent.

Example 80 may be a semiconductor device arrangement including: a substrate; a semiconductor device mechanically and electrically connected to the substrate via a metallic interconnect, wherein the metallic interconnection consists essentially of a pure metal and includes a porous region of the pure metal having a higher porosity than an adjacent region of the metallic interconnect.

Example 81 may include the semiconductor device arrangement according to Example 79, wherein the metallic interconnection substantially covers a surface of the semiconductor device proximate to the substrate.

Example 82 may include the semiconductor device arrangement according to any one of Examples 79 and 80, wherein the porous region of the pure metal is configured to decouple stress between the semiconductor device and the substrate.

Example 83 may include the semiconductor device arrangement according to any one of Examples 79-81, further including: a composite layer between the semiconductor device and the metallic interconnect, wherein the composite layer includes a non-metallic material and metallic structures penetrating through the composite layer to contact the semiconductor device and the metallic interconnect.

Example 84 may include the semiconductor device arrangement according to Example 82, wherein the non-metallic material is a porous polymer material having voids throughout, wherein the porous polymer material of the composite layer is configured to decouple stress between the semiconductor device and the substrate.

Example 85 may be a method of forming a metallic interconnection between a first structure and a second structure, the method including: providing the first structure having one or more pillars protruding from the first structure and including a first metallic layer on a distal end of the respective one or more pillars with first microstructures protruding from the first metallic layer; providing the second structure including a second metallic layer having second microstructures protruding from the second metallic layer; contacting the first microstructures and the second microstructures to form a mechanical connection between the first structure and the second structure with the one or more pillars defining a gap between the first structure and the second structure, wherein the mechanical connection is configured to allow fluid to permeate the mechanical connection; removing one or more non-metallic compounds on the first metallic layer and the second metallic layer with a reducing agent that penetrates the mechanical connection and reacts with the one or more non-metallic compounds; and heating the first metallic layer and the second metallic layer at a temperature causing interdiffusion of the first metallic layer and the second metallic layer to form the metallic interconnection between the first structure and the second structure.

Example 86 may include the method according to Example 85, further including: filling the gap between the first structure and the second structure with a material.

Example 87 may include the method according to Example 86, wherein the material is a polymer.

Example 88 may include the method according to any one of Examples 86 and 87, wherein the material is an underfill material.

Example 89 may include the method according to any one of Examples 85-88, wherein the first microstructures have a greater length than width.

Example 90 may include the method according to any one of Examples 85-89, wherein the first microstructures are microwires.

Example 91 may include the method according to any one of Examples 85-90, wherein the second microstructures have a greater length than width.

Example 92 may include the method according to any one of Examples 85-91, wherein the second microstructures are microwires.

Example 93 may include the method according to any one of Examples 85-92, wherein the length of respective microstructures is between 5-60 µm and the width of respective microstructures is between 100 nm and 2 µm.

Example 94 may include the method according to any one of Examples 85-93, wherein the reducing agent includes hydrogen.

Example 95 may include the method according to any one of Examples 85-94, wherein the reducing agent includes a mixture of gaseous hydrogen and gaseous nitrogen.

Example 96 may include the method according to Example 85-95, wherein a portion of the gaseous hydrogen is 5-10 percent.

Example 97 may include the method according to any one of Examples 85-96, wherein the reducing agent includes formic acid.

Example 98 may include the method according to any one of Examples 85-94, wherein the reducing agent is a plasma.

Example 99 may include the method according to any one of Examples 85-98, wherein the reducing agent decomposes at the temperature to include radical hydrogen.

Example 100 may include the method according to any one of Examples 85-100, wherein the heating occurs free from applied mechanical load on the first metallic layer and the second metallic layer.

Example 101 may include the method according to any one of Examples 85-100, wherein the metallic interconnection has a higher porosity than the first metallic layer and the second metallic layer.

Example 102 may include the method according to Example 85-101, wherein the higher porosity is configured to decouple stress between the first structure and the second structure.

Example 103 may include the method according to any one of Examples 5-102, wherein the mechanical connection has a first porosity and the metallic interconnection has a second porosity less than the first porosity.

Example 104 may include the method according to any one of Examples 85-103, wherein a metal of the first metallic layer and a metal of the second metallic layer are the same.

Example 105 may include the method according to Example 104, wherein the metal of the first metallic layer and the metal of the second metallic layer is copper.

Example 106 may include the method according to any one of Examples 85-105, wherein the metallic interconnection consists essentially of a substantially pure metal.

Example 107 may include the method according to any one of Examples 85-103, wherein the metallic interconnection consists essentially of a metal alloy between the first metallic layer and the second metallic layer, where in the metal alloy consists essentially of a metal of the first metallic layer and a metal of the second metallic layer.

Example 108 may include the method according to any one of Examples 107, wherein the temperature is an annealing temperature of a metal of the first metallic layer and/or a metal of the second metallic layer.

Example 109 may include the method according to any one of Examples 85-108, wherein the temperature is below 350° C.

Example 110 may include the method according to any one of Examples 85-109, wherein the temperature is between 180° C. and 250° C.

Example 111 may include the method according to any one of Examples 85-109, wherein the temperature is 100° C.

Example 112 may include the method according to any one of Examples 85-111, wherein removing the one or more non-metallic compounds is performed substantially free of an oxidizing agent of a metal of the first metallic layer and a metal of the second metallic layer.

Example 113 may include the method according to any one of Examples 85-112, wherein the heating is performed while removing the one or more non-metallic compounds.

Example 114 may include the method according to any one of Examples 85-113, wherein the first structure is a semiconductor device.

Example 115 may include the method according to any one of Examples 85-114, wherein the second structure is a substrate.

Example 116 may include the method according to any one of Examples 85-115, further including: forming the first metallic layer on the first structure.

Example 117 may include the method according to any one of Examples 85-116, further including: forming the first microstructures on the second metallic layer.

Example 118 may include the method according to any one of Examples 85-117, further including: forming the second metallic layer on the second structure.

Example 119 may include the method according to any one of Examples 85-118, further including: forming the second microstructures on the second metallic layer.

Example 120 may include the method according to any one of Examples 85-119, further including: removing byproducts of the reaction between the reducing agent and the one or more non-metallic compounds.

Example 121 may include the method according to any one of Examples 85-120, wherein the byproducts include water and carbon dioxide.

Example 122 may be a semiconductor arrangement including: a substrate including a second metallic layer having second microstructures protruding from the second metallic layer; a semiconductor device having one or more pillars protruding from the semiconductor device defining a gap between the semiconductor device and the substrate; wherein at a distal end of the one or more pillars are one or more respective metallic interconnects electrically and mechanically connecting the one or more pillars to the substrate, wherein the one or more respective metallic interconnects consist essentially of a pure metal and include a porous region of the pure metal having a higher porosity than an adjacent region of the metallic interconnect.

Example 123 may include the semiconductor arrangement according to Example 122, wherein a metal of the first metallic layer, a metal of the second metallic layer, and a metal of the one or more pillars is the same metal as the pure metal of the one or more respective metallic interconnects.

Example 124 may include the semiconductor arrangement according to any one of Examples 122 and 123, further including: a material filling the gap between the semiconductor device and the substrate.

Example 125 may include the semiconductor arrangement according to any one of Examples 122-124, wherein the material is a polymer.

Example 126 may include the semiconductor arrangement according to any one of Examples 122-125, wherein the material is an underfill material.

Example 127 may include the semiconductor device arrangement according to any one of Examples 122-126, wherein the porous region of the pure metal is configured to decouple stress between the semiconductor device and the substrate.

Example 128 may be a semiconductor arrangement including: a substrate; a composite layer including a porous polymer material having voids throughout with metallic structures penetrating through the porous polymer material on the substrate; and a semiconductor device on the composite layer; wherein the metallic structures form an electrically conductive connection between the substrate and the semiconductor device and wherein the porous polymer material of the composite layer is configured to decouple stress between the substrate and the semiconductor device.

Example 129 may include the semiconductor arrangement according to Example 128, wherein the voids are substantially filled by the metallic structures.

Example 130 may include the semiconductor arrangement according to any one of Examples 128 and 129, further including: a metallic layer between the composite layer and the substrate, wherein the metallic layer is in physical contact with the metallic structures.

Example 131 may include the semiconductor arrangement according to 130, further including: a solder material connecting the metallic layer to the substrate.

Example 132 may include the semiconductor arrangement according to any one of Examples 128 and 129, further including: a conductive adhesive material connecting the composite layer to the substrate, wherein the conductive adhesive material completes an electrically conductive connection with the composite layer between the semiconductor device and the substrate.

Example 133 may include the semiconductor arrangement according to any one of Examples 128-132, wherein the porous polymer material has a glass transition point and/or a melting point above 260° C.

Example 134 may include the semiconductor arrangement according to any one of Examples 128-133, wherein the porous polymer material is selected from a group consisting of polyimide, poly ether ketone, polyamide-imide, polyethersulfone, polysulfone, polystyrene, liquid-crystal polymer, and any combination thereof.

Example 135 may be a method of manufacturing a semiconductor arrangement, the method including: forming a composite layer including a porous polymer material having voids throughout with metallic structures penetrating through the porous polymer material on a semiconductor device; and attaching the composite layer to a substrate so that the metallic structures form an electrically conductive connection between the substrate and the semiconductor device and the porous polymer material of the composite layer decouples stress between the substrate and the semiconductor device.

Example 136 may include the method according to Example 135, further including: forming the porous polymer material including voids on the semiconductor device.

Example 137 may include the method according to Example 136, further including: filling the voids of the porous polymer material with metallic structures that penetrate through the porous polymer material to form the composite layer.

Example 138 may include the method according to any one of Examples 135-137, further including: forming a metallic layer over the composite layer.

Example 139 may include the method according to Example 138, wherein attaching the composite layer to the substrate includes soldering the metallic layer to the substrate.

Example 140 may include the method according to any one of Examples 135-138, wherein attaching the composite layer to the substrate includes adhering the composite layer to the substrate via a conductive adhesive material.

Example 141 may include the method according to Example 135, further including: forming metallic structures that are needle-shaped on a semiconductor device.

Example 142 may include the method according to Example 141, further including: depositing the porous polymer material having voids between the metallic structures.

Example 143 may include the method according to any one of Examples 135, 141, and 142, further including: forming a metallic layer over the composite layer.

Example 144 may include the method according to Example 143, wherein attaching the composite layer to the substrate includes soldering the metallic layer to the substrate.

Example 145 may include the method according to any one of Examples 135, 141, and 142, wherein attaching the composite layer to the substrate includes a conductive adhesive material.

Example 146 may include the method according to any one of Examples 134-145, wherein the porous polymer material has a glass transition point and/or a melting point above 260° C.

Example 147 may include the semiconductor arrangement according to any one of Examples 135-146, wherein the porous polymer material is selected from a group consisting of polyimide, poly ether ketone, polyamide-imide, polyethersulfone, polysulfone, polystyrene, liquid-crystal polymer, and any combination thereof.

Example 148 may be a method of manufacturing a semiconductor arrangement, the method including: forming a porous polymer layer having voids throughout on a semiconductor device; filling the voids of the porous polymer layer with metallic structures that penetrate through the porous polymer layer to form a composite layer; forming a carrier on the composite layer, wherein the metallic structures form an electrically conductive connection between the carrier and the semiconductor device and the porous polymer material of the composite layer decouples stress between the carrier and the semiconductor device.

Example 149 may include the method according to Example 147, wherein the carrier is formed from the same metal or metal alloy as the metallic structures.

Example 150 may include the method according to any one of Examples 148 and 149, wherein the porous polymer material has a glass transition point and/or a melting point above 260° C.

Example 151 may include the method according to any one of Examples 147-150, wherein the porous polymer material is selected from a group consisting of polyimide, poly ether ketone, polyamide-imide, polyethersulfone, polysulfone, polystyrene, liquid-crystal polymer, and any combination thereof.

Example 152 may be a semiconductor arrangement including: a substrate; a semiconductor device including a metallic layer having microstructures protruding from the metallic layer; wherein the microstructures penetrate into the substrate with a topographically varied surface area configured to mechanically fix the semiconductor device to the substrate.

Example 153 may be a method of manufacturing a semiconductor arrangement, the method including: forming a metallic layer including microstructures protruding from the metallic layer on a semiconductor device; and forming a substrate over the metallic layer, wherein the microstructures penetrate into the substrate with a topographically varied surface area contact configured to mechanically fix the semiconductor device to the substrate.

Example 154 may be a semiconductor arrangement including: a substrate; a semiconductor device including a metallic layer having microstructures protruding from the metallic layer; and a thermal interface material between the substrate and the semiconductor device configured to transfer heat from the semiconductor device to the substrate, wherein the thermal interface material includes a polymer matrix and thermally conductive particles; wherein the thermally conductive particles have a smaller size than the microstructures to fit between the microstructures and form a topographically varied surface area contact between the thermally conductive particles and the microstructures.

Example 155 may be a method of manufacturing a semiconductor arrangement, the method including: forming a metallic layer including microstructures protruding from the metallic layer on a semiconductor device; depositing a thermal interface material including a polymer matrix and thermally conductive particles on the metallic layer, wherein the thermally conductive particles have a smaller size than the microstructures and fit between the microstructures to form a topographically varied surface area contact between the thermally conductive particles and the microstructures; and arranging the semiconductor device with the thermal interface material on a substrate, wherein the thermal interface material is configured to transfer heat from the semiconductor device to the substrate.

Example 156 may be a method of manufacturing a semiconductor arrangement, the method including: depositing a thermal interface material including a polymer matrix and thermally conductive particles on a substrate; forming a metallic layer including microstructures protruding from the metallic layer on a semiconductor device; and arranging the microstructures of the semiconductor device on the thermal interface material, wherein the thermally conductive particles have a smaller size than the microstructures and fit between the microstructures to form a topographically varied surface area contact between the thermally conductive particles and the microstructures and wherein the thermal interface material is configured to transfer heat from the semiconductor device to the substrate.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims, and all changes within the meaning and range of equivalency of the claims are therefore intended to be embraced.

What is claimed is:

1. A method of forming a metallic interconnection between a first structure and a second structure, the method comprising:
   providing the first structure with a first metallic layer having first microstructures protruding from the first metallic layer;
   providing the second structure with a second metallic layer having second microstructures protruding from the second metallic layer;
   contacting the first microstructures and the second microstructures to form a mechanical connection between the first structure and the second structure, the mechanical connection being configured to allow fluid to penetrate the mechanical connection;
   removing one or more non-metallic compounds on the first metallic layer and the second metallic layer with a reducing agent that penetrates the mechanical connection and reacts with the one or more non-metallic compounds; and
   heating the first metallic layer and the second metallic layer at a temperature causing interdiffusion of the first metallic layer and the second metallic layer to form the metallic interconnection between the first structure and the second structure.

2. The method of claim 1, wherein the one or more non-metallic compounds are barriers to interdiffusion of the first metallic layer and/or the second metallic layer.

3. The method of claim 1, wherein the heating removes one or more organic materials from the first metallic layer and/or the second metallic layer.

4. The method of claim 1, wherein the first microstructures have a greater length than width and the second microstructures have a greater length than width.

5. The method of claim 1, wherein a length of respective ones of the microstructures is between 5-60 μm and a width of the respective ones of the microstructures is between 100 nm and 2 μm.

6. The method of claim 1, wherein the reducing agent comprises hydrogen.

7. The method of claim 1, wherein the reducing agent comprises formic acid.

8. The method of claim 1, wherein the reducing agent is a plasma.

9. The method of claim 1, wherein the reducing agent decomposes at the temperature to comprise radical hydrogen.

10. The method of claim 1, herein the heating occurs free from applied mechanical load on the first metallic layer and the second metallic layer.

11. The method of claim 1, wherein the metallic interconnection has a higher porosity than the first metallic layer and the second metallic layer.

12. The method of claim 1, wherein the metallic interconnection comprises a region including one or more gaps between contacted first microstructures and second microstructures.

13. The method of claim 1, wherein a metal of the first metallic layer and a metal of the second metallic layer are the same.

14. The method of claim 1, wherein the metallic interconnection comprises a substantially pure metal.

15. The method of claim 1, wherein the metallic interconnection comprises a metal alloy between the first metallic layer and the second metallic layer, and wherein the metal alloy comprises a metal of the first metallic layer and a metal of the second metallic layer.

16. The method of claim 1, wherein the temperature is an annealing temperature of a metal of the first metallic layer and/or a metal of the second metallic layer.

17. The method of claim 1, wherein the temperature is below 350° C.

18. The method of claim 1, wherein removing the one or more non-metallic compounds is performed substantially free of an oxidizing agent of a metal of the first metallic layer and a metal of the second metallic layer.

19. A method of manufacturing a semiconductor arrangement, the method comprising:
    forming a first metallic layer on the semiconductor device, the first metallic layer comprising first microstructures protruding from the first metallic layer, the first metallic layer and the first microstructures being at least partially covered by a first metal-oxide and one or more organic materials;
    providing a substrate comprising a second metallic layer having second microstructures protruding from the second metallic layer, the second metallic layer and the second protruding structures being at least partially covered by a second metal-oxide and the one or more organic materials;
    contacting the first microstructures and the second microstructures to form a mechanical connection between the semiconductor device and the substrate, the mechanical connection being configured to allow fluid to penetrate the mechanical connection;
    removing the first metal-oxide and the second metal-oxide with a reducing agent that penetrates the mechanical connection and reacts with the first metal-oxide and the second metal-oxide; and
    heating the first metallic layer and the second metallic layer at a temperature causing interdiffusion of the first metallic layer and the second metallic layer to form a metallic interconnection between the semiconductor device and the substrate as well as removal of the one or more organic materials.

20. The method of claim 19, wherein the metallic interconnection has a higher porosity than the first metallic layer and the second metallic layer.

21. The method of claim 20, wherein the higher porosity is configured to decouple stress between the first structure and the second structure.

* * * * *

UNITED STATES PATENT AND TRADEMARK OFFICE
CERTIFICATE OF CORRECTION

PATENT NO.         : 10,734,352 B2
APPLICATION NO.    : 16/148316
DATED              : August 4, 2020
INVENTOR(S)        : Escher-Poeppel et al.

It is certified that error appears in the above-identified patent and that said Letters Patent is hereby corrected as shown below:

In the Claims

Column 39, Line 6 (Claim 10), please change "herein" to --wherein--

Signed and Sealed this
Sixth Day of October, 2020

Andrei Iancu
*Director of the United States Patent and Trademark Office*